(12) United States Patent
Skoolicas et al.

(10) Patent No.: US 6,230,403 B1
(45) Date of Patent: *May 15, 2001

(54) INTERCONNECTION SYSTEM

(75) Inventors: Charles Steven Skoolicas, Nashua, NH (US); Lance Lynn Andrus, Southboro, MA (US); Fred M. Finnemore, Jefferson, ME (US); Charles Francis Hutchins, Salem, NH (US); Patrizio Vinciarelli, Boston, MA (US)

(73) Assignee: VLT Corporation, San Antonio, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/965,591

(22) Filed: Nov. 6, 1997

(51) Int. Cl.[7] ................. H01R 9/00; H05K 3/00
(52) U.S. Cl. ................. 29/852; 29/842; 29/846; 174/117 FF; 427/97
(58) Field of Search ............... 29/846, 852, 842, 29/843; 174/117 F, 117 FF; 427/97

(56) References Cited

U.S. PATENT DOCUMENTS

| | | | |
|---|---|---|---|
| 3,674,914 | * 7/1972 | Burr | 174/68.5 |
| 4,023,883 | * 5/1977 | Raposa et al. | 339/98 |
| 5,205,329 | * 4/1993 | Suzuki et al. | 140/92.1 |
| 5,257,452 | * 11/1993 | Imai et al. | 29/846 |
| 5,347,712 | * 9/1994 | Yasuda et al. | 29/852 |
| 5,463,555 | * 10/1995 | Ward et al. | 364/468 |
| 5,523,049 | * 6/1996 | Terpstra et al. | 419/36 |
| 5,586,021 | * 12/1996 | Fargher et al. | 364/468.06 |
| 5,822,206 | * 10/1998 | Sebastian et al. | 364/468.03 |

OTHER PUBLICATIONS

Siemens Corp, SITOP Power tailored power supplies faster, Internet www.ad.siemens.de/sitop/html1_76.htm, 1997.*

Siemens Corp, SITOPPower Automation & Drives, Form, Internet www.ad.siemens.de/sitop/html_76/formular.htm, 1997.*

* cited by examiner

Primary Examiner—Lee Young
Assistant Examiner—Rick Kiltae Chang
(74) Attorney, Agent, or Firm—Fish & Richardson P.C.

(57) ABSTRACT

A multiconductor snake wiring system which uses a flexible bus structure with taps for providing connections to the components is disclosed. An automated facility for manufacturing the snake wiring system is also described. A compact multilayer wiring structure for connecting the components and a unique process for manufacturing the wiring structure are also disclosed.

8 Claims, 46 Drawing Sheets

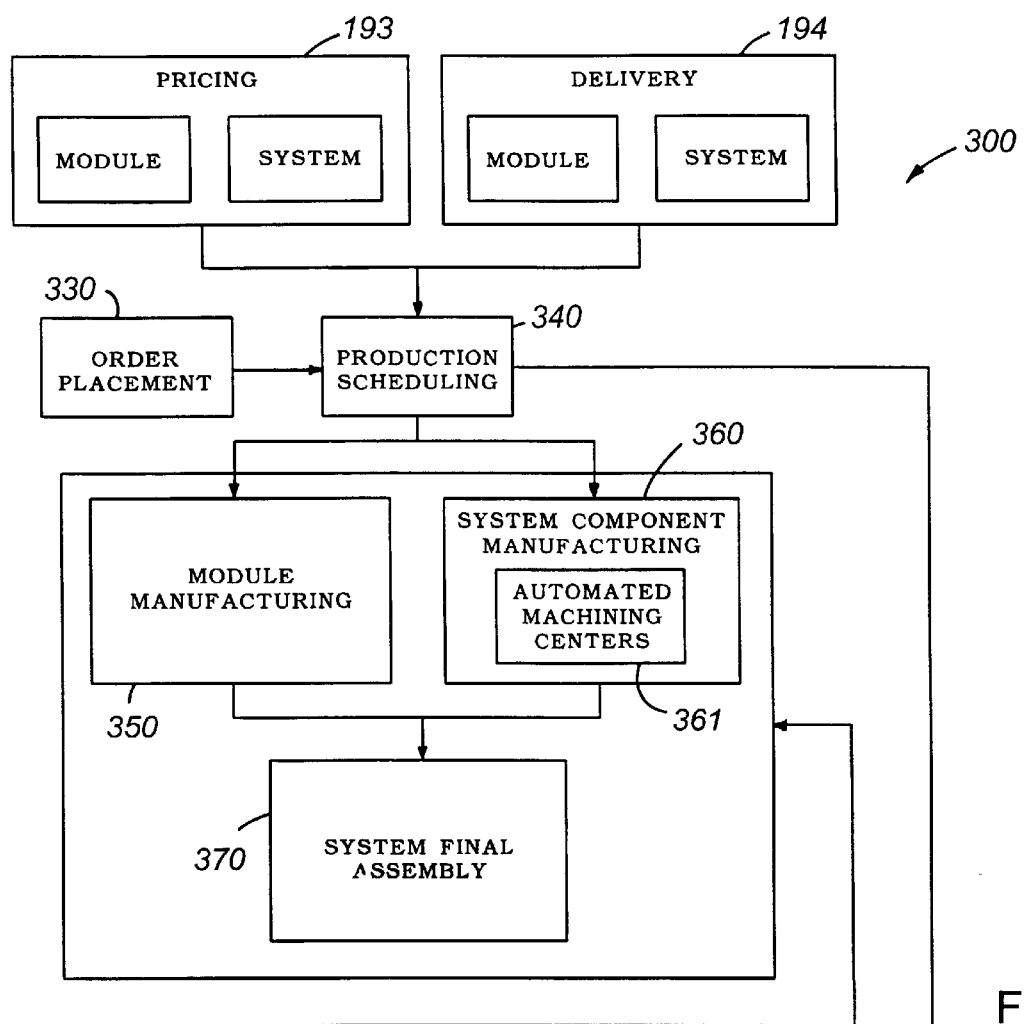
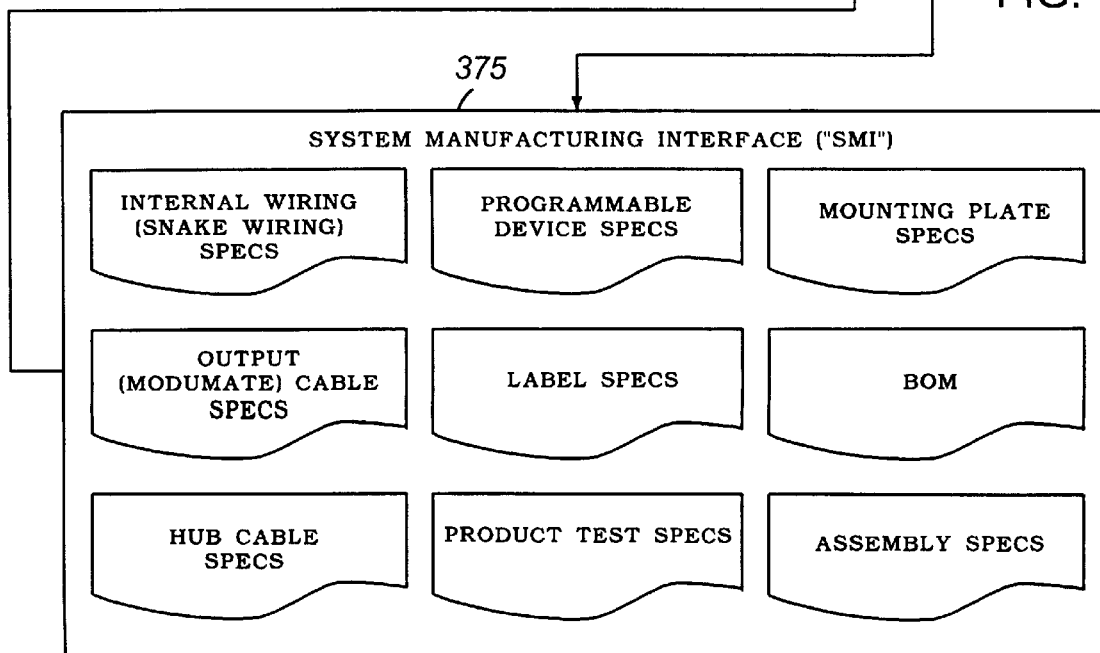
FIG. 6

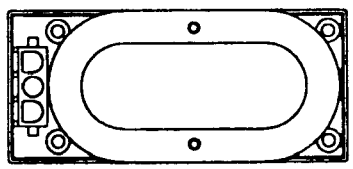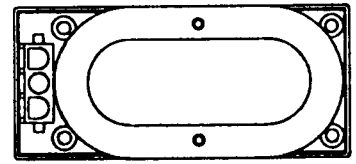
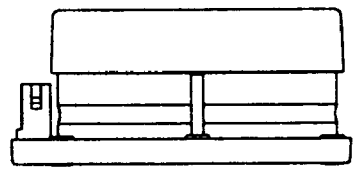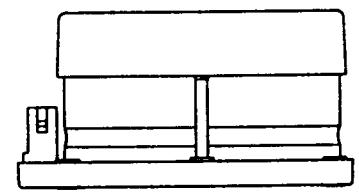
FIG. 21A  FIG. 21B
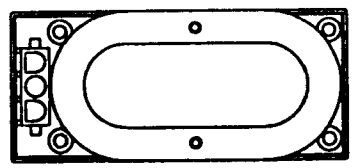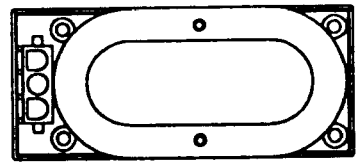
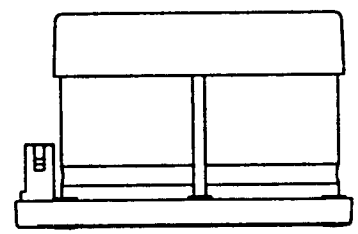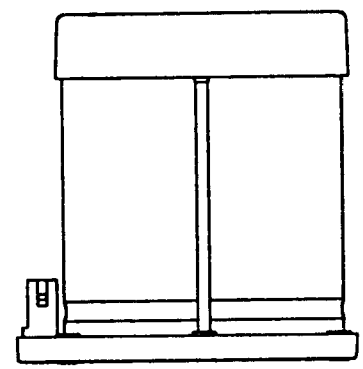
FIG. 21C  FIG. 21D

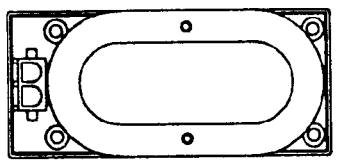
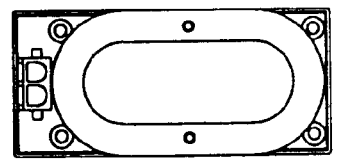
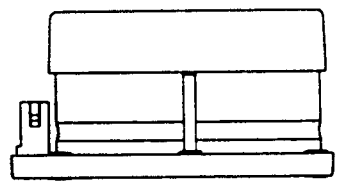
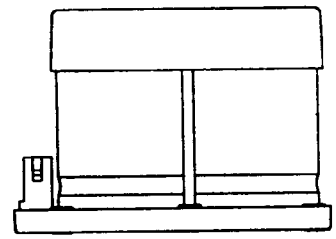
FIG. 21E
FIG. 21F
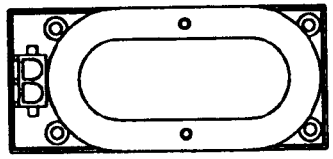
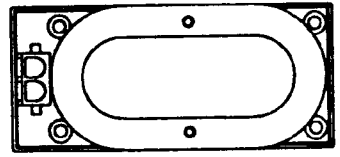
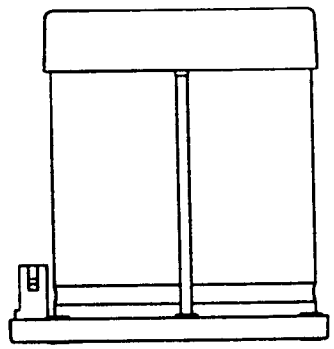
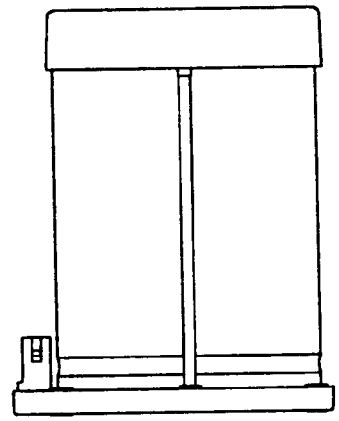
FIG. 21G
FIG. 21H

INTERCONNECTION SYSTEM

BACKGROUND OF THE INVENTION

This invention relates to automatically designing custom power converters.

Power converters accept power from an electrical input source and convert it into a form suitable for use by electrical loads. One class of power conversion systems, called power supplies, are typically used to convert power derived from a utility source, such as an AC utility line or a DC telecommunications battery, into one or more regulated DC voltages (e.g., 5V, 12V, 48V) used for powering electronic circuitry. Specifications for a power supply are application specific. Thus, while many power supplies may share certain common characteristics such as a similar input voltage range or the presence of a 5-volt output, many power supplies are customized, by design, for use in a particular product or system.

Design of a custom power supply involves different skills and usually takes months to complete. For example, a typical custom power supply design may involve design of electronic power conversion circuitry; design, layout and procurement of printed circuit boards, packaging and cooling elements, source interface "front-end" circuitry (such as power factor correcting front-end circuitry or "auto-ranging" rectification circuitry for use with AC utility sources) and conducted EMI filter components; fabrication of prototype assemblies; qualification and testing of prototypes with respect to electrical, thermal, mechanical and EMI/RFI specifications; and acquisition and submission of test data for obtaining safety agency (e.g., Underwriters Laboratories, Canadian Standards Association) approvals. In addition, money and effort must also usually be invested in the development and qualification of manufacturing processes and equipment for each different custom power supply.

Widespread commercial availability of high density power components such as modular DC-DC power converters and related front-end power components helped simplify and shorten the custom power supply design cycle by eliminating the need to design, qualify and obtain agency approvals on power conversion and front-end interface circuitry. However, weeks or months of effort are still often required to perform the packaging, thermal and other design and qualification tasks required to develop a custom power supply using power components.

General Electric Corporation has offered prepackaged modular building blocks for configuring switching power conversion circuits. Each building block (e.g., rectifier block, switch block, output filter block) formed a portion of a switching power converter circuit and each was available in various voltage and current ratings to allow configuring supplies of different input voltage, output voltage, and power ratings. A microcomputer-based software package aided the user in selecting those building blocks which, when connected together, would result in a power converter which meets the user's functional requirements. The software selected those pre-defined blocks which would result in a certain combination of input voltage, output voltage, and power level.

Linear Technology Corporation, Milpitas, Calif., USA, has offered a software based power supply design program called SwitcherCAD; and National Semiconductor Corporation, Santa Clara, Calif., USA, has offered a software based power supply design program called Simple Switcher. Both programs accept a set of predefined functional specifications and generate parts lists and schematics for a power conversion circuit which meets the specifications. Both programs can produce designs for different topologies (e.g., isolated flyback, non-isolated PWM buck). The user of the programs can modify component values and other design parameters and observe the effects on performance, e.g., conversion efficiency. Both programs use pre-defined equations for generating a solution.

Siemens has announced an expert system which runs on a personal computer for aiding in the design of power supplies. It collects specifications for the power supply from the user, synthesizes possible structures, and reports the number of feasible solutions for the selected input/output description. The price for a specified quantity and lot size are calculated by the system. The configuration report is sent to the manufacturer's computer over a wide area network and then passed on to the development department.

The manufacturer then designs the power supply. Circuit macros stored in a CAD system are called up, placed, and the clusters are connected together to reduce development costs. The development time for designing the power supply is typically four working days which is apparently performed by the design engineers at the manufacturer.

SUMMARY OF THE INVENTION

In general, one aspect of the invention includes an automated power supply design system for aiding a user to design a custom power supply. The design system includes an expert system having a rule. An interface for receiving power supply specifications from the user is provided. A component definition system, having an input for receiving the power supply specifications, generates a complement of components and provides mechanical parameters for the components. A mechanical layout system has an input for receiving the mechanical parameters and an input for receiving the power supply specifications and generates a mechanical design of the custom power supply constrained by enforcing the rule.

Implementations of the invention may include one or more of the following features.

An automated manufacturing specifications generator provides manufacturing specifications needed by the manufacturing system to manufacture the custom power supply. The automated manufacturing specifications generator may additionally supply specifications for any one or more of the following: manufacturing cables, a mounting plate, heatsinks, electrical power converter modules, or front-end assemblies, or for programming a programmable memory device with output control information, for the custom power supply.

A computer integrated manufacturing ("CIM") facility includes at least one fabrication station for manufacturing a component for the custom power supply. The CIM facility has an input for receiving component specifications comprising selected manufacturing specifications.

A production scheduler connected to receive the component specifications allocates a time slot for production of the component by the CIM facility.

A wiring station has an input for receiving interconnection specifications for fabricating interconnection components. The interconnection specifications may be for a circuit board and the wiring station fabricates circuit boards or for a wiring harness and the wiring station fabricates wiring harnesses. Additionally, the wiring harness may include a flat multi-conductor cable element and at least two tap elements and the interconnection specifications may include one or more of the following: length and tap or fold and bend location specifications.

A heatsink station has an input for receiving heatsink specifications. The heatsink specifications may include machining instructions and the heatsink station may include machining equipment for fabricating a heatsink from metal stock. The heatsink specifications may include position information and instructions for selecting and installing prefabricated heatsink components.

The rule may include one or more of the following characteristics: (a) a limitation imposed by tooling restrictions of a manufacturing line, (b) a minimum component spacing limitation imposed to allow for wiring components, or (c) a component orientation limitation.

The power supply specifications may include power supply input specifications and output specifications and the interface may accept numerical entries.

The interface may include a layout system in which component locations may be defined in a virtual space. The layout system may include component icons representative of the complement of components. The icons may be moved around the virtual space to define the component locations. The layout system may include a feature allowing the user to manipulate the size or shape of the virtual space. The layout system may include a drawing feature in which the system automatically adjusts the virtual space to fit an arrangement of the component icons. The arrangement may be created by the user. The layout system may include an automatic arrangement feature in which the system automatically arranges the component icons and creates the virtual space to fit the arrangement of the component icons. The virtual space may comprise a flat surface or at least two separate flat surfaces. The component locations and the virtual space may define the mechanical specifications for the custom power supply, including a mounting surface and mounting features.

The power supply specifications may include thermal specifications; safety agency specifications; information about the timing of turning on or off at least one output; information about the sequence for turning on or off at least two outputs; or information regarding one or more of the following: (a) an output voltage, (b) an output power, (c) a current limiting set point, (d) an over voltage set point, (e) output ripple, (f) input voltage range, or (g) a noise level. The power supply specifications may include power supply input specifications and output specifications and the interface may provide a list of choices for at least one input specification. The list of choices may include button selectable options or a pull-down list of options.

The complement of components may include an electrical power converter module and the component definition system may generate an electrical design for the electrical power converter module. The component definition system may also calculate an efficiency for the electrical power converter module. The component definition system may generate an electrical design which is optimized with respect to a optimization parameter such as efficiency, reliability, or cost. Two or more of the optimization parameters may be assigned relative weights and the component definition system may generate the electrical design optimizing the optimization parameters according to the assigned relative weights.

The complement of components may include a plurality of electrical power converter modules and the component definition system may generate an electrical design and provide an efficiency rating for each of the electrical power converter modules. The system may calculate the total input power required by the electrical power converter modules using the efficiency ratings and the power output of the custom power supply, and select circuitry for a frontend assembly. The system may calculate a total power dissipation for the custom power supply and calculate at least one heatsink dimension.

The system may provide feasibility information to the user regarding one or more of the following conditions: (a) cooling requirements, (b) heatsink dimensions, (c) component orientation, (d) component spacing, (e) safety agency requirements, or (f) output orientation.

The custom power supply may include a user-defined package and the power supply specifications may include at least one of the following details: (a) a shape of the user-defined package, (b) a dimension of the user-defined package, (c) a position of at least one of the components in the user-defined package, (d) an orientation of at least one of the components in the user-defined package.

The system may provide feasibility information to the user, including acceptable relative locations and orientations for the components.

The rule may include one or more of the following: (a) safety agency specifications, (b) limitations imposed to allow two or more power converters to be connected into a load sharing array, or (c) thermal constraints.

The complement of components may include electrical power converter modules or a front end module.

In another general aspect, the invention includes an automated power supply design system for aiding a user in designing a custom power supply. An expert system includes a rule representing limitations imposed by a manufacturing system. An interface is provided for receiving power supply specifications from the user. A component definition system, having an input for receiving the power supply specifications, generates a complement of components based upon the power supply specifications. The power supply design system constrains, to an acceptable range, the power supply specifications by enforcing the rule and generates a custom power supply design for the custom power supply. An automated manufacturing specifications generator, having an input for receiving the custom power supply design, supplies manufacturing specifications needed by the manufacturing system to manufacture the custom power supply.

In another general aspect, the invention includes a method for aiding a user to design a custom power supply. A rule representing limitations imposed by a manufacturing system is defined. Specifications are received from the user and a complement of components is generated. Mechanical parameters for the components are provided and mechanical design information is collected from the user. The range of acceptable inputs for the specifications or the mechanical design information is constrained by enforcing the rule.

Implementations of the invention may include one or more of the following features.

Manufacturing specifications needed by the manufacturing system to manufacture the custom power supply may be generated. The specifications may include one or more of the following: (a) specifications for manufacturing cables for the custom power supply, (b) specifications for manufacturing a mounting plate for the custom power supply, (c) specifications for manufacturing heatsinks for the custom power supply, (d) specifications for manufacturing electrical power converter modules for the custom power supply, (e) specifications for manufacturing front-end assemblies for the custom power supply, or (f) specifications for programming a programmable memory device with output control information.

A custom power supply design may be provided to a computer integrated manufacturing ("CIM") facility. The CIM may include at least one fabrication station for automatically manufacturing a component for the custom power supply. A time slot may be allocated for production of the component by the CIM facility.

Interconnection specifications may be provided to the CIM facility for fabrication of interconnection components. The interconnection specifications may be circuit board specifications for fabrication of a circuit board by the CIM facility or wiring harness specifications for fabrication of a wiring harness by the CIM facility. The interconnection specifications may include at least a length and a tap location specification and the wiring harness may comprise a flat multi-conductor cable element and a tap element. The interconnection specifications may also include a fold or bend location specification.

Heatsink specifications may be provided to the CIM facility for fabrication of a heatsink. The heatsink specifications may include automatic machining instructions for fabricating a heatsink from metal stock or position information and instructions for selecting and installing prefabricated heatsink components.

The rule may include one or more of the following characteristics: (a) a limitation imposed by tooling restrictions of a manufacturing line, (b) a minimum component spacing limitation imposed to allow for wiring components, or (c) a component orientation limitation.

Numerical entries may be received from the user and the specifications may include power supply input and output specifications.

A layout system allowing component locations to be defined within a virtual space may be provided. Component icons representative of the complement of components may also be provided and the user may be allowed to move the icons in the virtual space to define the component locations. The size or shape of the virtual space may be allowed to be manipulated. The virtual space may be automatically adjusted to fit an arrangement of the component icons. The arrangement may be created by the user. The component locations may be automatically arranged and the virtual space adjusted to fit the arrangement. The virtual space may include a representation of a flat surface or a representation of at least two separate flat surfaces. The component locations and the virtual space may define the mechanical specifications for the custom power supply, including a mounting surface and mounting features.

The specifications may include thermal specifications; safety agency specifications; information about the timing of turning on or off at least one output; information about the sequence for turning on or off at least two outputs; or information regarding one or more of the following: (a) an output voltage, (b) an output power, (c) a current limiting set point, (d) an over voltage set point, (e) output ripple, (f) output input voltage range, or (g) a noise level.

A list of choices may be provided for selection by the user and the specifications may include power supply input specifications and output specifications. The list of choices may include button selectable options or a pull-down list of options.

The complement of components may include an electrical power converter module and an electrical design for the electrical power converter module may be generated. An efficiency may be calculated for the electrical power converter module. The electrical design may be optimized with respect to an optimization parameter such as efficiency, reliability, or cost. The optimizing may include assigning relative weights to two or more of the optimization parameters and carrying out the optimizing according to the assigned relative weights.

The complement of components may include a plurality of electrical power converter modules. An electrical design for each of the electrical power converter modules may be generated, an efficiency rating for each of the electrical power converter modules may be provided, the total input power required by the electrical power converter modules may be calculated using the efficiency ratings and the power output of the custom power supply, and circuitry for a front-end assembly may be selected.

The total power dissipation of the custom power supply and at least one heatsink dimension may be calculated.

Feasibility information may be provided to the user regarding one or more of the following conditions: (a) cooling requirements, (b) heatsink dimensions, (c) component orientation, (d) component spacing, (e) safety agency requirements, or (f) output orientation.

The custom power supply may include a user-defined package and the specifications may include one or more of the following details: (a) a shape of, (b) a dimension of, (c) a position of at least one of the components in, or (d) an orientation of at least one of the components in, the user-defined package.

Feasibility information may be provided to the user regarding acceptable relative locations and orientations for the components.

The rules may include one or more of the following: (a) safety agency specifications, (b) limitations imposed to allow two or more power converters to be connected into a load sharing array, or (c) thermal constraints.

In another general aspect, the invention includes a method for aiding a user to design a custom power supply. A rule representing limitations imposed by a manufacturing system is defined. Specifications are received from the user and a complement of components is generated based upon the specifications. Manufacturing specifications needed by the manufacturing system to manufacture the custom power supply are generated.

In another general aspect, the invention includes a capacitor assembly for use with a power supply. The assembly includes a capacitor, a wiring harness electrically connected to the capacitor and adapted for electrical connection with the power supply, and a mounting assembly. The mounting assembly mechanically supports the capacitor and is adapted to allow the capacitor assembly to be thermally decoupled from the power supply.

In another general aspect of the invention a power supply includes a plurality of heat dissipative components and a capacitor assembly adapted for electrical connection with the power supply. The capacitor assembly is adapted for mounting separate from the heat dissipative components in an environment thermally remote from the heat dissipative components.

In another general aspect of the invention, a power supply, includes a plurality of electrical power converter modules and a flat multiconductor cable. The cable includes a control line for each electrical power converter module, a power distribution line, and an auxiliary conductor for connecting adjacent modules in a load sharing array. The auxiliary conductor includes at least one discontinuity to interrupt electrical connection between adjacent electrical power converter modules which are not members of the same load sharing array.

In one general aspect of the invention, a wiring harness includes a flat cable with a plurality of separate conductors covered with insulating material. A cable tap including a tap conductor has a first portion lying in a plane parallel to the cable at a selected tap location on the cable. A tap connection includes a tap opening in the insulating material of the cable at the tap location exposing a tap area of a selected conductor of the plurality of conductors and an electrical connection formed between the tap conductor and the selected conductor at the tap area.

Implementations of the invention may include one or more of the following features. Laser ablatable insulation may be provided on at least one side of the cable for removal by laser ablation equipment. The laser ablatable insulation may be a polyester film. The tap may further include a tap fold which is folded perpendicular to the cable. The tap fold may be made along an axis parallel to the length of the cable.

The flat cable may include a cable bend along an axis perpendicular to the cable. A cable fold having an axis parallel to the length of the cable may also be provided. A dimple may be disposed in the cable to facilitate forming the cable fold. The dimple may be located substantially along a centerline of the cable prior to formation of the fold.

The taps may include a second portion having a conductive pad which is electrically connected to the tap conductor and provides a connection area for mating with an electrical terminal. The connecting area may include a hole for mating with a terminal pin on an electrical power converter module. The connecting area may include an area to mate with a circuit board.

The cable may include a bend having an axis perpendicular to the cable for snaking around or between components.

The plurality of conductors may include a power conductor and a signal conductor. The power conductor has a higher current carrying capacity than the signal conductor.

The wiring harness may include a mechanical bond between the tap and the cable.

A power tap having a power tap conductor has a current carrying capacity larger than the tap conductor. A power tap connection includes a power tap opening in the insulating material of the cable at the power tap location exposing a power tap area of the power conductor. An electrical power connection is formed between the power tap conductor and the selected power conductor through the opening. The power tap area comprises an area which is greater than the tap area. The power tap opening may include a plurality of openings and the electrical power connection may include a plurality of connections.

A front end connection includes at least one power tap for connecting to a power conductor and at least one tap for connecting to a signal conductor. Two or more module connections have a power tap for connecting to a power conductor and a tap for connecting to a signal conductor.

A selected conductor may have a discontinuity dividing the selected conductor along its length.

A plurality of signal conductors and a plurality of power conductors may be provided. The front end connection may include a respective tap for each of the conductors and a respective power tap for each of the power conductors. The module connections may include a tap for connecting to the selected conductor.

In another general aspect of the invention, a method of interconnecting components includes providing a flat multiconductor cable having a plurality of conductors covered with insulation. A section of the cable is cut to have a predetermined length. A portion of insulation from a preselected area is removed to expose a preselected one of the conductors. An electrical tap having a tap conductor is provided. The tap is positioned on the preselected area and the tap conductor is electrically connected to the preselected conductor.

Implementations of the invention may include one or more of the following features. Laser ablation may be used to remove the insulation. A bonding agent may be applied to the cable in an area around the preselected area for mechanically securing the tap to the cable. An insulating layer may be applied to cover the preselected area. The cable may be folded along an axis aligned with the length of the cable. The cable may be bent along an axis perpendicular to the length of the cable. A discontinuity may be formed in a preselected one of the plurality of conductors. The cable may include a plurality of control conductors and at least two power distribution conductors. The electrical connection may be formed by soldering.

In another general aspect of the invention, a electrical apparatus includes two or more component modules, each occupying a respective volume having respective overall height, width, and length dimensions, and at least two electrical connection terminals. A planar interconnection structure has a first and a second conductive layer separated by insulation. The planar structure is adapted for making connection to the electrical connection terminals of each component module and for lying in a space along an edge of the respective volume within the overall height dimension and without being located adjacent to more than three sides of each module. The planar structure provides electrical connections between the electrical connection terminals.

Implementations of the invention may include one or more of the following features. The planar interconnect structure may include circuit board material having a conductive layer which is cut and routed in the fashion of a point-to-point wire cable. The modules may have an indentation and the planar structure may have a width adapted to fit within the indentation. The electrical connection terminal may include a pin having a portion generally perpendicular to the board at a connection point. A hole for accepting the pin and a conductive eyelet in the hole and electrically connected to the first conductive layer may be provided for making electrical connection to the pin. An insulative sleeve may be used to provide insulation between the eyelet and the second conductive layer. The first and second conductive layers may comprise power conductors. A third conductive layer is separated from the first conductive layer by insulation and includes at least two signal lines formed by removing conductive material from the third conductive layer. Jumper landings make electrical connection between a selected one of the connection terminals and a selected one of the signal lines.

A cable having a plurality of signal conductors may also be provided. The cable may be held in a position substantially perpendicular to the board. A connection bracket includes a contact for engaging a selected one of the connection terminals, a flat cable supporting surface for maintaining the cable in position, and a selective cable connection portion for selectively connecting to a selected one of the plurality of conductors. At least one of the signal lines may include a discontinuity between modules.

In another general aspect of the invention, a method of interconnecting components includes providing a flat multilayer laminate having a plurality of conductive layers separated by insulation. A section of the laminate is cut to have a predetermined shape. Portions of an exposed one of the conductive layers is removed by machining to from a plurality of conductive traces. A hole is machined in the laminate to form a connection to a preselected one of the conductive layers. The hole has a first width in the preselected layer and a second larger width in the other conductive layers. A conductive eyelet is inserted into the hole for making contact with the preselected one of the conductive layers.

Implementations of the invention may include one or more of the following features. An insulative sleeve is provided in the hole for insulating the eyelet from at least one of the other conductive layers. At least two jumper landings are formed and a jumper is soldered to form a connection between the landings or a conductive layer is pad printed to form a connection between the jumper landings. An insulative layer may be pad printed over the laminate in an area between the jumper landings before the conductive layer is pad printed. A discontinuity may be formed in a preselected one of the plurality of conductors. The laminate may include a top conductive layer for forming signal lines and at least two interior conductive layers for distributing power. One end of the eyelet may be clinched after it is positioned in the hole.

BRIEF DESCRIPTION OF THE DRAWING

FIG. 6 is a block diagram of a manufacturing system.

FIGS. 21A through 21H show capacitor assemblies.

FIG. 28A is a cross-sectional side view of a snake circuit board on a converter module.

DESCRIPTIONS OF THE PREFERRED EMBODIMENTS

Figure 1:
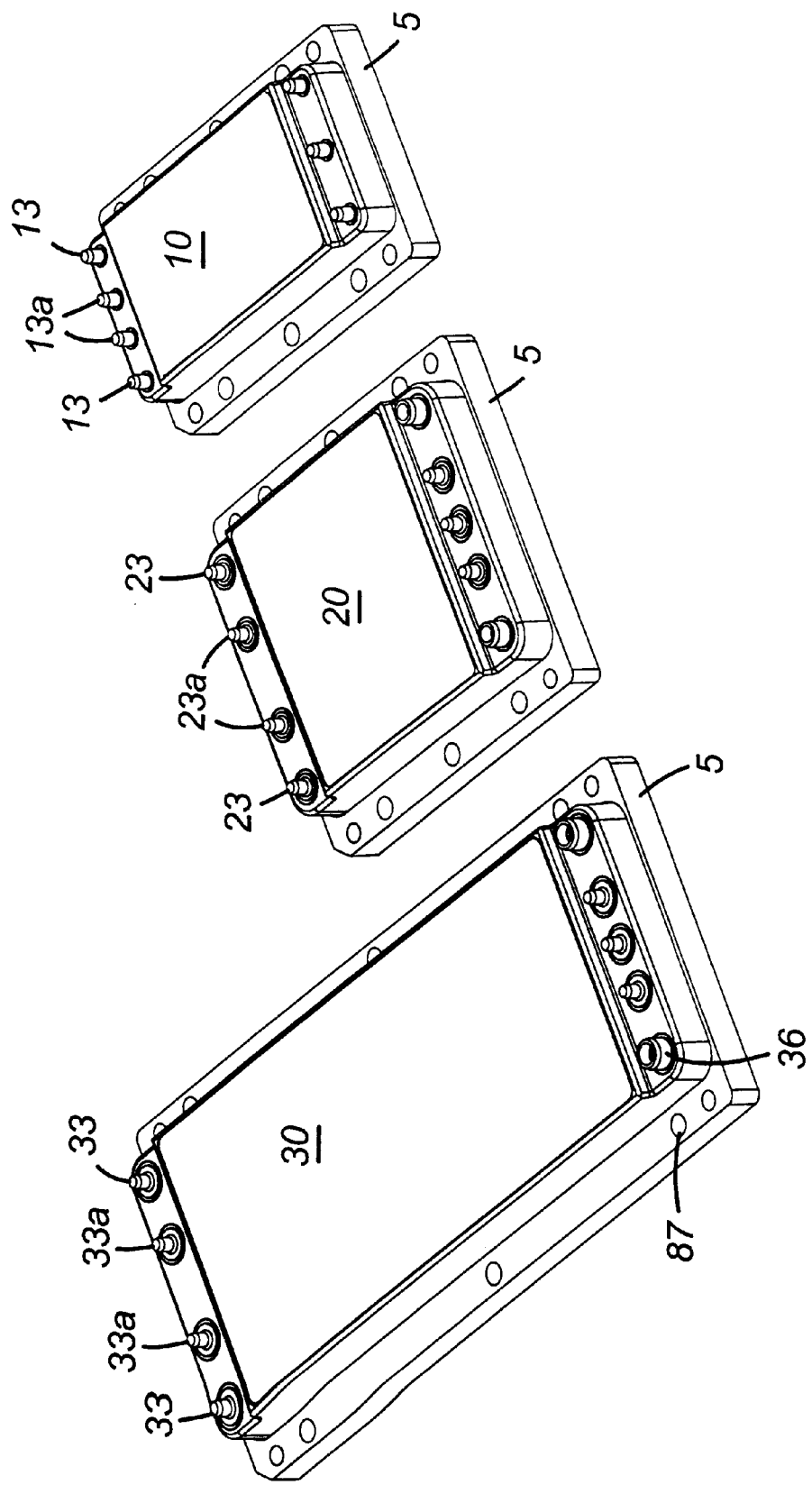
FIG. 1 is a perspective view of three package styles for modular power converters.

Referring to FIG. 1, high density, modular DC-DC converters are available in a wide variety of input voltage, output voltage and power levels. For example, three different styles of power converter modules micro 10, mini 20, and maxi 30 (corresponding, for example, to the 700, 800, and 900 Series of DC-DC converters manufactured by Vicor Corporation, Andover, Mass., USA) are shown in FIG. 1. For a given combination of input and output voltage ratings (e.g., 48 V nominal input, 5 V output; or 300 V nominal input, 48 V output), the maximum amount of power which can be delivered by a power converter module in a particular package is related to the package size. A converter module in package style 10 might be rated to deliver up to 150 Watts of output power at a baseplate 5 temperature rating of 100 degrees Celsius for example. Similarly, converter modules in package styles 20 and 30 might be respectively rated to deliver up to 250 and 600 Watts of output power at the same 100 degrees C baseplate temperature.

The power delivered to a single load can be increased by operating two or more converter modules in a power-sharing array as disclosed in commonly assigned U.S. Pat. No. 4,648,020, entitled "Power Booster Switching at Zero Current" and U.S. Pat. No. 5,079,686, entitled "Enhancement-Mode Zero-Current Switching Converter" both incorporated here by reference. A virtually limitless number of custom power supplies may be configured using combinations of different quantities and models of converter modules of the kind shown in FIG. 1.

Figure 2A:
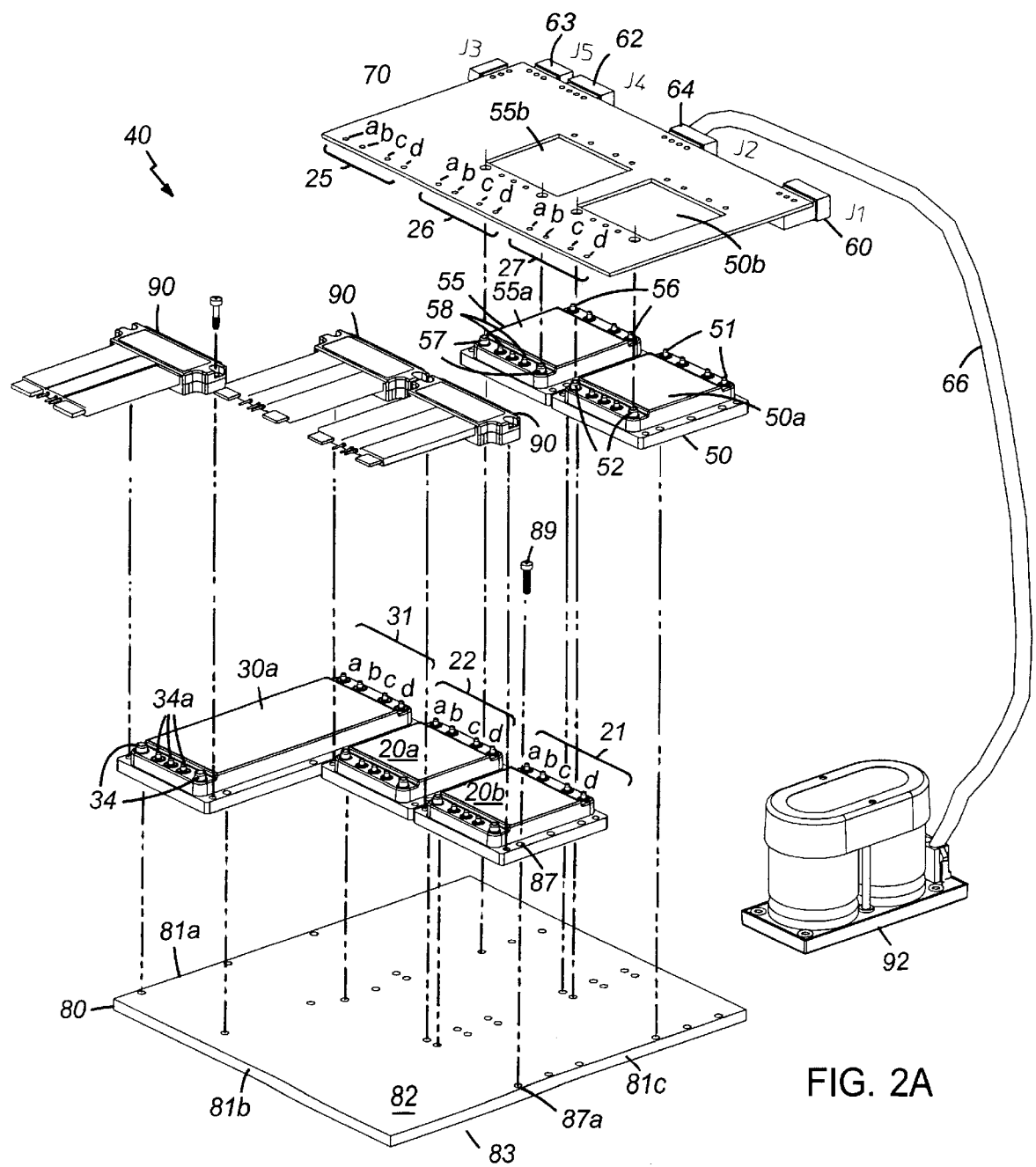
FIG. 2A is an exploded, perspective drawing of a power supply assembly.
Figure 2B:
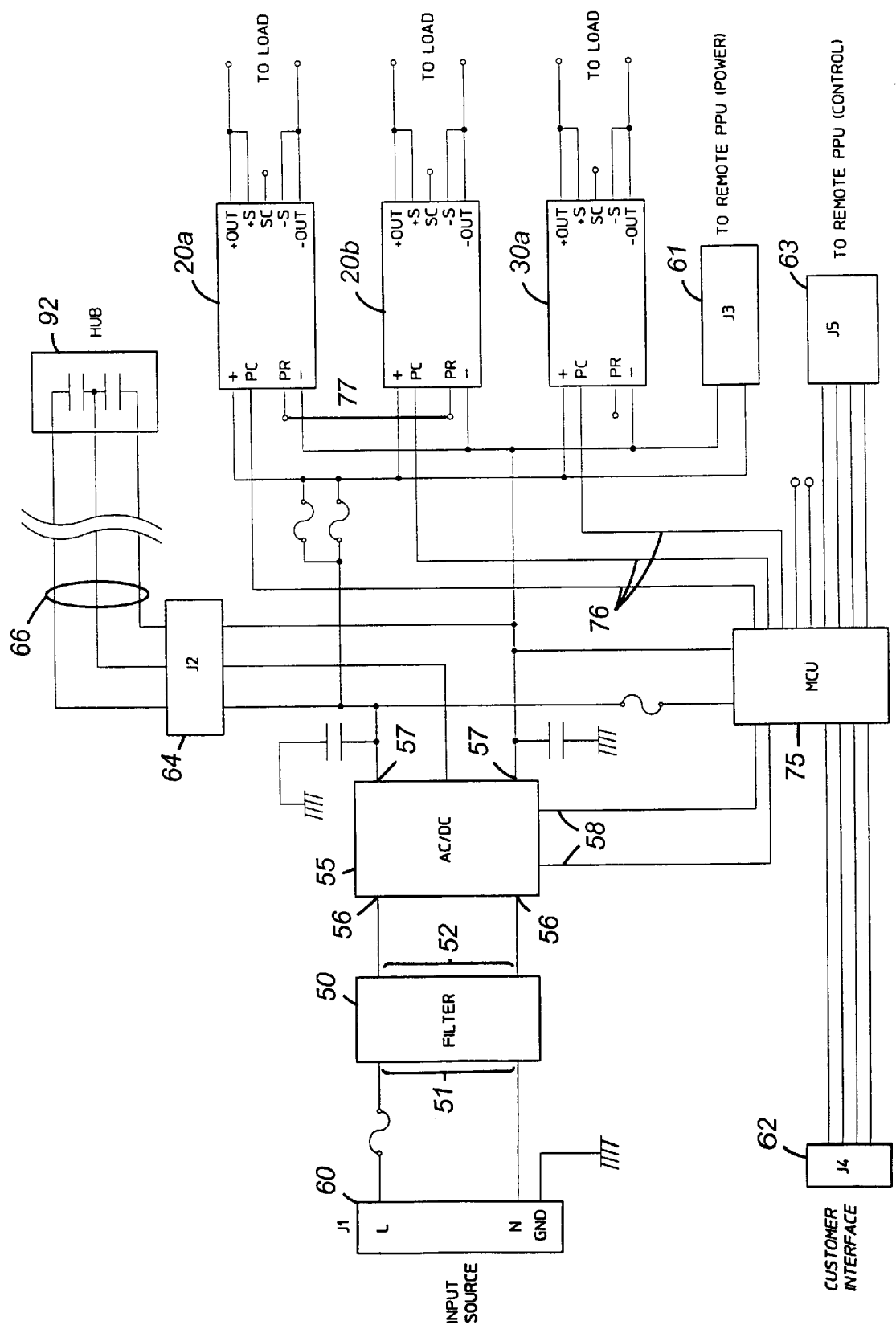
FIG. 2B is a schematic block diagram of a power supply system.

One embodiment of a power supply assembly 40 comprising modular DC-DC power converters and other related modular power conversion components is physically depicted in FIG. 2A and schematically depicted in FIG. 2B. Referring to FIGS. 2A and 2B, three DC-DC converters 20a, 20b, 30a are shown in perspective above a flat top mounting surface 82 of a metal mounting plate 80. Also shown are "front-end" modules 50 and 55. The term "front-end" refers generally to circuitry which is connected between the externally supplied power supply input source(s), such as the AC utility line or DC telecommunications battery, and the inputs of the DC-DC converter modules 20a, 20b, 30a. Front-end module 50 contains conducted electromagnetic interference ("EMI") filtering elements while module 55 contains AC-to-DC conversion circuitry. A power source, such as the AC utility line voltage, is fed into the EMI filter module 50 via power connector 60. The EMI filter module 50 attenuates electrical noise generated by the AC-to-DC converter module 55 and the DC-DC converters 20a, 20b, 30a, and allows the assembly 40 to meet limits on the amount of EMI feedback to the power source. Traces (not shown) on the front-end printed circuit board ("PCB") 70 connect the input pins 51 of the EMI filter module 50 to the input power connector 60. The AC voltage, delivered at the output pins 52 of the EMI module 50, is fed to the input pins 56 of the AC-to-DC converter module 55 by traces (not shown) on PCB 70. The DC output of the AC-DC module is delivered to output pins 57. Control signals may also be delivered by the AC-DC module at pins 58. For example, signals for controlling the turn-on during power-up and turn-off during power-down of the DC-DC converters 20a, 20b, 30a, may be provided at pins 58.

Referring to FIG. 2B, a microprocessor control unit ("MCU") 75 may also be incorporated into the front-end board 70. The MCU 75 may be a simple programmable microcontroller such as the PIC16C711, manufactured by Microchip Technology Inc., 2355 West Chandler Blvd., Chandler, Ariz., U.S.A. which can be programmed to control the sequence of and relative timing for turning on and turning off the outputs in the power system 40. The MCU 75 receives the control signals from pins 58 of the AC-DC module 55 as inputs. Control signals 76 delivered from the MCU to the individual modules are also shown in FIG. 2B. The MCU may be programmed to automatically turn on selected outputs, or combinations of outputs, in a predetermined order when the system is powered up and to shut down selected outputs in a predetermined order when the system is powered down (e.g., during a brown-out or in the event of some other failure condition). A control interface through which an external system may interrogate the MCU to receive the status of the power system and also issue control signals to the power system (e.g., for turning converter outputs on and off under control of the external source) may also be provided on connector 62.

Each MCU may provide, several control signals 76, each of which may be used to control one or more outputs (each output being provided by either a single converter module or by a power-sharing array of two or more modules). Another control signal line 77 (FIG. 2B) may also be provided for arranging sets of adjacent converters into power-sharing arrays. The control signal lines are provided by means of an automated wiring system described below.

Figure 19A:
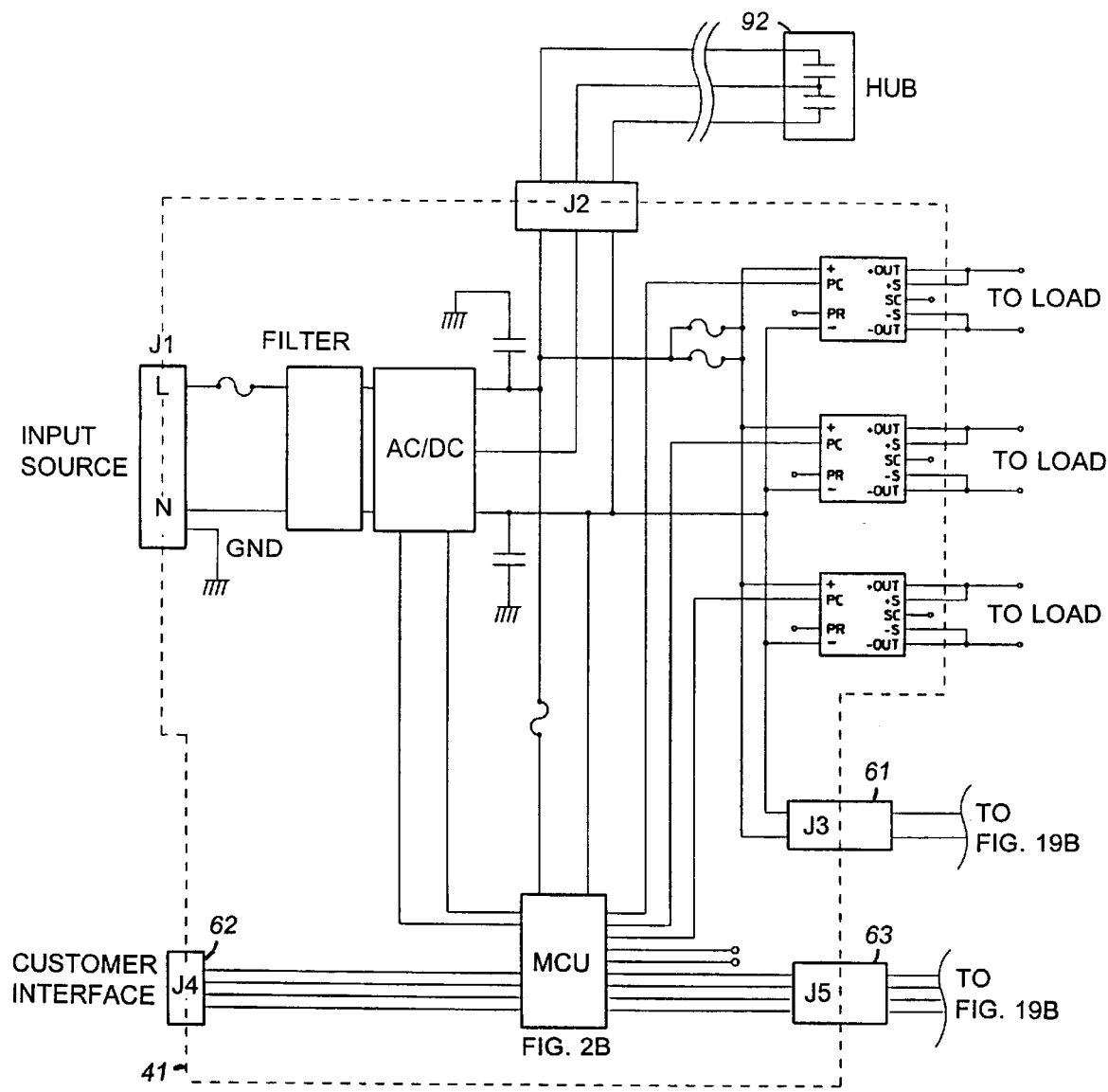
FIG. 19 is a schematic block diagram of a two plate power system.
Figure 19B:
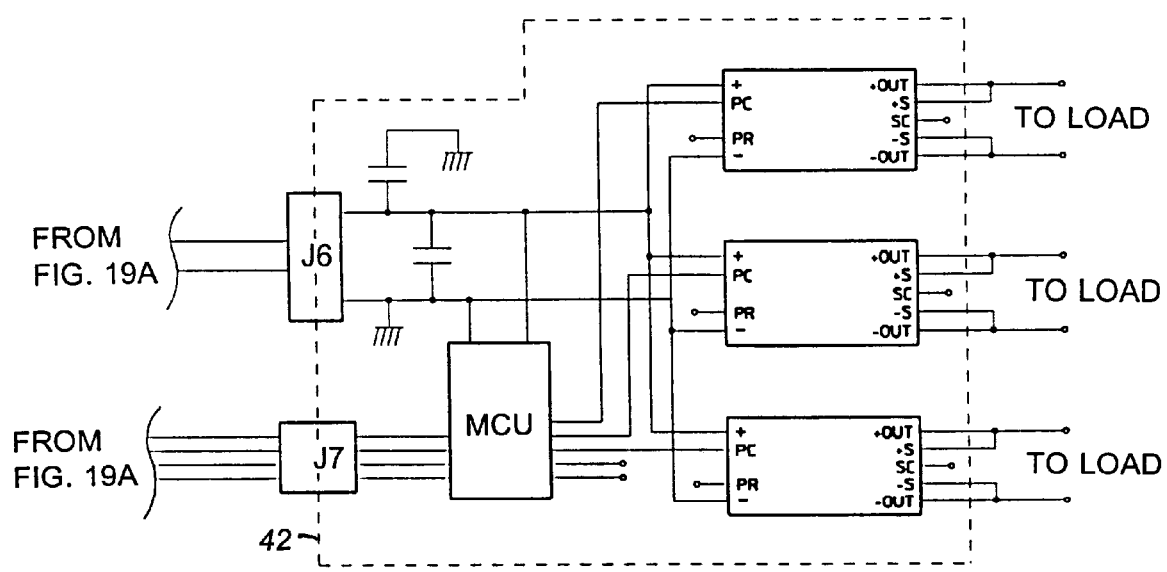
Figure 20A:
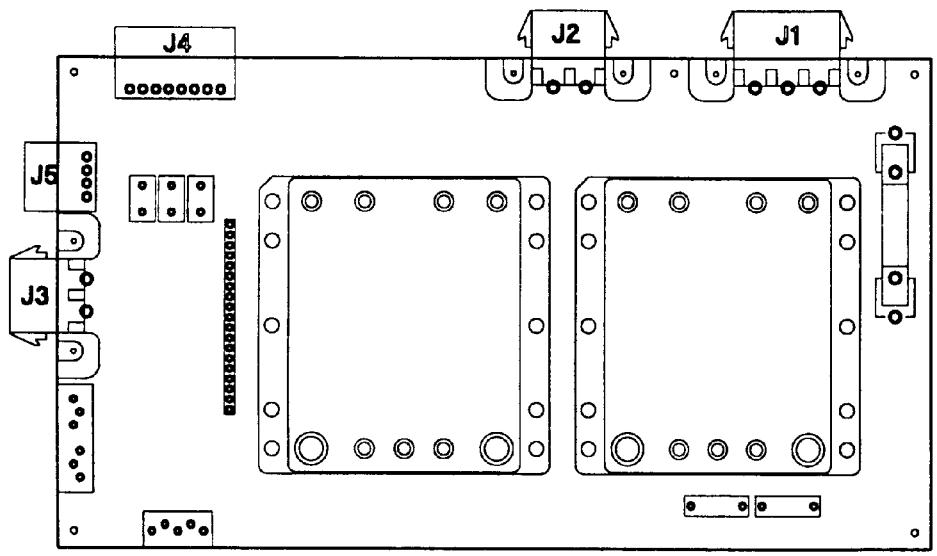
FIGS. 20A though 20D show power factor correcting front-end assemblies.
Figure 20D:
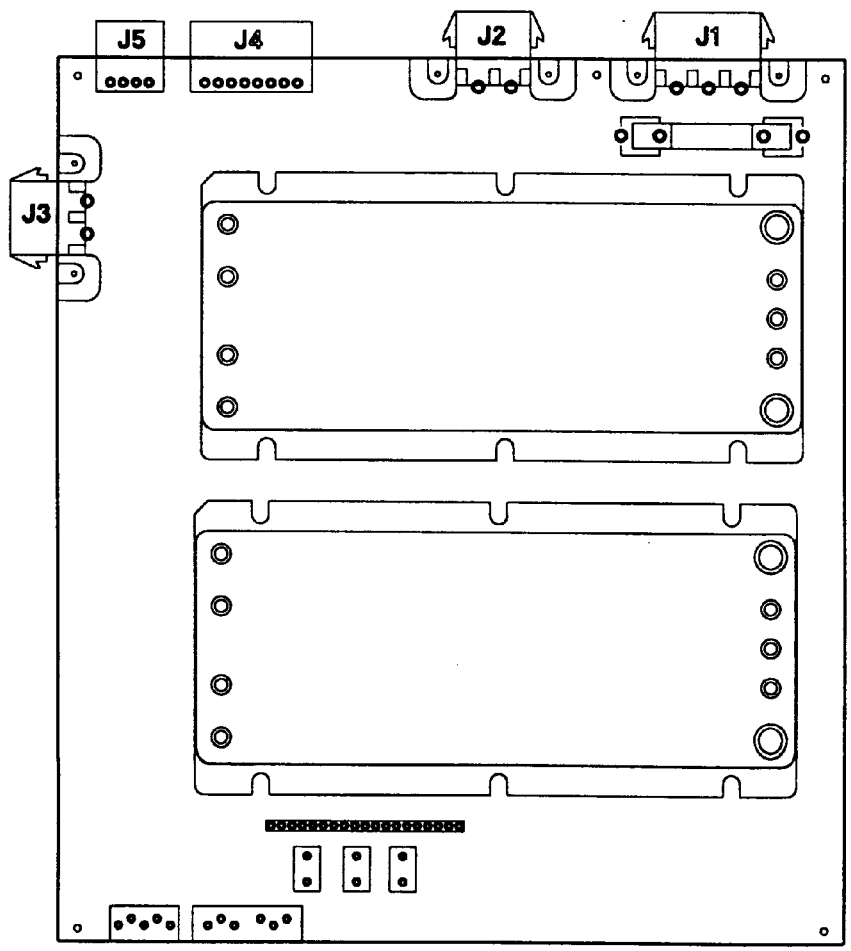
Figure 20B:
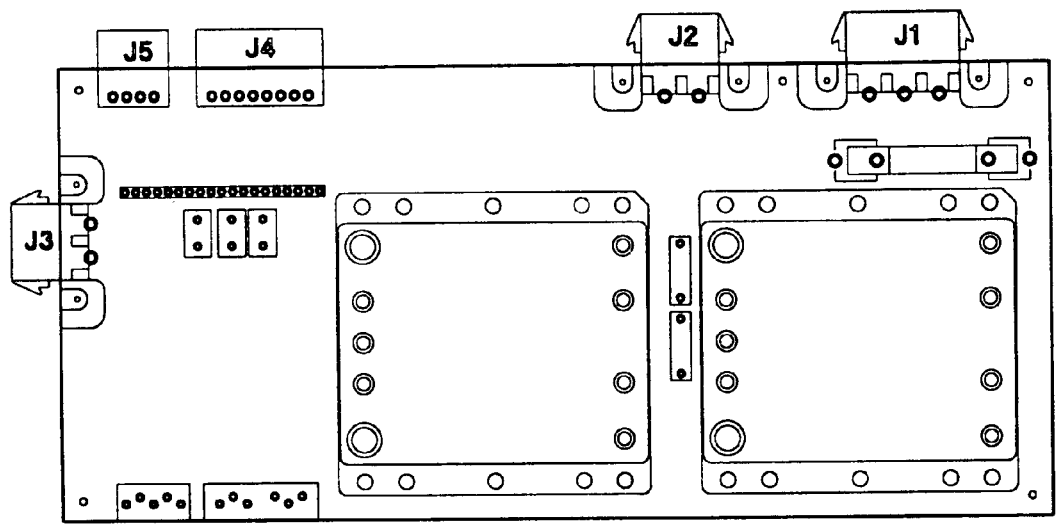
Figure 20C:
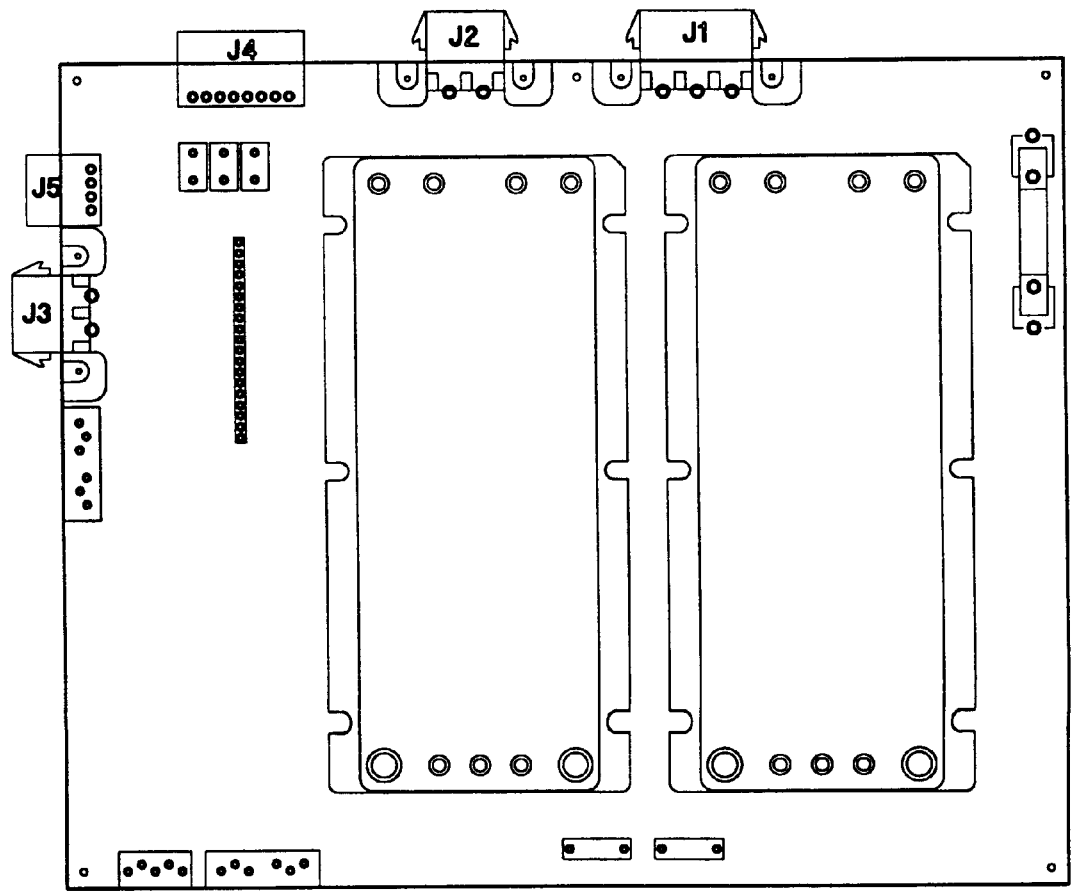

The power system 40 may comprise several, e.g., up to three, mounting plates 80 each having up to six control lines. The sub-system on each plate is referred to as a power processing unit ("PPU"). One example of a two-plate power system is schematically shown in FIG. 19. Each PPU includes its own MCU. One computer interface 62 is provided by a main MCU which then communicates with additional MCUs through connector 63. The MCUs on the other PPU front-end boards function as remote MCUs. During the power-up and power-down sequencing and the brown out control, the master MCU issues commands to the remote MCUs via the control interface 63. Power is provided to the remote PPUs via power connector 61. A two PPU power system is shown schematically in FIG. 19. In the figure the main PPU 41 is shown connected to the remote PPU 42. Note that the remote PPU may have a simplified front-end circuit.

One way of connecting DC input power and control signal lines to the converter modules is to provide several sets of interconnect pads 25, 26, 27 along the periphery of PCB 70 as shown in FIG. 2A. The DC power from the AC-DC converter module 55 is delivered by traces (not shown) to pads a, d at each set of interconnect pads 25, 26, 27; and control signals from the MCU 75 are delivered by traces (not shown) to pads b, c at each set of interconnect pads 25, 26, 27. The DC voltage (a, d) and control signal (b, c) input pins 22, 21, 31 of each DC-DC converter module 20a, 20b, 30a may be directly connected to the DC voltage and control signals at their respective set of interconnect pads 26, 27, 25 on PCB 70. Using this approach, however, a different PCB 70 must be provided for each different power system 40 in order to interface to differing numbers and locations of converters. Alternatively, a wiring harness may connect each converter to its respective interconnect pads. Another, more flexible, method for interconnecting converters with a standardized front end PCB 70 assemblies is described below and shown in FIG. 9.

The front-end PCB 70 and all of the parts connected to it (e.g., EMI and AC/DC modules, connectors, MCU, and related circuitry) will be referred to below as the "front-end". In general, there may be several different kinds of front-ends (e.g., a power-factor correcting front-end; an auto-ranging, capacitively filtered rectifier front-end; or a DC input front-end).

To minimize the overall height of the front end assembly, the upper surfaces 50a, 55a (FIG. 2A) of modules 50, 55 are arranged to protrude through openings 50b, 55b in the PCB 70 (as described in commonly assigned U.S. Pat. No. 5,365,403, entitled "Packaging Electrical Components," which is incorporated here by reference). The front-end and power converter modules may be firmly mounted to plate 80 using screws (e.g., screw 89) which pass through holes or slots 87 in the flanges of the module baseplates 5 (FIG. 1) into tapped holes 87a in plate 80.

In the power supply 40 of FIG. 2A, the front-end AC-DC converter module 55 may be made a power-factor correcting module ("PFC module"). A PFC module presents an essentially unity power factor load to the AC utility source while delivering a regulated DC output voltage to the inputs of all of the DC-DC converters 20a, 20b, 30a. Alternatively, module 55 may include front-end circuitry to perform conventional rectification of the AC input and provide input surge current limiting. In either case, the output filter capacitors which are typically used at the output of the AC-DC converter module 55 may be provided in a separate capacitor assembly (called the "HUB") 92 as shown in FIG. 2A. One advantage of physically separating the filter capacitors from the power supply assembly 40 is that it allows the overall height of the power supply 40 to be minimized. Another advantage is that the HUB 92 is thermally decoupled from the relatively high operating temperatures of the power supply 40 assembly. Since mean time before failure ("MTBF") and physical volume of electrolytic capacitors typically used for such filtering applications are temperature dependent, this allows for a reduction in capacitor size and improvement in capacitor MTBF. Another advantage is that the customer may change the amount of capacitance after the power supply 40 is manufactured thereby changing certain operating characteristics such as the ride-through and hold-up times. In conventional power supplies where the capacitors are typically mounted on a printed circuit board, the capacitance is fixed because the printed circuit board is designed to accept a fixed number of capacitors of a particular size. The HUB 92 is connected to the output pins 57 of the AC-DC converter by means of cable 66 and connector 64 and traces (not shown) on PCB 70. The length of cable 66 may be specified by the customer.

For DC input power supplies, the front-end may include an EMI filter module and in-rush and monitoring circuitry as well as surge protection. Heavier gauge cabling and PCB traces may be used to accommodate higher current flows and the AC-DC module 55 is omitted in the DC input front-end.

The structure illustrated in FIG. 2A can be adapted to a wide variety of power supply designs. The complement of output voltages, and the total power delivered by each output, can be altered by selecting an appropriate combination of DC-DC converters and front-end assembly. For example, in one embodiment of a power supply assembly 40, two converters 20*a*, 20*b* (FIG. 2B) might form a power sharing array which might deliver a total of 500 Watts at an output voltage of 15 Volts and converter 30*a* might deliver 5 Volts at 80 Amperes. Thus, the power supply might deliver a total of 900 Watts from two independent, regulated outputs.

The output pins of the DC-DC converters may be connected to loads (not shown) and other external devices via connectors 90. The output pins may include power output pins and output trim and control pins such as pins 34 and 34*a* respectively. The connectors 90 may be of the kind described in Nowak, et al, U.S. patent application Ser. No. 08/744,110, entitled "Connector," filed Nov. 5, 1996. The physical positioning of the different outputs, relative to each other and to the peripheral edges of the plate 81*a*, 81*b*, 81*c*, may be established by appropriately choosing positions for the converters 20*a*, 20*b*, 30*a* on the top surface 82 of the plate 80.

Figure 3A:
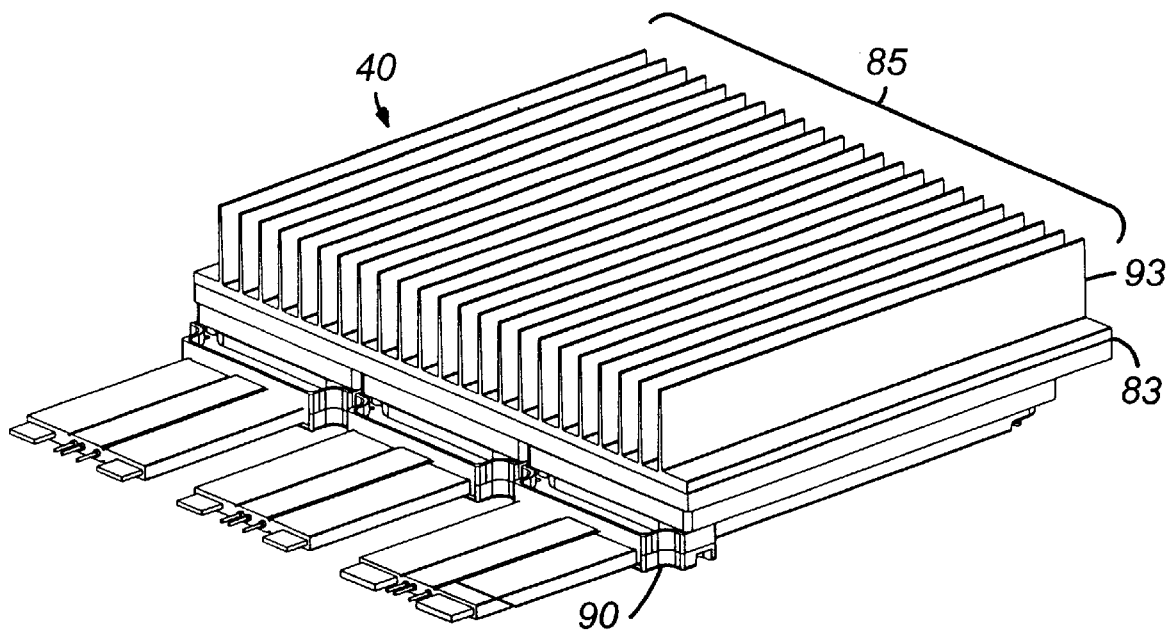
FIG. 3A and FIG. 3B show the power supply assembly of FIG. 2A with a unitary finned heat sink.
Figure 3B:
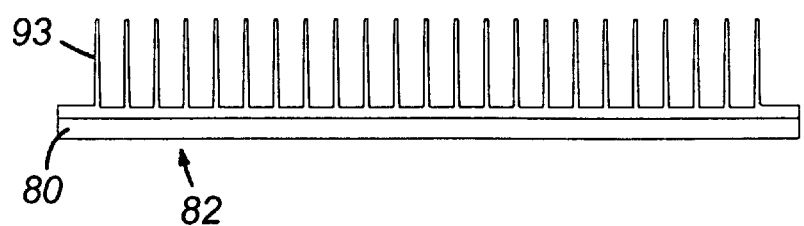

One way to provide heat sinking for the assembly 40 of FIG. 2A is to put fins 85 on some or all of the entire rear surface 83 of the mounting plate 80, as shown in FIG. 3A. A separate heat sink assembly 93 may be attached to the rear surface 83 of the heat sink plate 80, as shown in FIG. 3B. Alternatively, an integral heatsink and mounting plate may be fabricated by starting with a plate 80 of suitable thickness and machining fins 85 to the desired thickness and height. Alternatively, an integral heatsink and mounting plate may be fabricated from extruded heatsink stock. The size of the plate 80 and the thermal loss in the power supply 40 will vary from design to design. The heat sinking approach of FIGS. 3A and 3B therefore requires a wide range of customization because each power supply assembly will present its unique heat sink requirements.

Figure 4:
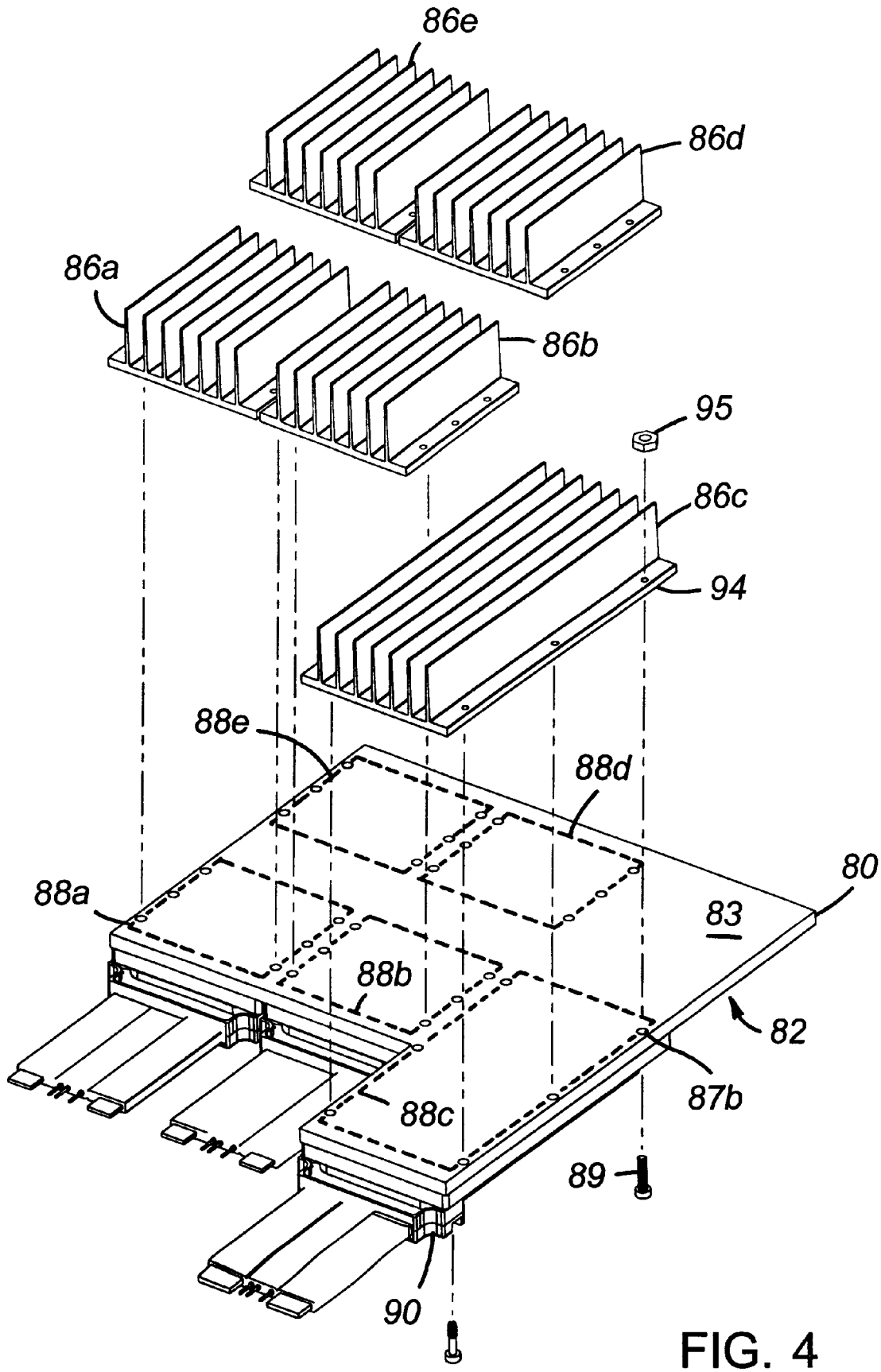
FIG. 4 shows the power supply assembly of FIG. 2A with multiple heat sinks.

Another way to provide heat sinking for the assembly 40 is illustrated in FIG. 4. Individual heat sinks 86*a*, 86*b*, 86*c*, 86*d*, and 86*e* are mounted on the rear surface 83 of the mounting plate 80 in positions corresponding to the locations 88*a*, 88*b*, 88*c*, 88*d*, and 88*e* of the converter modules on the top mounting surface 82 of the plate 80. As shown in FIG. 4, the outlines of the individual heatsinks on surface 83 match the outlines of the converter module baseplates (shown as dashed lines as 88*a*–88*e*) on the front surface 82.

One advantage of providing individual heat sinks as illustrated in FIG. 4 is that customized heatsinking of a wide variety of power supply assemblies 40 may be provided using a few standardized heat sinks. Each standardized heatsink is made to conform to the baseplate layout of a particular module size, e.g., micro, mini, and maxi as shown in FIG. 1. Since the heat sources are concentrated in the modules, locating finned heat sinks directly at the mounting locations 88 of the modules provides very little loss in cooling effectiveness relative to that provided by fins over the entire surface 83 (FIG. 3*a*). Alternatively where fin height is a concern, the individual heatsinks may be made to occupy a greater area than that of the baseplate while still conforming to the mounting holes of the converter module baseplates.

Mounting hardware used to mount the converters to the front surface 82 may also be used to mount the heat sinks 86*a*–86*e* to the rear surface 83. For example, a screw 89 may pass through a hole 87 (FIG. 2A) in the flange of the module baseplate 5; pass through a hole in the mounting plate 87*b* (FIG. 4); and be threaded into a tapped hole 94 in the heat sink. Alternatively, the screw 89 could pass through a hole 94 in the heat sink and be threaded into a nut 95 as shown in FIG. 4. Thus another benefit of the method of FIG. 4 is that the same set of hardware and holes may be used for mounting the modules and the heat sinks.

Figure 9:
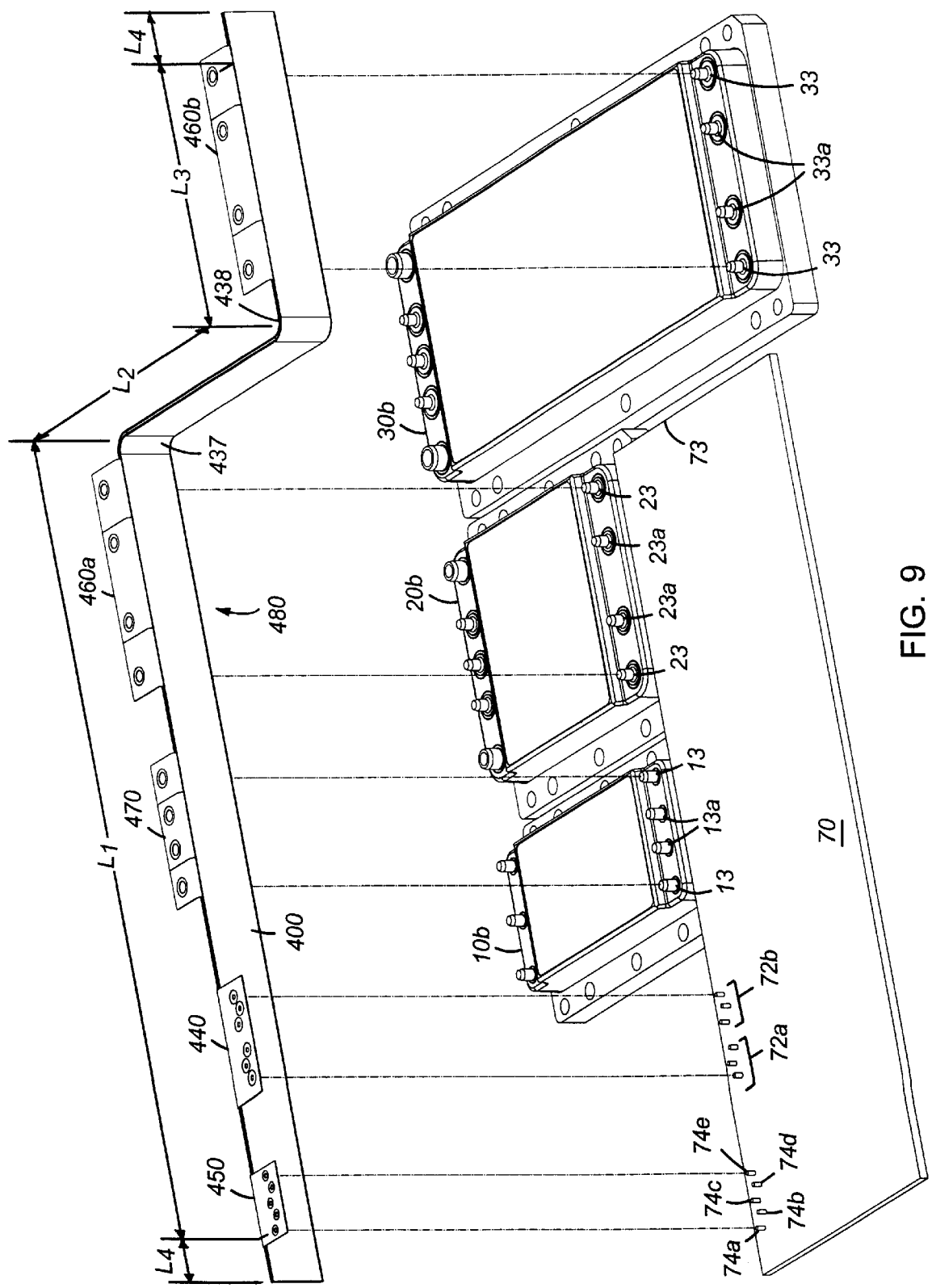
FIG. 9 shows a portion of the power supply assembly.

A scheme for electrically connecting virtually any combination of converter modules to a standardized front end assembly is shown in FIG. 9. In the Figure, a snake cable assembly 480 carries power and control signals from a front-end PCB 70 to converter modules 10*b*, 20*b*, 30*b* (for clarity, front-end components, such as front-end modules, connectors, MCU, and other components, are not shown in FIG. 9).

Converter module input voltage is delivered at pins 72*a* and 72*b* on front-end PCB 70. Pins 72*a* are positive polarity; pins 72*b* are negative polarity. Likewise, five control signals are delivered to pins 74*a* through 74*e* on PCB 70. Input voltage and control signals are routed to cable 400 by front-end power tap 440 and front-end control signal tap 450 and are routed from the cable 400 to individual converter modules 10*b*, 20*b*, 30*b* by module taps 470, 460*a*, and 460*b*. One set of power and control pins 72, 74 on front-end PCB 70 are used to connect to all of the converter modules on a PPU.

Figures 10A, 10B:
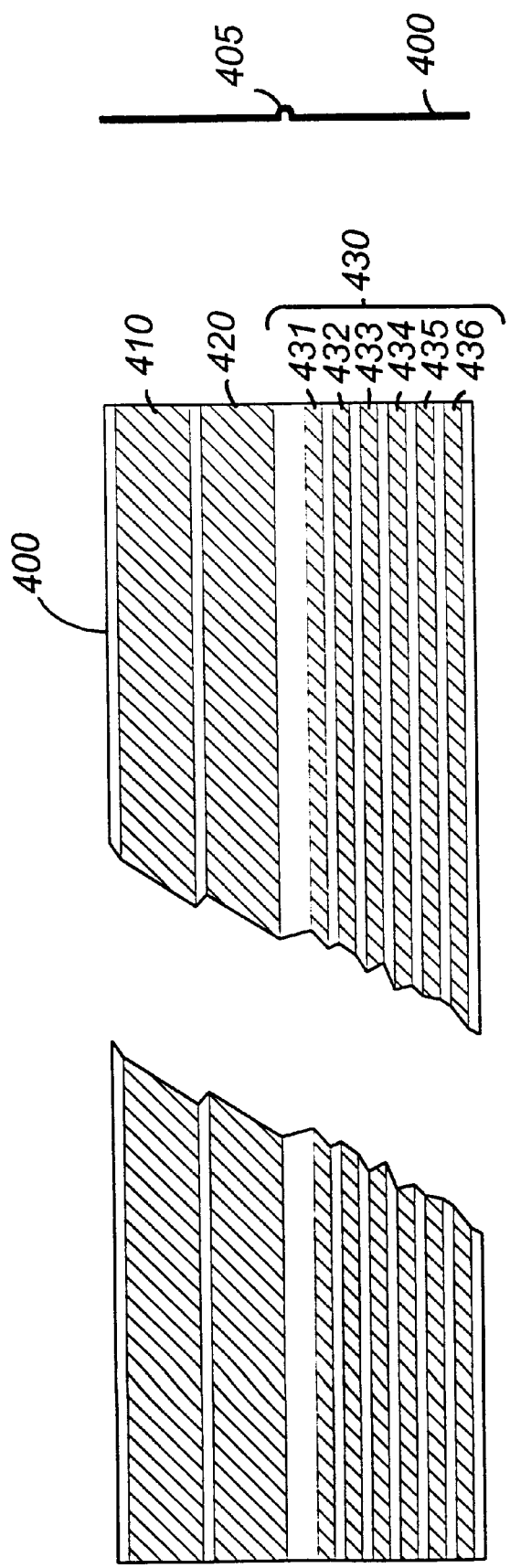
FIGS. 10A and 10B show side and end views of a length of cable.

As shown in FIGS. 10A and 10B, the cable 400 includes power conductors 410, 420 and control conductors 431–436. The conductors are sandwiched between flexible insulating films (e.g., Kapton polyamide insulating film or polyester film). Power conductors 410, 420 are sized to carry DC power to the inputs of the converter modules 10*b*, 20*b*, 30*b* with acceptable power losses. For low voltage, DC input power supplies, e.g., 48V and lower, power conductors 410, 420 can be made bigger, to keep distribution losses manageable.

A reference linear dimple 405 runs along the length of the cable, as shown in FIG. 10B. The reference dimple 405 aids in properly folding the cable 400 after the power, control signal, and module taps are connected. The dimple 405 may also be used as a position reference while placing and assembling the taps onto the cable provided that the dimple location is maintained within acceptable tolerances during manufacture.

Figure 11:
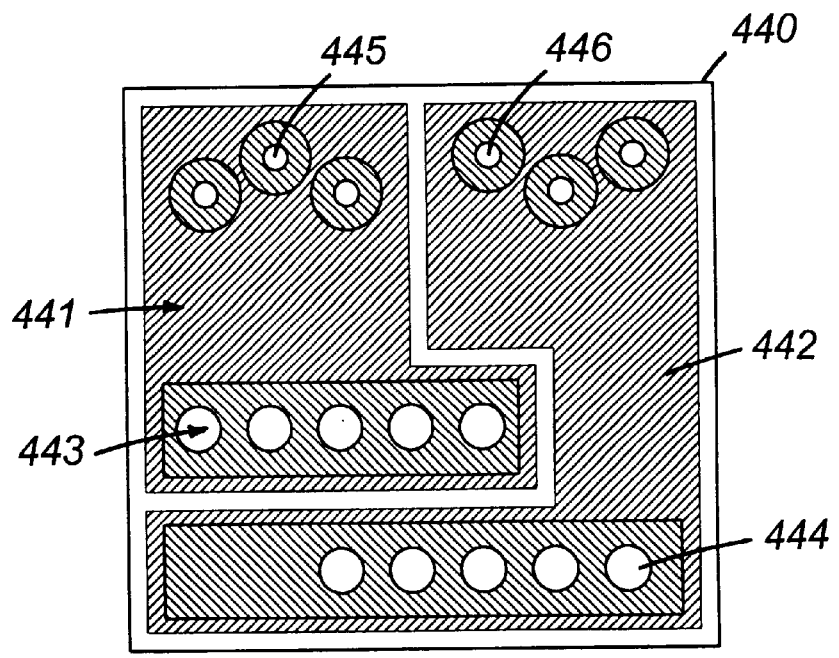
FIG. 11 shows a front-end power tap for use with the cable of FIG. 10.

Referring to FIG. 11, a front-end power tap 440 for making a connection between the power conductors 410, 420 of the snake cable and the front-end DC output (at pins 72a, 72b) is shown. Two plated conductors 441, 442 are arranged between layers of flexible, insulating, film. Portions of the respective conductors are exposed at selected areas to allow contact to be made. Exposed pads 443 and 444 on the power tap 440 facilitate contact with the power conductors 410 and 420 of cable 400, respectively. Holes 445 and 446 are for connecting to pins 72a, 72b on the front-end PCB.

Figure 12:
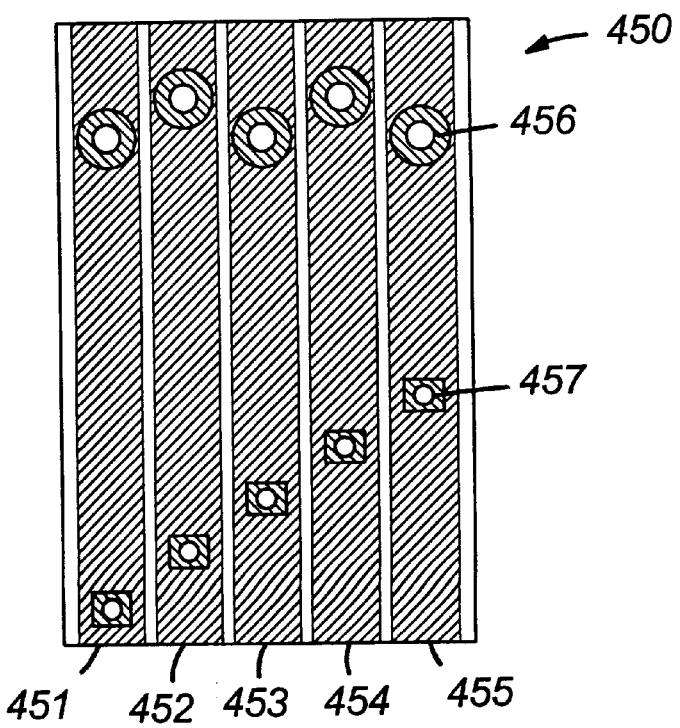
FIG. 12 shows a front-end signal tap for use with the cable of FIG. 10.

Referring to FIG. 12, a front-end control signal tap 450 is shown for making connections between the control conductors 431–435 and the control signal pins 74a–74e on the front-end PCB 70. The front-end control signal and power taps differ in the number of connections which are made, but are otherwise similar in construction. Plated conductors 451 through 455 are arranged between layers of flexible, insulating, film. Insulation is removed to expose areas to which connections are to be made (e.g., exposed pads 457 allow connection to conductors 431–436 on cable 400 and exposed pads with holes 456 allow connection to control signal pins on the front-end PCB 70).

Figure 13:
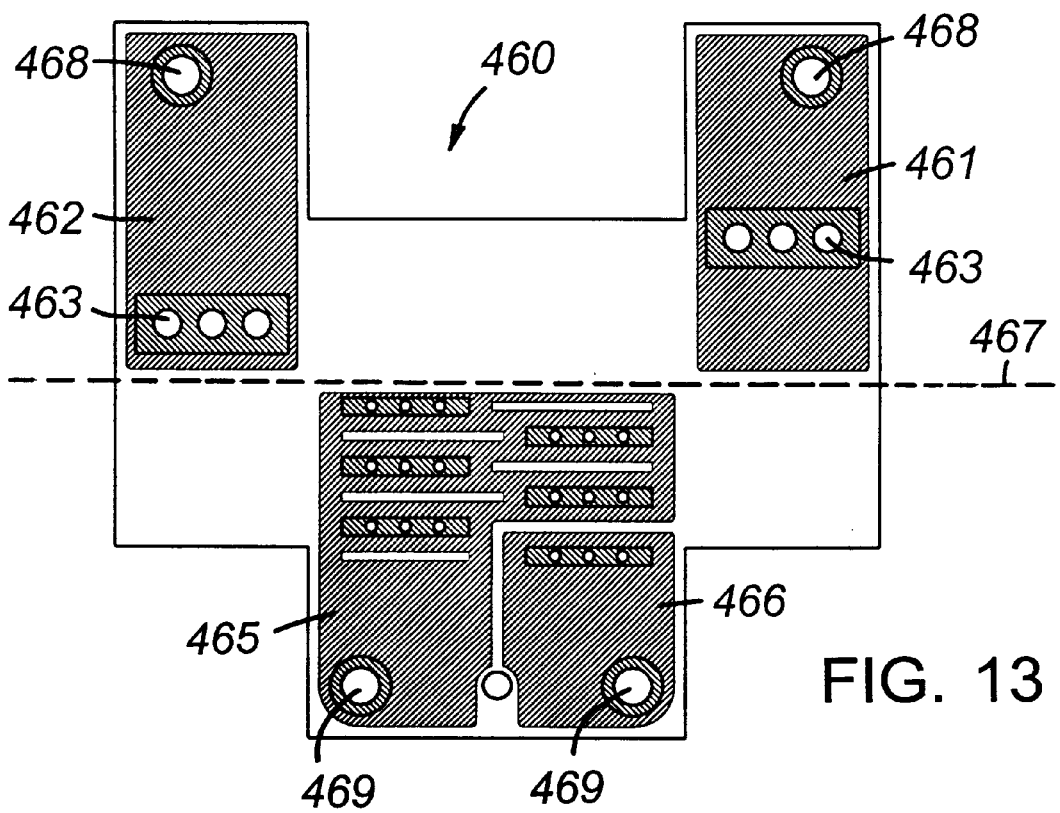
FIG. 13 shows a maxi/mini-module power and signal tap for use with the cable of FIG. 10.
Figure 14:
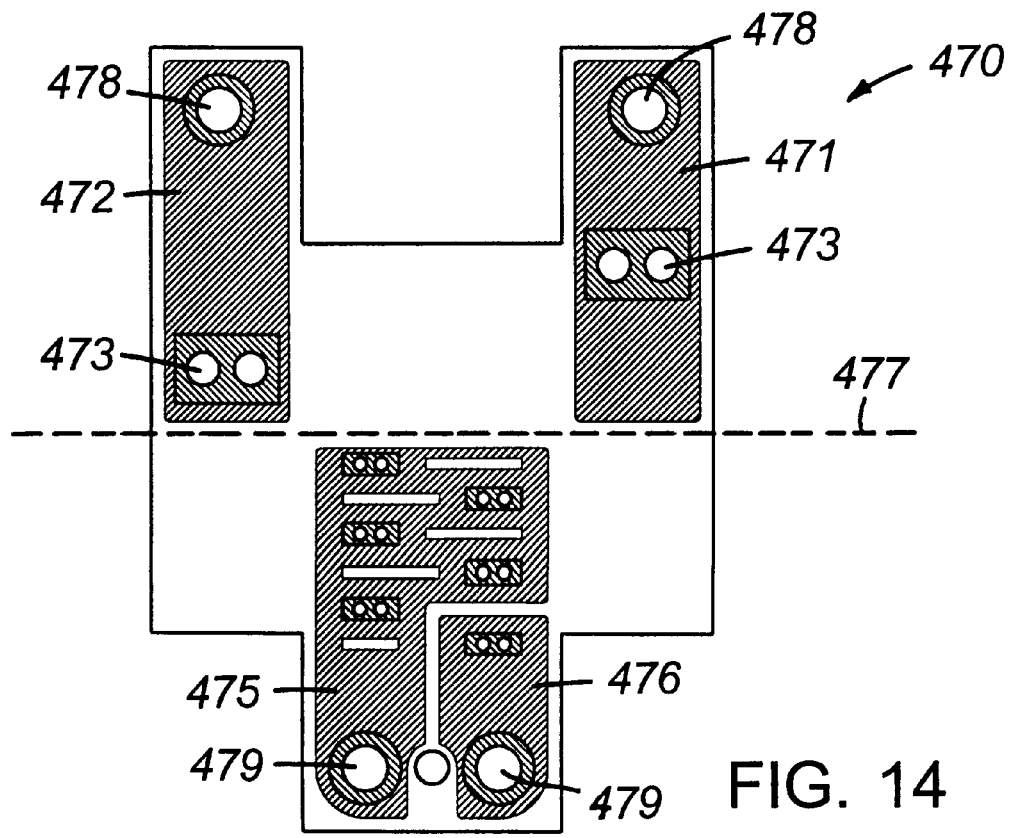
FIG. 14 shows a micro-module power and signal tap for use with the cable of FIG. 10.

FIGS. 13 and 14 show, respectively, two different size module taps 460, 470. Module tap 460 is used for making connections between power conductors 410, 420 and control conductors 431–436 of the snake cable and the input pins 33, 33a, 23, 23a of 800 and 900 series modules (modules 20b and 30b, FIG. 9). Tap power conductors 461 and 462 make contact with cable power conductors 410 and 420 respectively through exposed areas 463. Two tap control conductors 465, 466 are also provided on the module tap. Control conductor 465 has five exposed pads which overlay each of the five control conductors 431–435 in the snake cable. Connection is made to only one of the five cable conductors. The second tap control conductor 466 is used to connect to the sixth conductor 436 to create power sharing arrays of adjacent converter modules (as explained below). Exposed pads and holes 468 and 469 make contact with the module DC voltage input pins 23, 33 and control pins 23a, 33a respectively. A tap for use in making connections between power conductors 410, 420 and control conductors 431–436 and the input pins 13, 13a of 700 series modules (module 10b, FIG. 9) is shown in FIG. 14 with similar numbering. The difference between the two module taps are in the spacing of the holes which accommodate the module pins and the current carrying capacity of the power conductors.

The cable system allows flexible assembly. Both the length of the cable 400, and the quantity and locations of the module taps, may be adapted to connect virtually any number of converter modules to a standardized pattern of power and control pins on a front-end assembly PCB 70. Once the locations of the converter modules have been defined, the relative positions of the power, control signal and module taps may easily be determined, either by manual measurement or by computer. For example, if a set of converter modules 10b, 20b, 30b and a front-end assembly PCB 70 are arranged as shown in FIG. 9, the length of the cable 400 may be determined by: summing (a) the distance, L1, from the first control pin 74a, past the ends of the two converter modules 10b, 20b, to the point at which the cable takes its first bend 437 (just beyond edge 73 of PCB 70), (b) the distance, L2, from the bend 437 to the point at which the cable takes its second bend 438, (c) the distance, L3, which extends just beyond the furthest power pin 33 on module 30b, and (d) a fixed amount of additional distance L4 to provide a small amount of material (e.g., ¼ inch) to extend beyond the connection points at the either end of the cable. The types of module taps to be used, and the locations of the taps on the cable 40, are also readily determined based on the types of modules used and the position of each module relative to the control signal and power pins 72, 74 on the front-end PCB 70.

Figure 15:
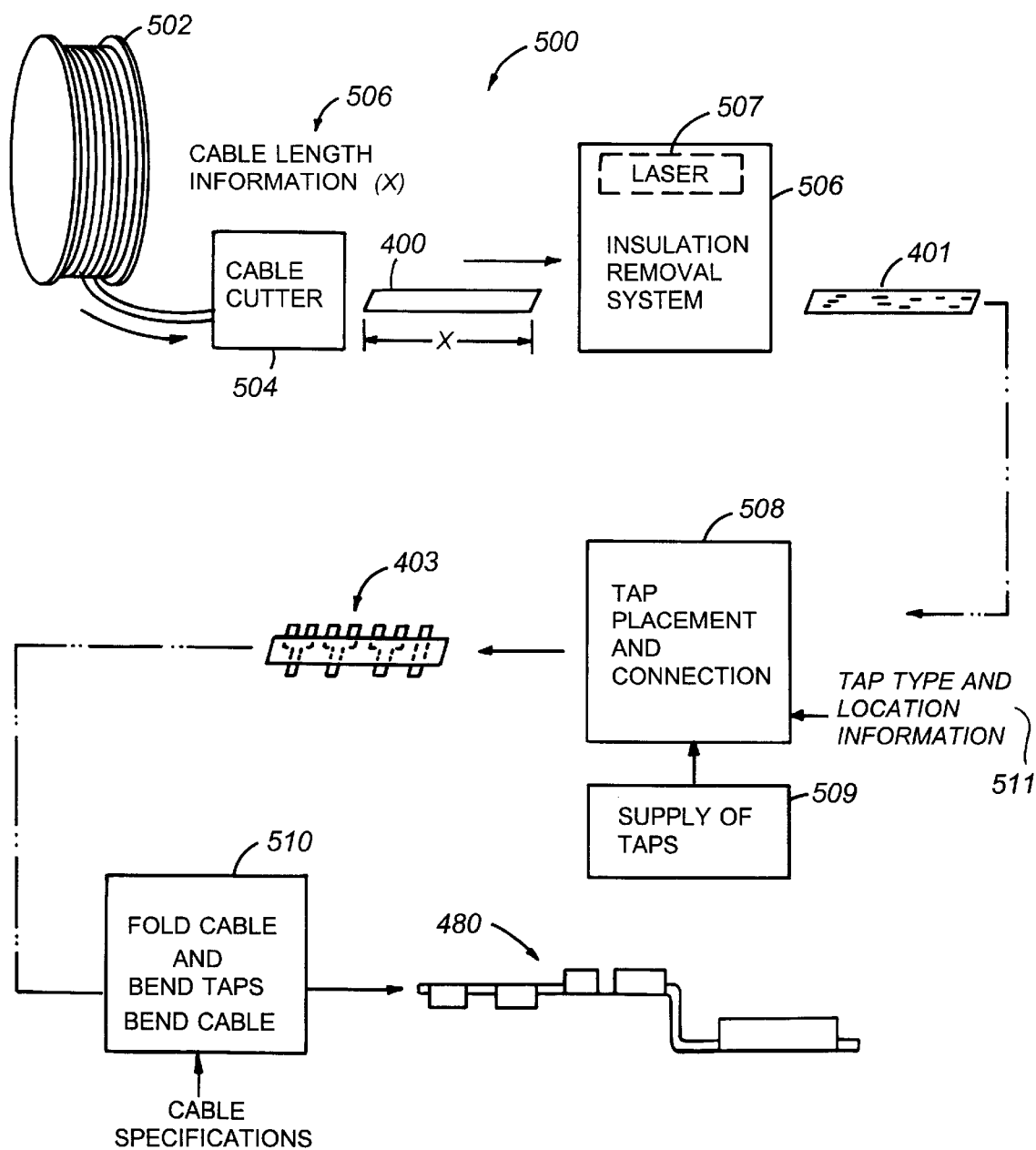
FIG. 15 shows a fabrication line for assembling a length of cable of the kind shown in FIGS. 9 and 10.

Once the length of the cable 400 and the types and locations of the module taps have been determined, the cable can be assembled. One way to assemble the cable is shown in FIG. 15. In the figure a reel of cable 502 feeds cable into a cutting device 504. The cutting device cuts a length of cable 400 in accordance with cable length information 505 delivered to it (e.g., cable length equals "X"). The cut length of cable 400 is then delivered to an insulation removal system 506 in which portions of the snake cable conductors are exposed by burning portions of the outer insulating layers away with a laser 507. For example, polyester film disintegrates during laser ablation. Other methods may be used to remove the insulation such as chemical decomposition, sand blasting, physical abrasion, and cutting. The locations along the cable 400 at which insulation is removed is determined on the basis of the kinds and locations of the power, control signal, and module taps and the pre-defined connections between control lines 431–436 and module control pins 13a, 23a, 33a.

Figure 16:
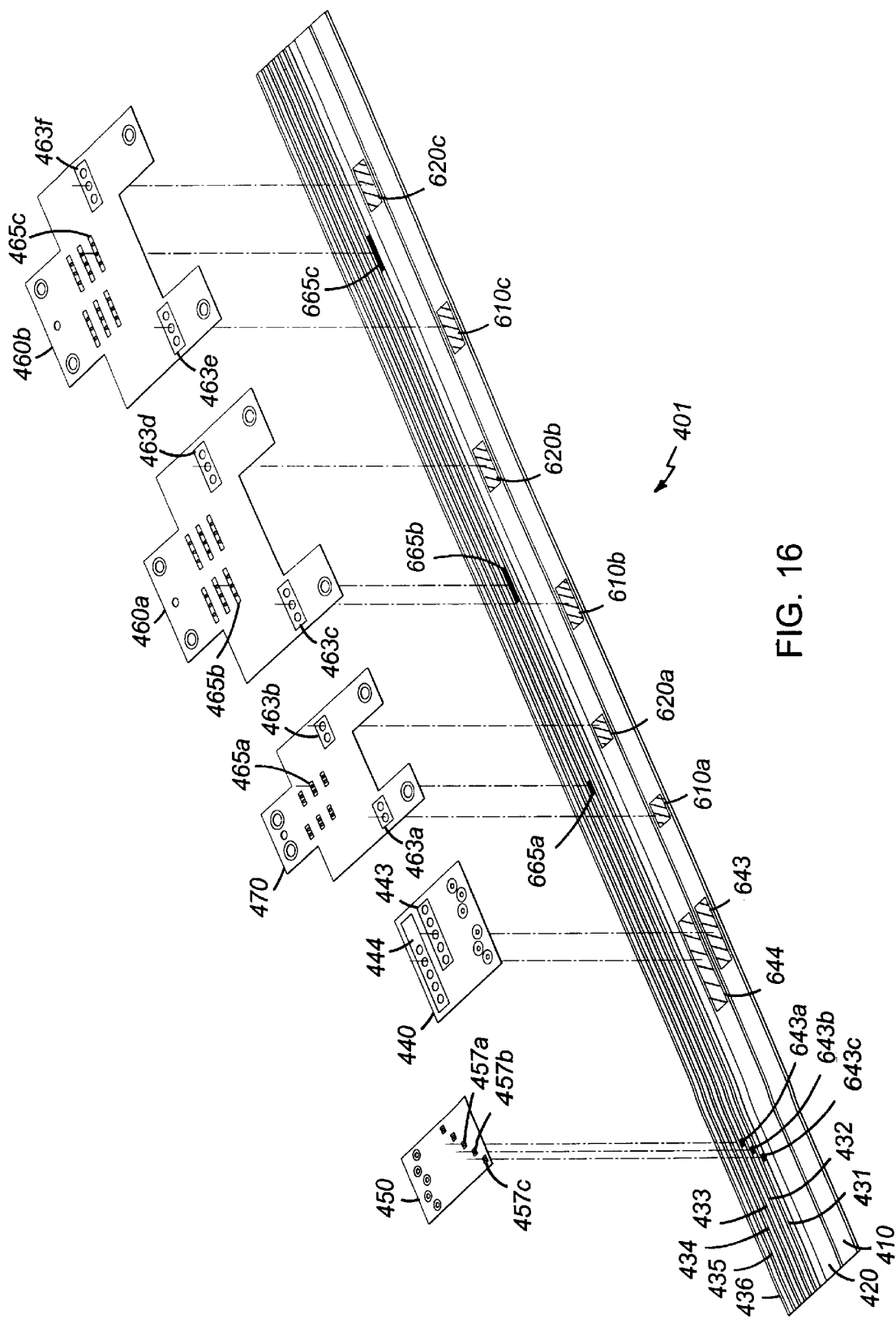
FIG. 16 shows a step in the assembly of the cable of FIG. 9.

A cable with portions of insulation removed 401, and the relationship of the cable to control, power and module taps, is shown in FIG. 16. In the figure, cable insulation has been removed at locations 634a–634c, 610a–610c, 620a–620c, 643, 644 and 665a–665c. The exposed conductors of control lines 431–433 at locations 634c–634a will be connected to pads 457c–457a on control signal tap 450; exposed locations 643 and 644 of power conductors 410 and 420 will be connected to pads 443 and 444, respectively, on power tap 440; exposed locations 610a, 610b and 610c of power conductor 410 will be connected to pads 463a, 463c and 463e, respectively, on module taps 470, 460a and 460b; exposed locations 620a, 620b and 620c of power conductor 420 will be connected to pads 463b, 463d and 463f, respectively, on module taps 470, 460a and 460b; exposed locations 665a, 665b and 665c of control lines 433, 432 and 431, respectively, will be connected to pads 465a, 465b and 465c, respectively, on module taps 470, 460a and 460b.

Figure 17:
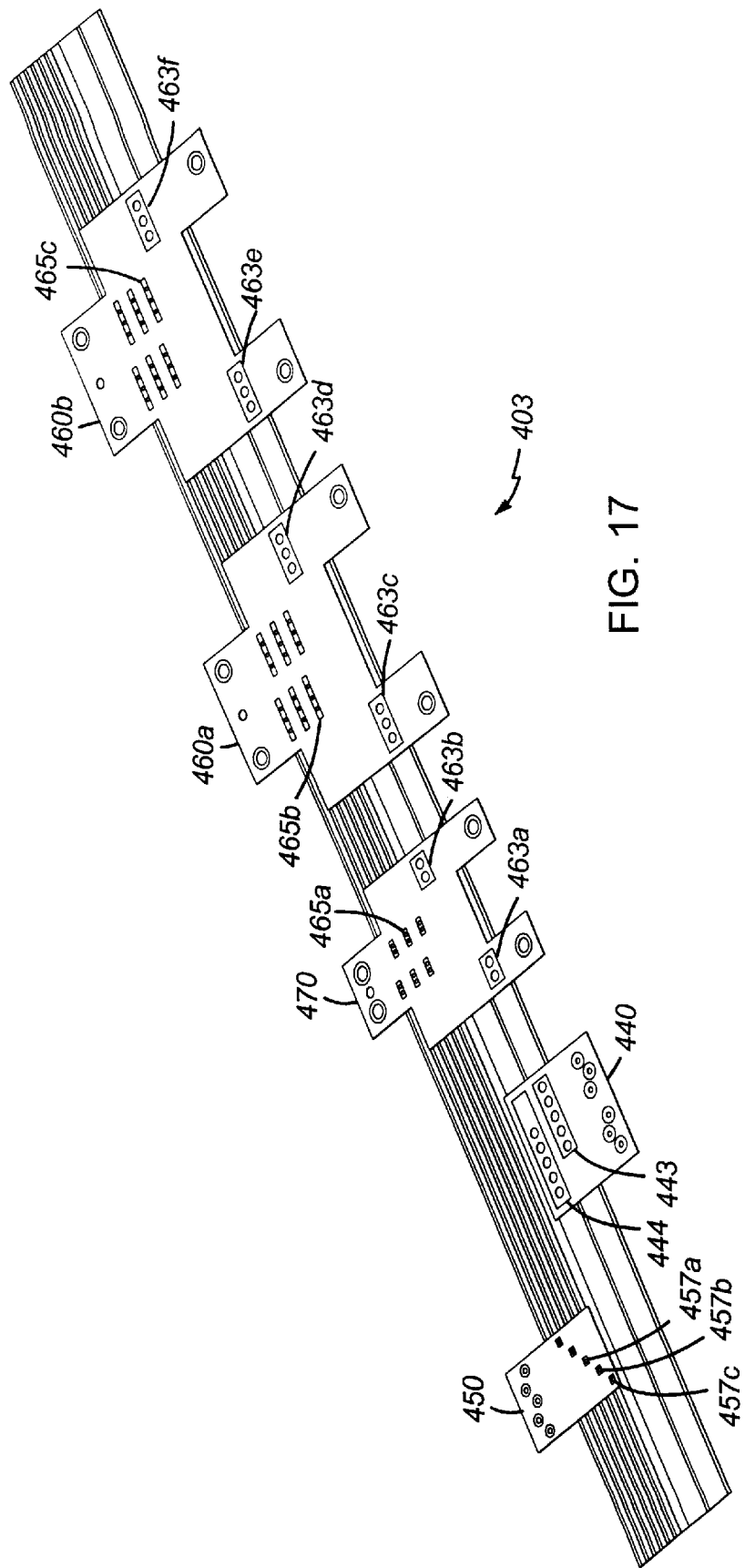
FIG. 17 shows another step in the assembly of the cable of FIG. 9.

After the insulation is removed, the cable is delivered to a workstation 508, (FIG. 15) for connection of the taps to the cable. Information regarding the tap type and location is provided to the tap placement work station 508. A supply of all types of power, control and module taps 509 is available at the workstation 508. Prior to placement of the taps, an adhesive may be added to the areas of the cable surrounding the exposed areas. Solder paste is added to the exposed areas of the tap that are to connect to the cable. An adhesive may also be added to the areas on the tap surrounding the exposed pads. The tap is then soldered to the cable, resulting in the assembly shown in FIG. 17. Exposed areas on the taps (e.g., exposed areas 443, 444, 457, 465, 463) are covered with insulating tape (not shown) to electrically insulate the exposed areas.

Figure 18:
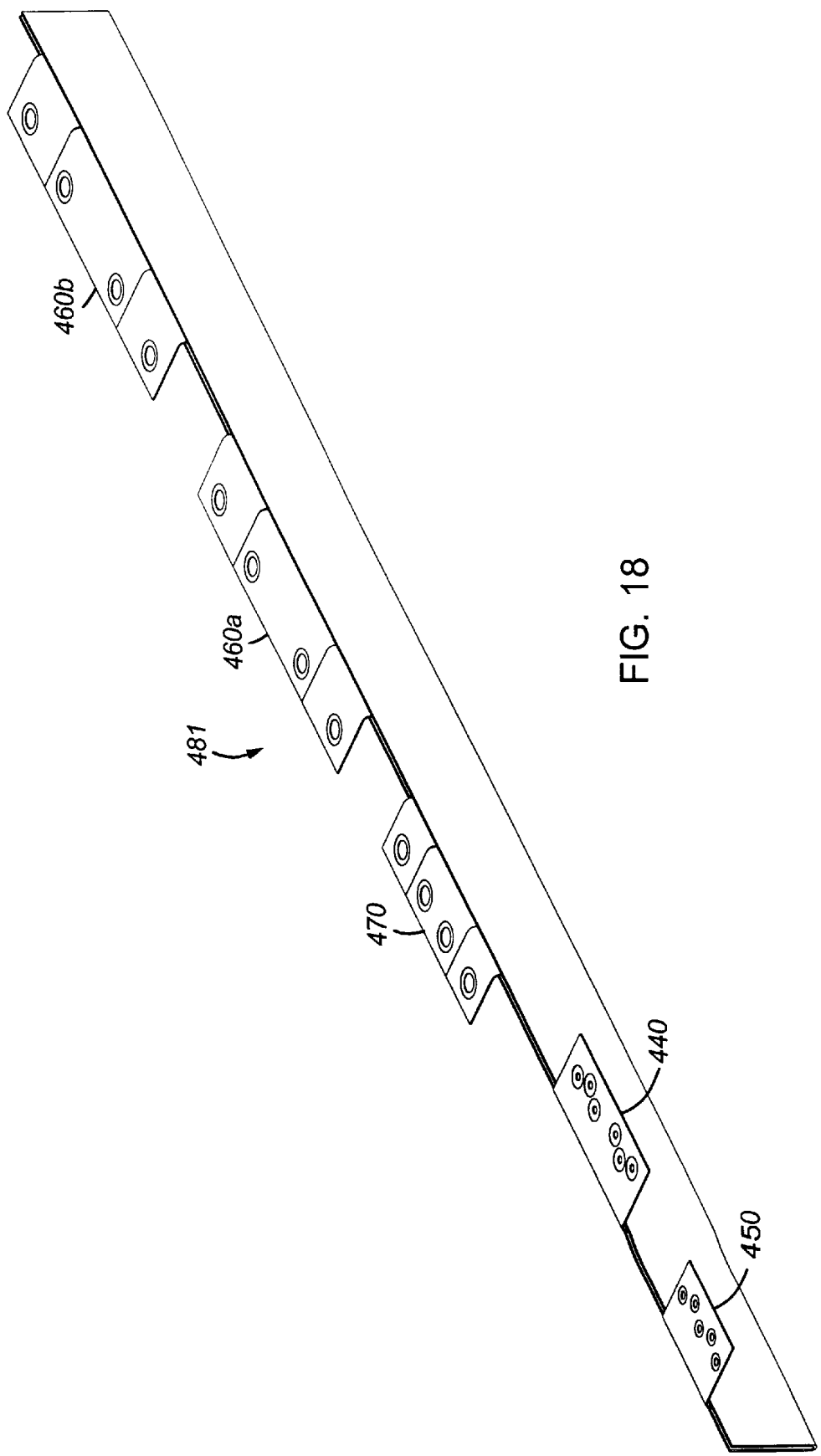
FIG. 18 shows another step in the assembly of the cable of FIG. 9.

After the taps are connected to the cable and insulated, the cable assembly 403 is delivered to workstation 510, at which the cable is folded along its length (at the reference dimple 405) and the front-end power and control signal taps are folded at 90 degree angles to the cable as shown in FIG. 18. Cable specifications are also provided to the folding station 510 to provide the locations of the bends in the cable, e.g., bends 437, 438 (FIG. 9). The resulting snake cable 480 (FIG. 9) allows for connection to a standard front-end PCB 70 while maintaining the cable conductors in a flat, vertical, orientation suitable for snaking within a very narrow channel. The cable 480 forms a low profile bus tape that may be "snaked" around and between converter modules, thereby increasing packaging density by saving space which would otherwise be required for routing bundles of interconnection wires.

Referring again to FIG. 10A, power conductors 410 and 420 carry the DC output of the front-end to the DC input of the DC-DC converter modules. Five control conductors, 431 through 435, connect to the MCU at the front-end PCB 70. As discussed above in connection with FIG. 12, five of the control lines are used to enable and disable one or more outputs. The sixth line 436 is used to combine adjacent converter modules into one or more power-sharing arrays (as discussed more fully below). Alternatively, one or more of the control lines could be used to carry serially transmitted data to a control assembly located within or adjacent to the DC-DC converters.

Figure 25:
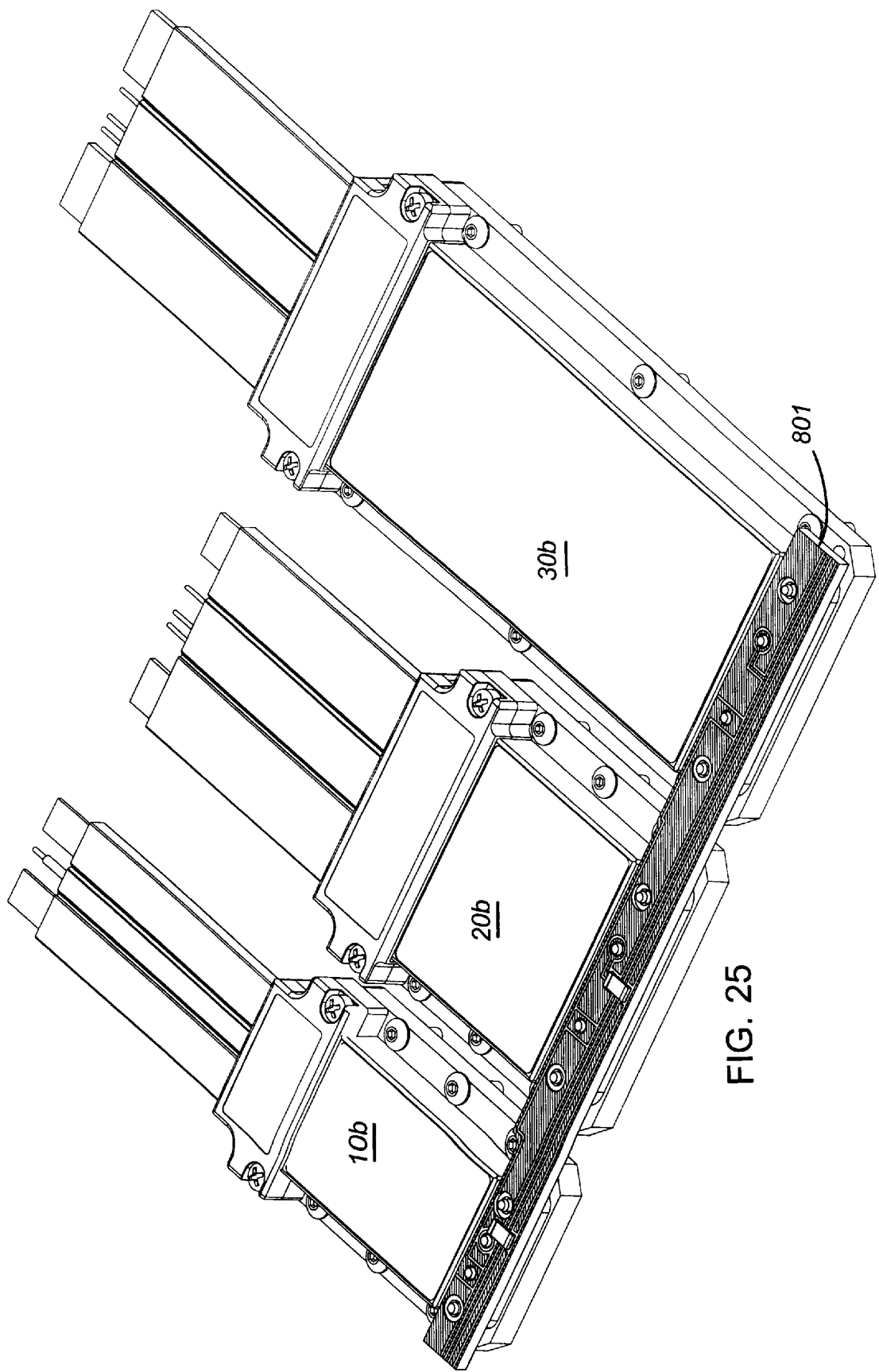
FIG. 25 shows a portion of a power supply assembly with a section of a snake circuit board interconnect.

An alternative to the snake cable 480, discussed above, employs a narrow multilayer circuit assembly to carry power and control signals between the front-end assembly and the converter modules. One such assembly, comprising a mulitlayer circuit board assembly 801, and called a "snake circuit board" is shown in FIG. 25. The snake circuit board is particularly well suited for DC-input power supplies in which high input currents dictate heavier conductors between the front-end assembly and the converter modules. Preferably, the snake circuit board is made sufficiently narrow to fit the width of the step 850, (in FIG. 28A). By placing the snake circuit board in the stepped region 850, the snake circuit board does not add to the overall height dimension of the converters. The input terminals of the converter modules pass through holes in the snake circuit board 801 to make contact with their respective conductors.

Figure 29:
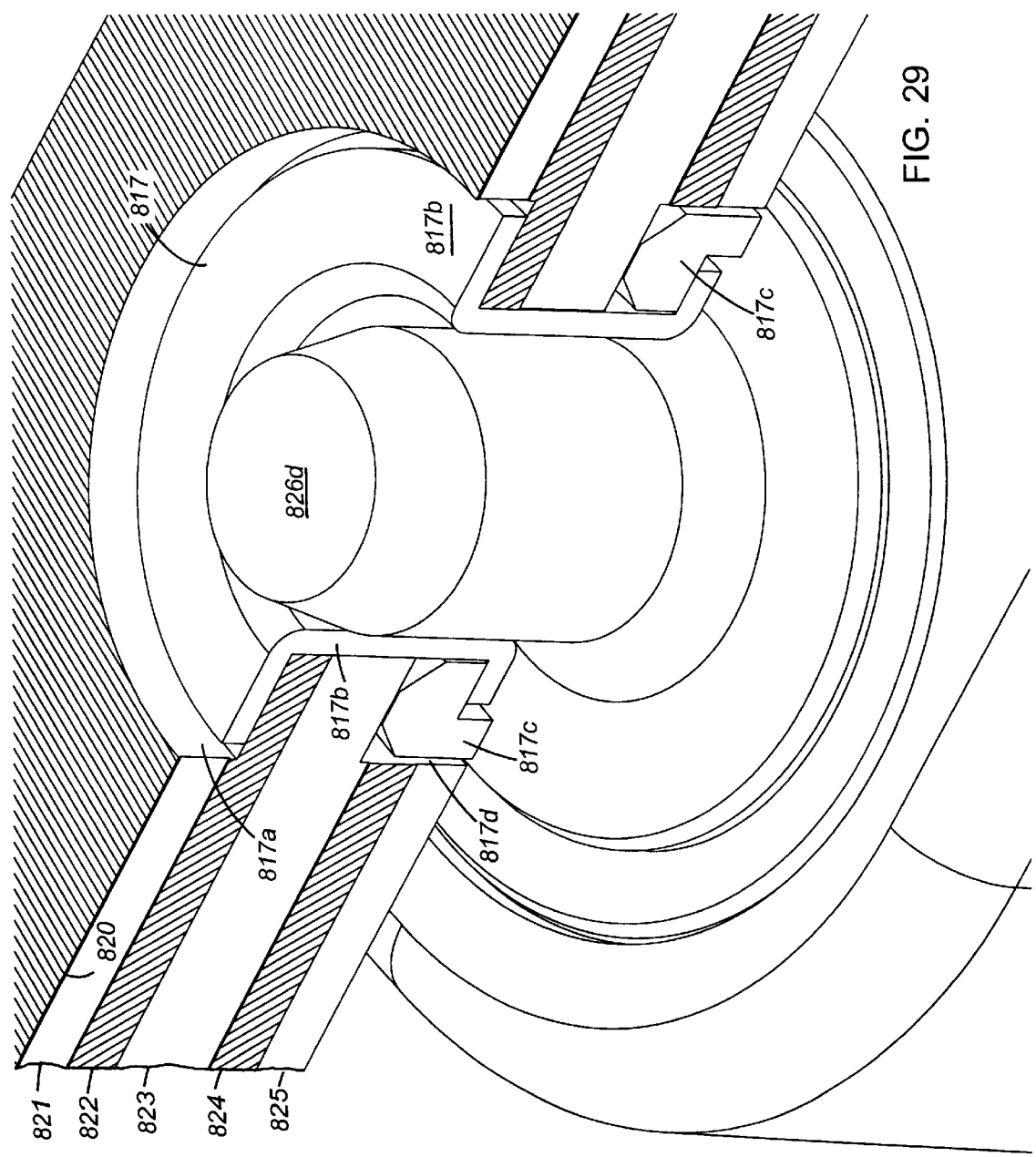
FIG. 29 is an expanded cross-section of a connection to the V− power conductor on the snake circuit board.

Referring to FIG. 29, the snake circuit board is constructed of six layers. Starting from the top the layers are: top thin conductive layer 820, insulating layer 821, heavy conductive layer 822, insulating layer 823, heavy conductive layer 824, and bottom insulating layer 825. Conductive layers 822 and 824 may be, for example, constructed of 0.016 inch thick copper to provide the high current carrying capacity required of the power conductors. The positive and negative outputs of the front-end are connected to conductors 824 and 822, respectively, to carry the power to the inputs of the DC-DC converter modules. The insulating layers may be fabricated from typical printed circuit board materials. For example, layers 821 and 825 may be 0.015 inch thick FR4 insulating material. Similarly, layer 823 may be 0.032 inch thick FR4 material. The top conductive layer 820 which only carries low current signals may be made from 0.0012 inch thick copper.

Figure 26:
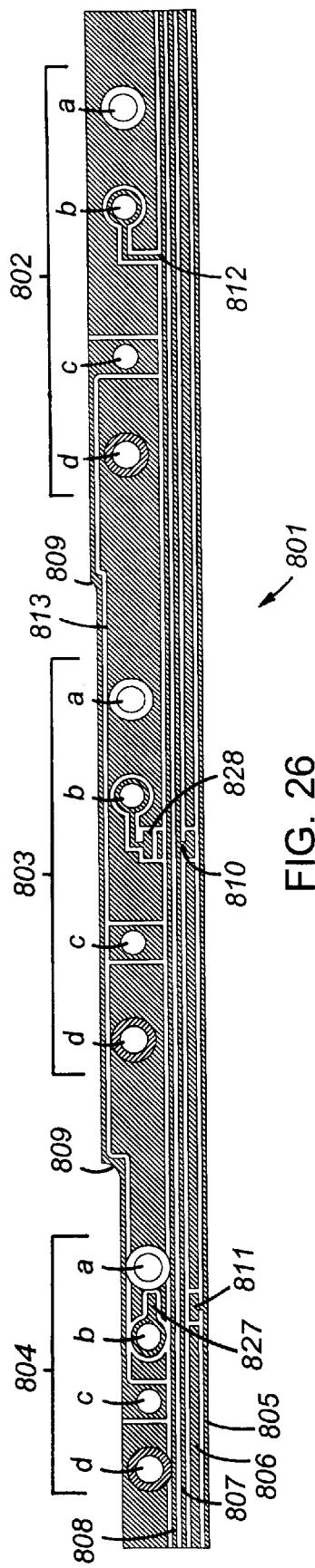
FIG. 26 is a top view of a section of a snake circuit board.

Referring to FIG. 26, the arrangement of the signal conductors in the top conductive layer 820 of snake circuit board 801 will be described. Three (vs. five in the snake cable example above) control conductors, 805, 807, and 808 are connected to the MCU on the front-end PCB 70 and run the length of the snake circuit board 801. As discussed above, these control lines are used to enable and disable one or more outputs. Each converter module may be connected to any one of the three control conductors as determined by its power-up/down sequencing.

Figure 27:
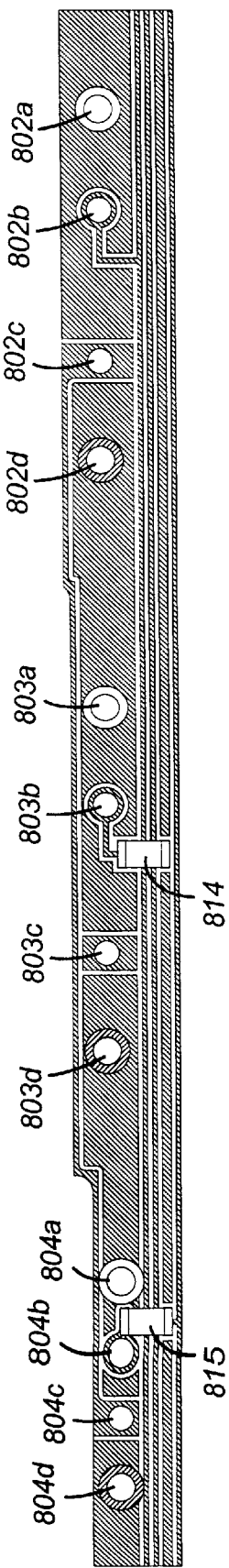
FIG. 27 is a top view of the snake circuit board with jumpers installed.

In FIG. 26, the snake circuit board 801 is configured to have converter modules 30b, 20b, 10b (FIG. 25) connected to conductors 808, 807, 805 respectively. Hole 802b is shown connected directly to the third conductor 808 by conductive run 812. A portion 806 of the top conductor layer 820 is reserved for use in forming "jumper landing areas" to provide access to either the first or second control conductors. Two jumper landing areas 810, 811 are shown formed from this reserved portion 806 of the top layer. Jumper landings 810 and 811 are shown connected respectively to second conductor 807 and first conductor 805. Another portion of the top conductive layer 820, adjacent to the holes for the PC terminals (b) of the converter modules, is also reserved for providing jumper landings. Jumper landings 827 and 828 are shown in FIG. 26 connected respectively to holes 804b and 803b. Conductive (e.g. low value resistor) jumpers 814 and 815 are shown installed in FIG. 27. The jumpers 814 and 815 may be soldered to the jumper landings. As illustrated, jumpers 814, 815 respectively connect jumper landing areas 810, 811 to jumper areas 828, 827 thus respectively providing connection between terminals 803b, 804b and control conductors 807, 805.

Alternatively, jumpers may be formed by applying an insulating material over the conductive layer 820 between the two jumper landings. The insulation may be applied for example by pad printing an epoxy and subsequently curing the epoxy. Alternatively, solder mask material (such as used in the manufacture of PCBs) may be used in place of the epoxy. After the insulation is applied, a conductive trace between the jumper landings may also be applied, for example by pad printing.

A portion of the top conductive layer 820 about 0.040 inches wide, is reserved for providing a fourth conductor 809 to connect converter modules into one or more power-sharing arrays (as discussed more fully below). This portion of the top layer is located at the edge of the snake circuit board closest to the converter modules. Referring to FIGS. 25 and 26, the fourth control conductor 809 is shown running along the edge of the snake circuit board. The fourth conductor may be 0.020 inches wide and be separated from the remainder of the top conductive layer using a 0.020 inch channel. The fourth conductor only connects converters which form a power sharing array. As shown in FIG. 26, the fourth conductor 809 connects the PR pins (c) of modules 30b and 10b together in a power sharing array. Holes 804c and 802c which mate with the PR converter pins (c) of converter modules 10b and 30b, respectively, are connected by conductor 809. In the event a converter is not part of an array, its PR pin is electrically isolated. Notice that conductor 809 does not connect to the PR pin 803c of module 20b.

Figure 28:
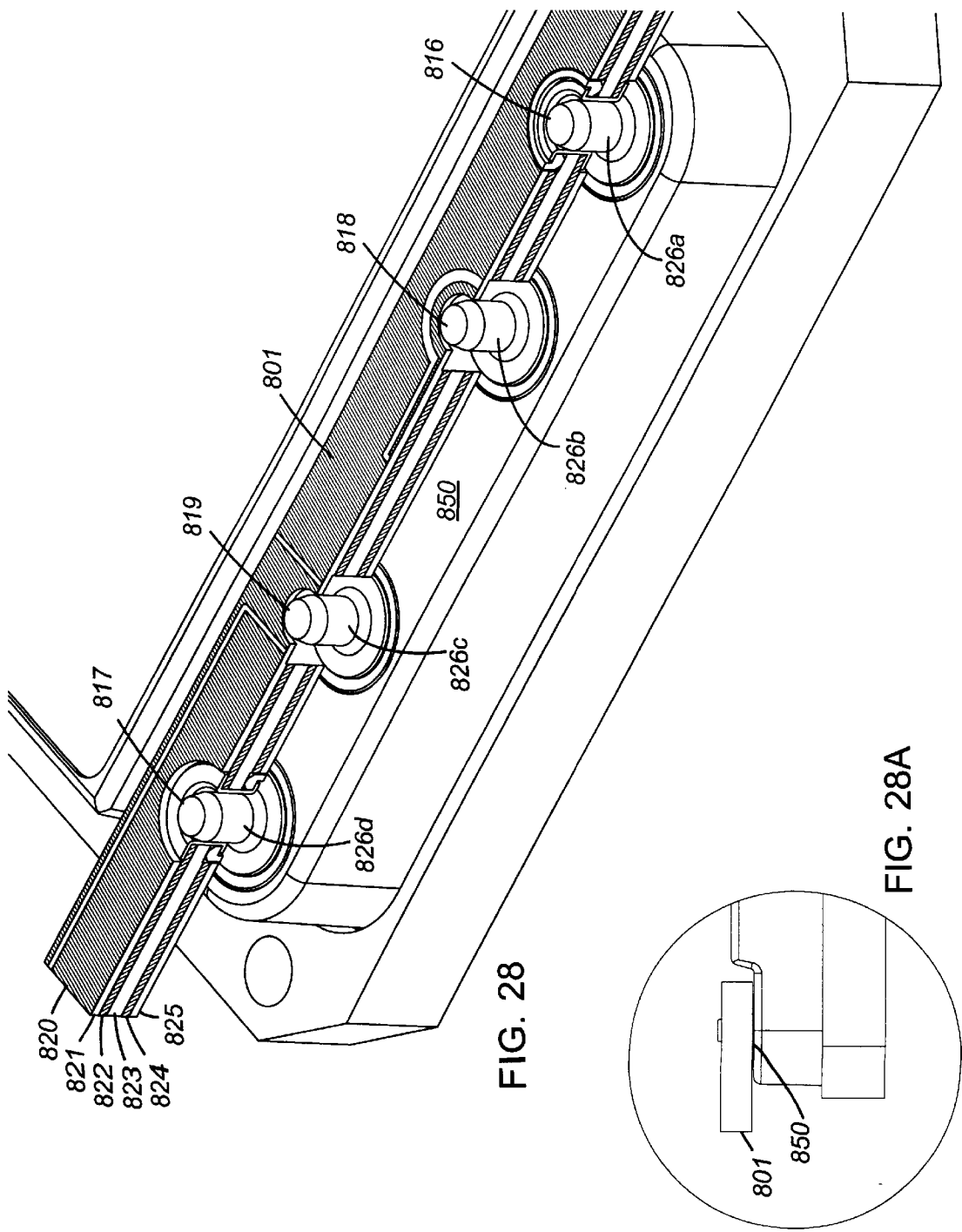
FIG. 28 is a cross-sectional perspective view of a snake circuit board and a converter module.
Figure 33A:
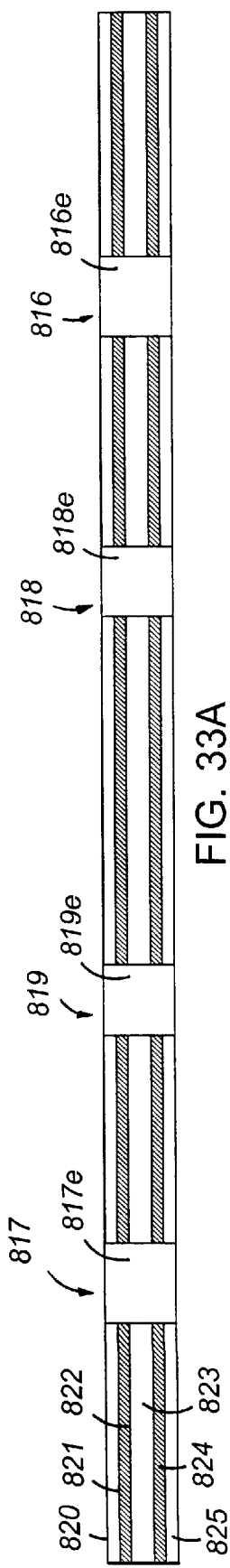
FIGS. 33A, 33B, and 33C are cross-sectional drawings of a portion of a snake circuit board.
Figure 33B:
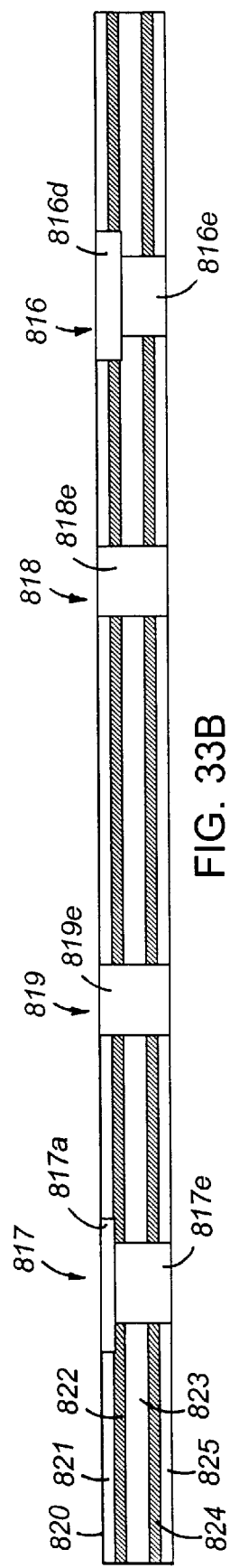
Figure 33C:
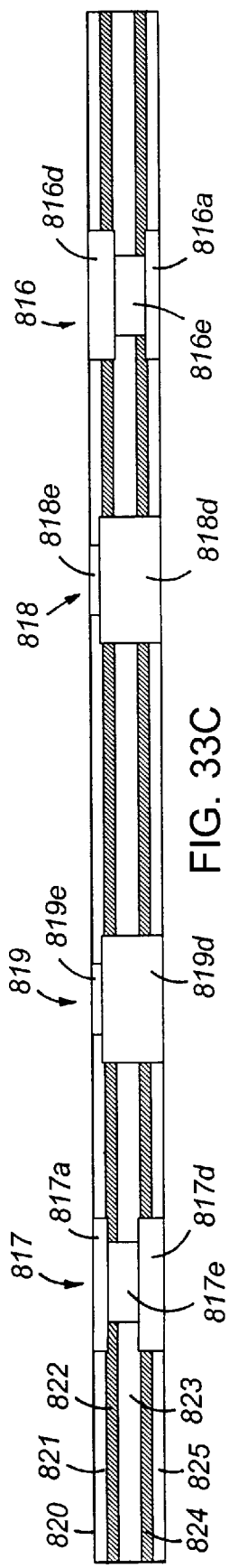

Referring to FIGS. 26, 28, and 33A–33C the control signal connections are made between the top conductive layer 820 and the control terminals b,c of the converter modules. In order to provide adequate isolation clearance between the signal pins and the power source, clearance holes 818d, 819d are made in layers 822–825 (FIG. 33C). As shown in FIG. 28, the portions 819c, 818c of holes 819, 818 in top conductive layer 820 (FIG. 33A) and insulating layer 821 are made to fit the control terminals of the converter modules, e.g. terminals 826c and 826b. The portion 818d, 819d of the holes 819, 818 in layers 822–825 (FIG. 33C) is made larger providing clearance between the conductive layers 822 and 824 and the control terminals (FIG. 33C). Additionally, an insulating spacer ring may be placed in holes 819, 818 to insulate the control terminals from layers 822 and 824. The control terminals may be soldered to the top conductive layer 820. Alternatively, electrical connecting sockets may be installed in holes 818 and 819 to provide a solderless connection.

Figure 30:
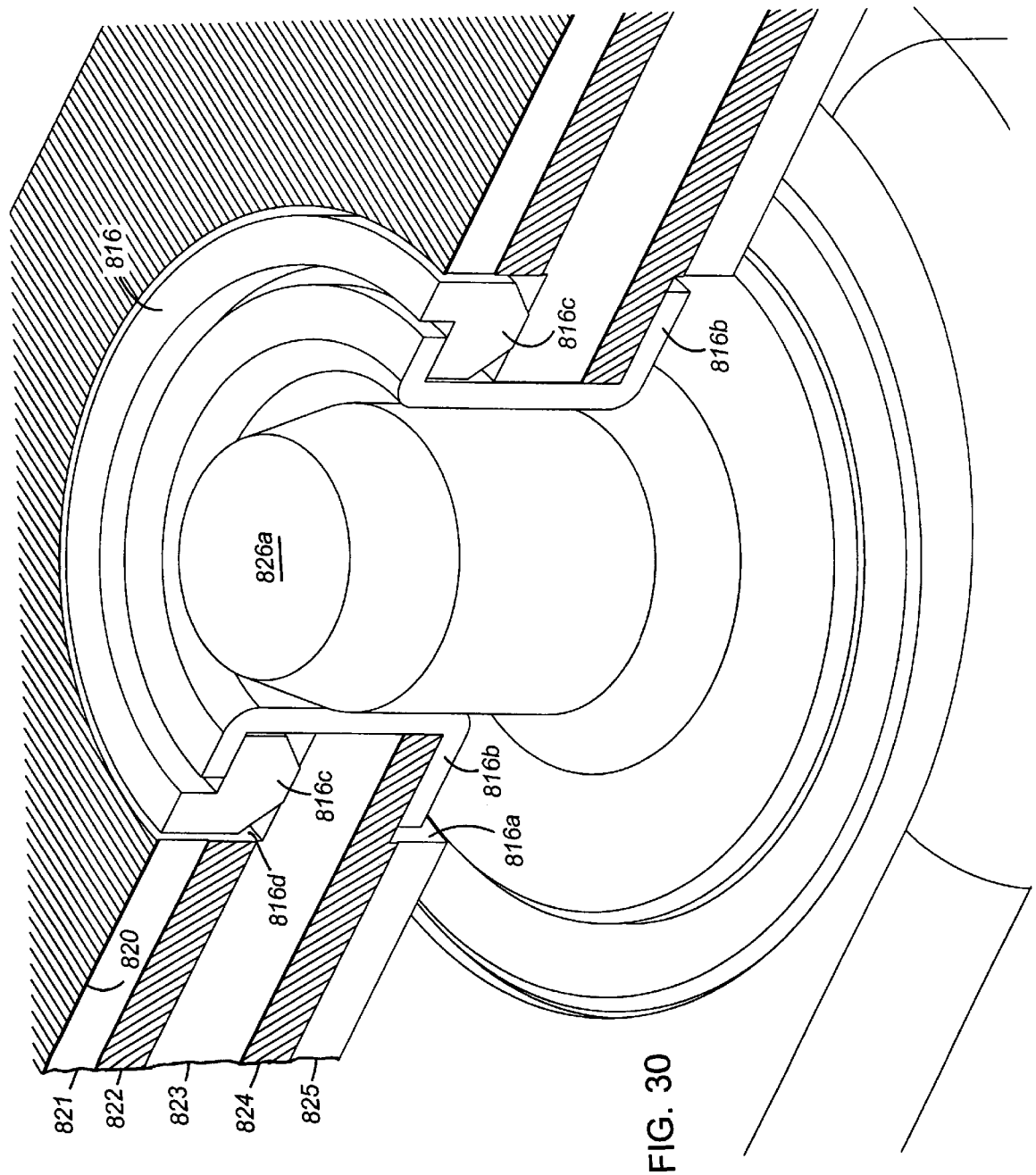
FIG. 30 is an expanded cross-section of a connection to the V+ power conductor on the snake circuit board.
Figure 34A:
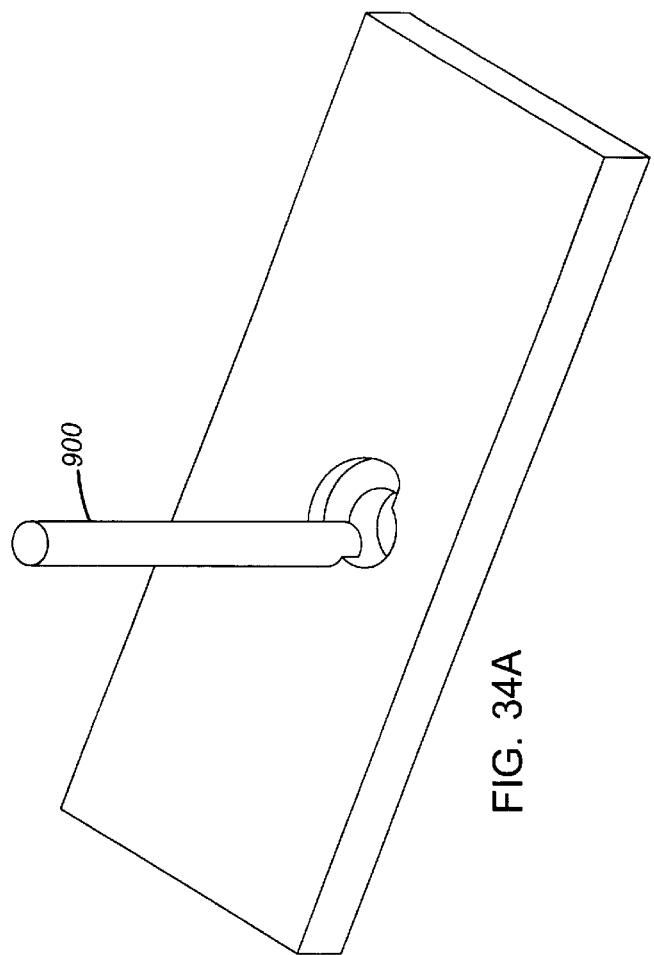
FIGS. 34A and 34B perspective and top views of a milling bit routing a connection hole in a snake circuit board.
Figure 34B:
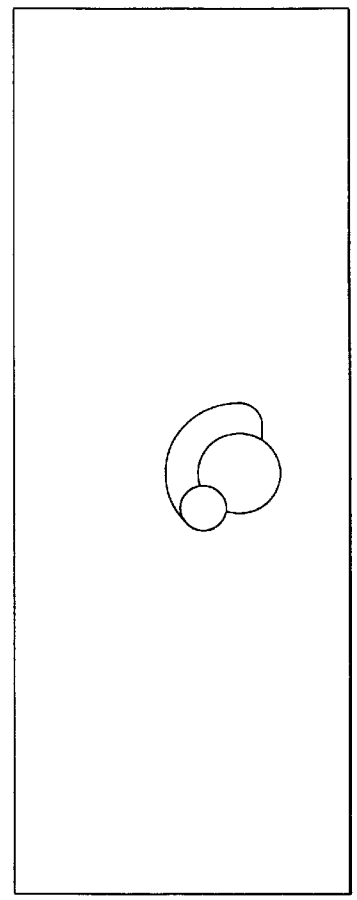

Referring to FIGS. 28, 30, and 33A–33C the power connection between the positive power supply layer 824 and the positive input terminal 826a will be described. A connection hole 816 includes a conductive eyelet 816b and insulating sleeve 816c. Referring to FIGS. 34A and 34B, the hole is made by first drilling a pilot hole of approximately one half the finished hole diameter. Then as shown in FIGS. 34A and 34B, another bit, for example a milling bit 900, is used to route around the hole to finish the hole 816e (FIG. 33A). The routing is performed to remove the conductive material without having any fragments forming shorts between the layers. The hole at 816d is routed to a larger diameter in layers 820–822 (FIG. 33B) to provide for clearance for the insulating sleeve 816c (FIG. 30) and at 816a in layer 825 (FIG. 33C) to countersink the eyelet 816b (FIG. 30). After the eyelet and insulator are inserted into the hole, the eyelet 816b is clinched over to secure it and the insulator 816c in the hole. The eyelet may be solder plated so that a solder joint is formed between the eyelet and the conductive layer 824 when the converter terminal pin is later soldered to the eyelet. As illustrated by the completed hole assembly of FIG. 30, the eyelet makes electrical contact with conductive layer 824 and is insulated from conductive layers 820 and 822.

Referring to FIG. 29 and FIGS. 33A–33C, the hole 817 for making contact to the negative power supply layer 822 is shown enlarged. The process for forming hole 817 is virtually the same as for hole 816 described above. However, the larger diameter portions 817a and 817d of the hole are made respectively in layers 820–821 and 824–825 (FIGS. 33B, 33C) and the insulating sleeve 817c is placed in the bottom portion 817d of the hole (FIG. 29). Insulating layers 821 and 825 and conductive layers 822 and 824 may be made of the same thickness to allow a standard size eyelet and insulating spacer to be used for both holes 816 and 817.

The snake circuit boards may be fabricated completely from PCB stock using automated machining equipment. The desired snake circuit board shape and size is cut from the stock and the conductive traces are formed in the top conductive layer 820 by cutting channels through the top conductive layer. For example a 0.020 diameter milling bit may be used to separate the traces. Channel 813 separates the fourth conductor 809 from the remainder of the top conductive layer 820 as shown in FIG. 26. Any necessary connection holes may also be machined for example, by routing holes from the top side and then the bottom side. In this way custom snake circuit boards may be fabricated on a lot-of-one basis in a very short time. For volume production, the snake circuit board may be fabricated using customary printed circuit board processing techniques.

Figure 31:
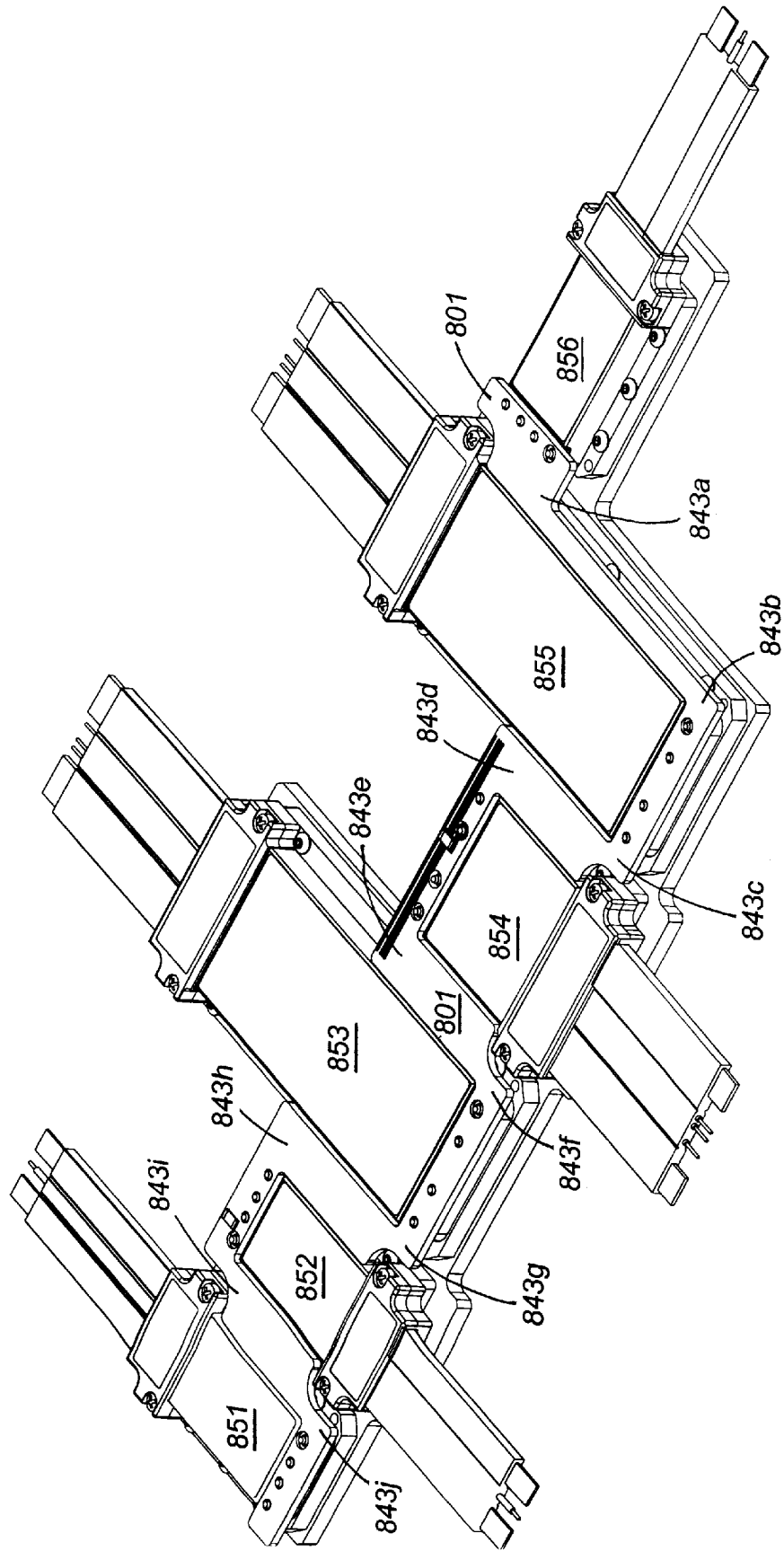
FIG. 31 shows a portion of a power supply assembly with a section of a snake circuit board interconnect.

The snake circuit board may be connected to the front-end board using jumper wires or taps similar to those described for use with the snake cable. As shown in FIG. 31, turns 843A–J in the snake circuit board allow the snake circuit board to make point-to-point wiring going around and between converter modules while being cut from a single piece of PCB stock. Alternatively, several straight snake circuit board sections may be interconnected using flexible taps or jumper wires.

Alternatively, a hybrid of the snake cable and the snake circuit board may be used to provide, for example, the current carrying capacity of the snake circuit board and a greater number of control lines. One example of a hybrid shown in FIGS. 32A–32C omits the top control signal layer 820 of the snake circuit board and omits the power conductors 410 and 420 of the snake cable. In this example, power from the front-end is distributed by the snake circuit board 833 and the PC (power-up/down sequencing) and PR (power sharing array) control signals are carried by the snake cable 832.

Figure 32A:
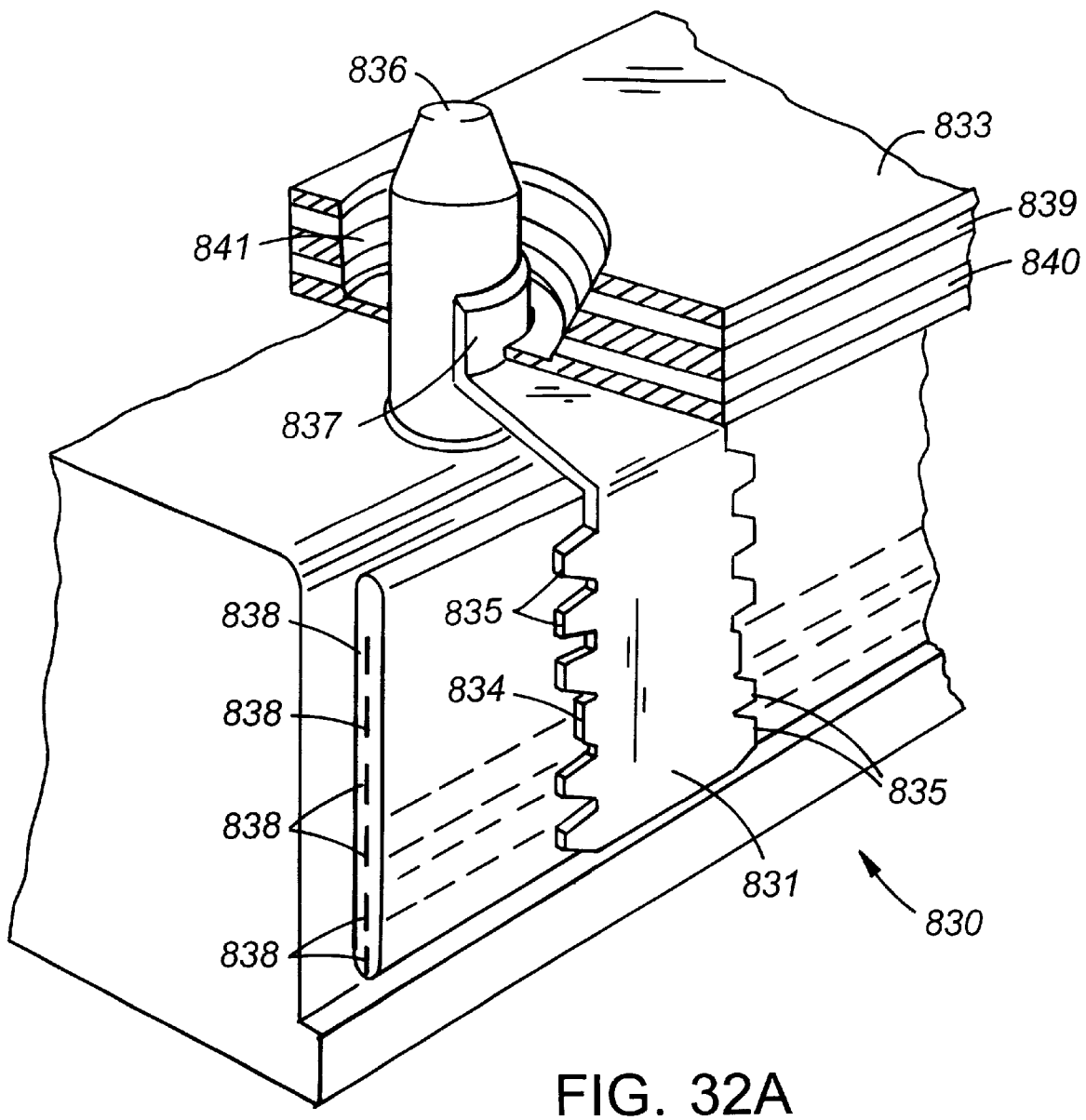
FIGS. 32A, 32B, and 32C are a perspective, side, and top view of a hybrid snake cable and circuit board interconnection system with a converter module.
Figure 32C:
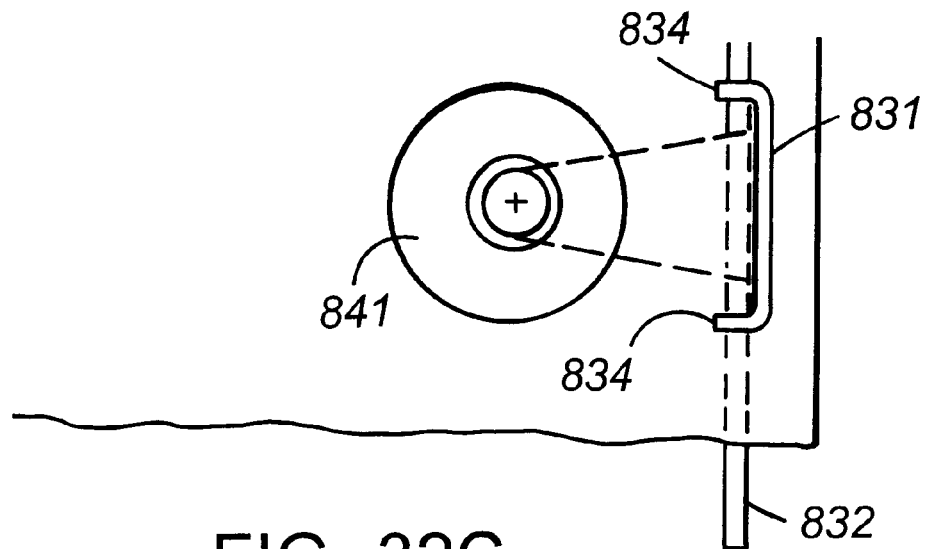
Figure 32B:
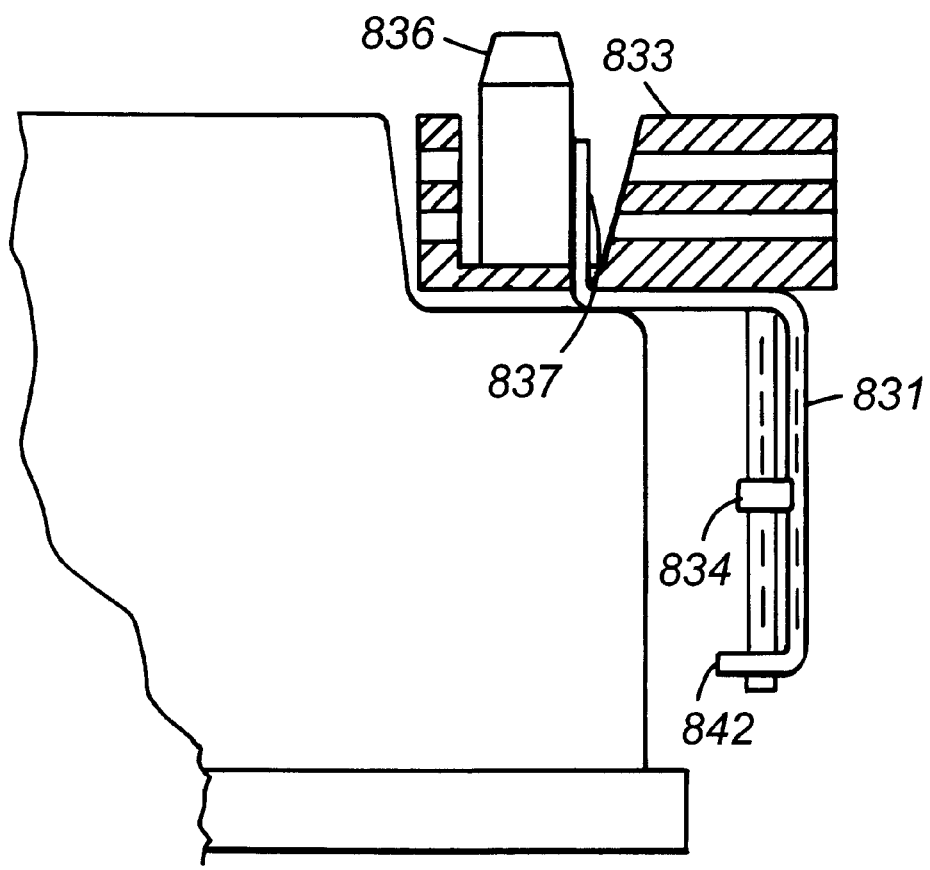

Referring to FIG. 32, the snake cable 832 has six control conductors 838 as described above in connection with the snake cable 400 of FIG. 10A. The signal connections may be made to the snake using an L-shaped staple 831 shown in FIG. 32A. Staple 831 serves the dual purposes of providing electrical connection to the snake cable and also mechanical support for holding the cable in position as shown in FIG. 32A and 32B. The electrical connections are made using one of six pairs of flanges 835 to selectively connect to a respective one of the six conductors 838 in the cable 832. As shown in FIG. 32A, flanges 834, corresponding to the fourth control conductor, are bent toward the cable to form a staple which pierces the insulation and makes contact with the respective conductor. Electrical connection with the control terminal 836 of the converter module is established with a contoured contact 837 as shown in FIGS. 32A and 32B. The pin 836 and contact 837 pass through a hole 841 in the PCB 833 which may form a pressure fitting. The contact may also be soldered to the pin after the cable and PCB are assembled. Alternatively the contoured contact may be formed into a cylindrical sleeve to encircle the pin 836 providing additional mechanical stability to the staple 831 and better electrical contact. Hole 841 is made to have a large diameter in the top four layers (two insulation and two power conductor layers) of the snake circuit board to prevent shorts with the power conductors. The hole has a smaller diameter in the bottom insulation layer to provide mechanical stability to the PCB. An insulating spacer, such as described above, may be placed over the pin and contact to provide additional protection against shorts with the power conductors 839 and 840 in the snake circuit board and additional mechanical support to the snake hybrid assembly. Hole 841 may be made of a uniform diameter to snugly fit the insulating spacer. The staple 831 may be provided with additional flanges for mechanically securing the cable to the staple. For example flange 842 may be provided at the bottom of the staple 831 as shown in FIG. 32B. The additional flanges are arranged to avoid making contact with any of the other conductors in the cable. Staple 831 may be provided with an insulating coating over all areas except those that are required to make electrical contact. The sixth conductor is used to connect adjacent converters into power sharing arrays (as explained below). As an alternative, a tap similar to module taps 460, 470 described above, may be modified (omitting top power conductors 461, 462) to provide the signal connections. The power connections to power conductors 839 and 840 are made in the same way as described above for the snake circuit board.

Alternatively, one or more printed circuit boards may be used to provide the interconnection among the components in the same fashion that the front-end PCB provides the interconnect for the front-end components, or the interconnection may be achieved using a point-to-point wire cable harness between the front-end and each DC-DC converter.

Figure 5:
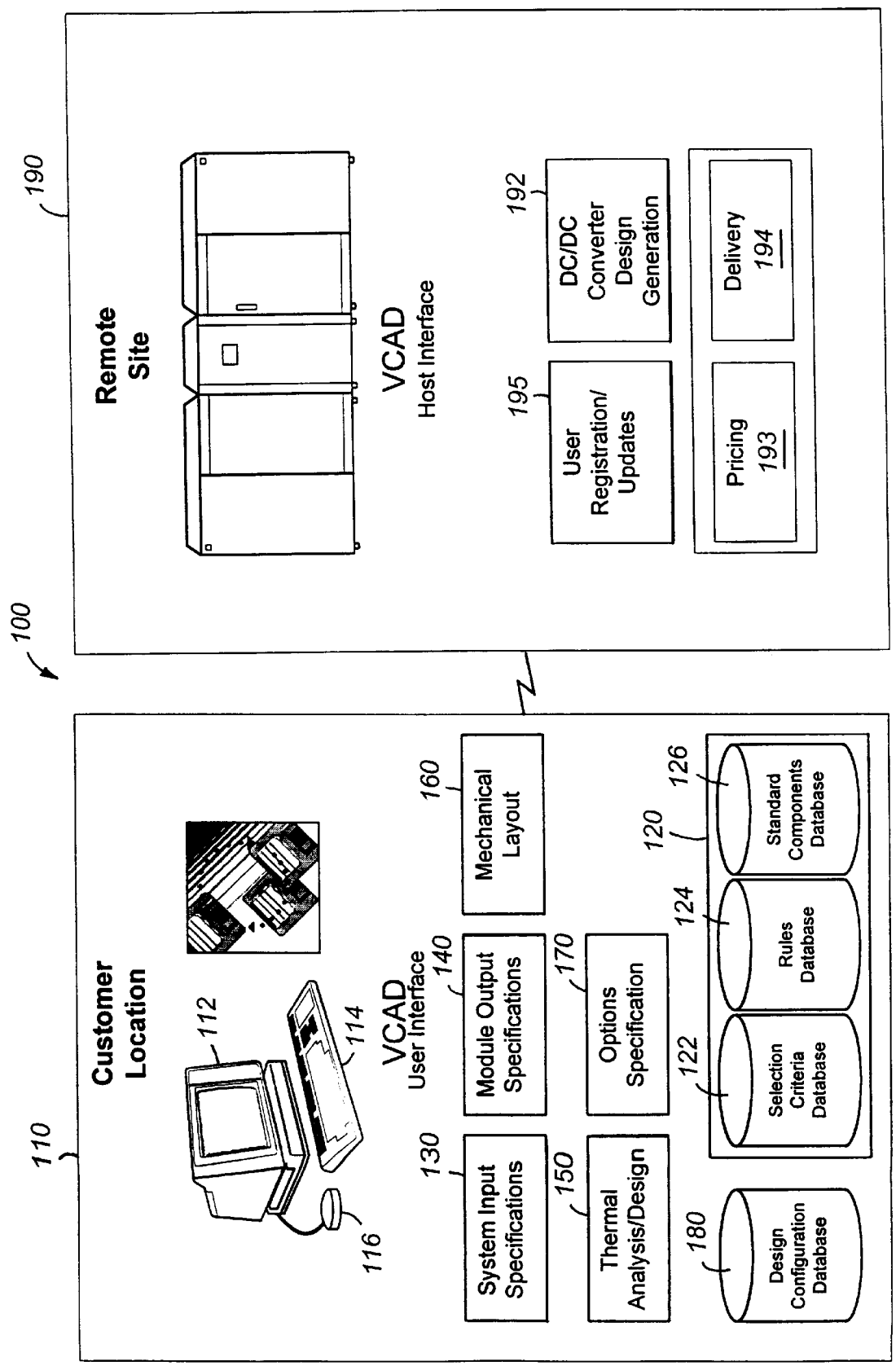
FIG. 5 is a block diagram of a computer aided design system.

FIG. 5 shows a system block diagram of a computer aided design system 100 for configuring power supplies of the kind shown in FIGS. 2 and 9. The system 100 enables users to define and enter functional requirements such as voltage input, voltage outputs, output power levels, thermal environment, and certification requirements for the power system; establish a complement of modular power components such as DC-DC converter modules and front-end components to realize the power system; and define the configuration, shape, and size of the mechanical package for the power system, including the mounting arrangement of the power components on one or more metal mounting plates, as a means of meeting application-specific performance and configuration requirements. The outputs of the design system 100 include mechanical information necessary to machine, or otherwise fabricate, the metal substrate as well as information necessary to create means for connecting the input source to the module input pins and for making connections to converter output pins and other primary and secondary control pins.

The system 100 is used by designers who wish to specify and acquire a high-density power supply which is customized to their unique performance requirements. The user interface 110, which runs on a desktop computer (e.g., a personal computer or a workstation), is intended to be used by design engineers at OEM or customer locations. Referring to FIG. 5, a user interface 110, including a mouse 116, a keyboard 114, and a visual display device 112, such as a color CRT monitor, allows the user to interact with system 100. The system 100 provides a menu bar driven interface for accessing a series of screen displays each of which prompts the user to enter the requisite information.

Familiarity with menu driven computer interfaces is assumed. Generally, a cursor (e.g., cursor 246 in FIG. 7A) on the screen is moved using the mouse 116 or other pointing device. An option highlighted or pointed to by the cursor may be selected for example, by double clicking on the left mouse button. Data may be entered by moving the cursor to the appropriate location or field on the screen display and then typing the information using the keyboard 114 into the field. In some cases such as a multiple output power system, several items (outputs) may be specified. The user may complete a data entry form for an item and add the completed item to a list using the enter key or other appropriate action. In this way, the system may collect the specifications for each item.

An interface to a remote computer 190 which provides remote converter design services such as DC-DC converter design generation 192, pricing information 193, delivery information 194, and user registration and software and specification updates 195 is shown in FIG. 5. The remote computer 190 may be located for example at a power supply manufacturer's facility.

Database 180 stores design configuration specifications generated by the system 100. Three additional databases 120, a selection criteria database 122, a rules database 124, and a standard component specifications database 126, may provide information to the system as described more fully below. Five general processes, the system input specification process 130, the module output specification process 140, the thermal analysis and design process 150, the mechanical layout system 160, and the options specification process 170 are depicted in FIG. 5. Each is a step in the power supply design process and will be described in connection with FIGS. 7A–7H which are representations of the display screens presented to the user on visual display 112 during the data entry process.

Figure 7A:
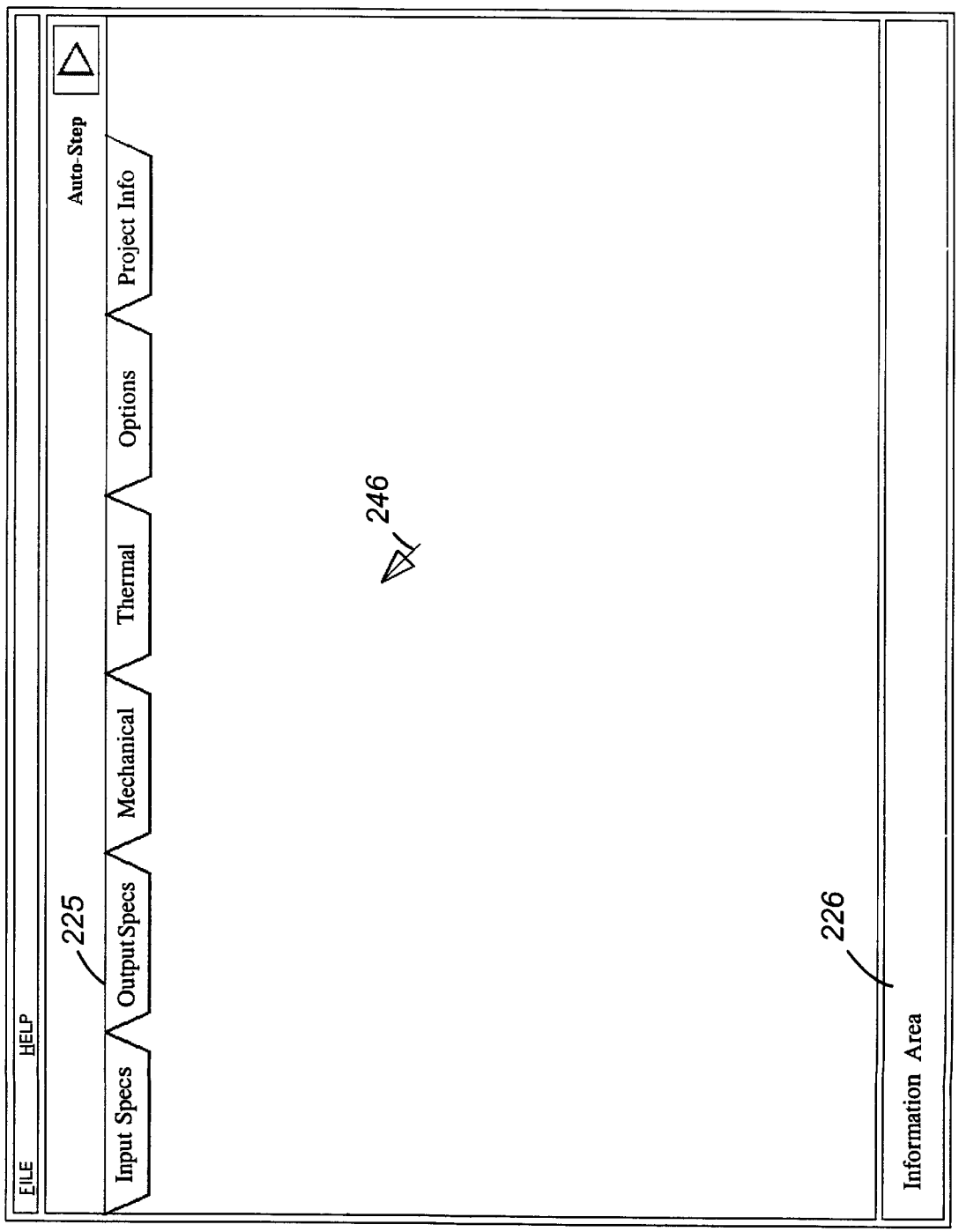
FIGS. 7A through 7H show sample data entry display screens.

The system 100 presents the user with a menu bar 225 as shown in FIG. 7A. The menu bar 225 provides means for accessing a series of data entry forms on the screen display each of which prompts the user to enter certain power system specifications. Specifications entered by the user are stored in the design configuration database 180. Examples of data entry screens which may be presented to the user by selection of the respective "Input Specs," "Output Specs," "Thermal," "Mechanical," "Options," and "Project Info" icons on the specification menu bar 225 are shown in FIGS. 7B through 7H. Each screen prompts the user to enter specifications (discussed more fully below) for the power system 40 being designed which are then collected and stored by the power supply specification system in the design configuration database 180. The menu bar 225 is always available to allow the user to move between screens, however, certain menu options may be shaded differently to indicate they are not available. An information area 226 shown in FIG. 7 may be used by system 100 to provide messages to the user.

The design process using the system 100 will be described with reference to FIG. 8 which is a basic flow chart of the system 100 operation and with reference to FIGS. 7A–7H.

User Registration/Software Updates

Figure 8:
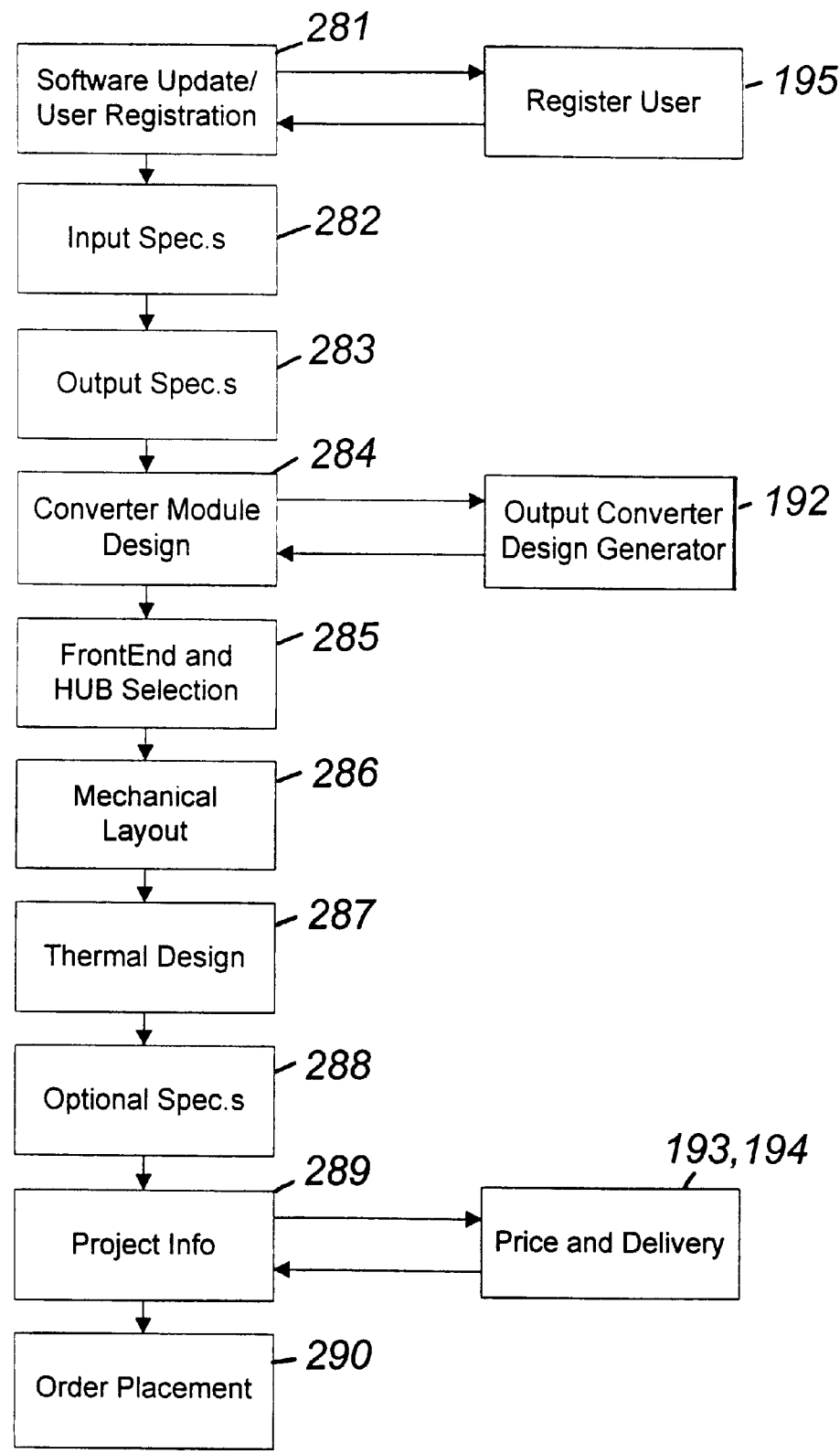
FIG. 8 is a block diagram of a power supply design process.

Referring to process block 281 in FIG. 8, the system 100 will connect to a remote computer 190 (FIG. 5) via a modem or other interface at the beginning of each design session. Upon connecting the registration/updates system 195 is accessed to notify the user if it is necessary to update the software or database using information that has become available since the last installation or update of the user interface 110.

Input Specifications

Figure 7B:
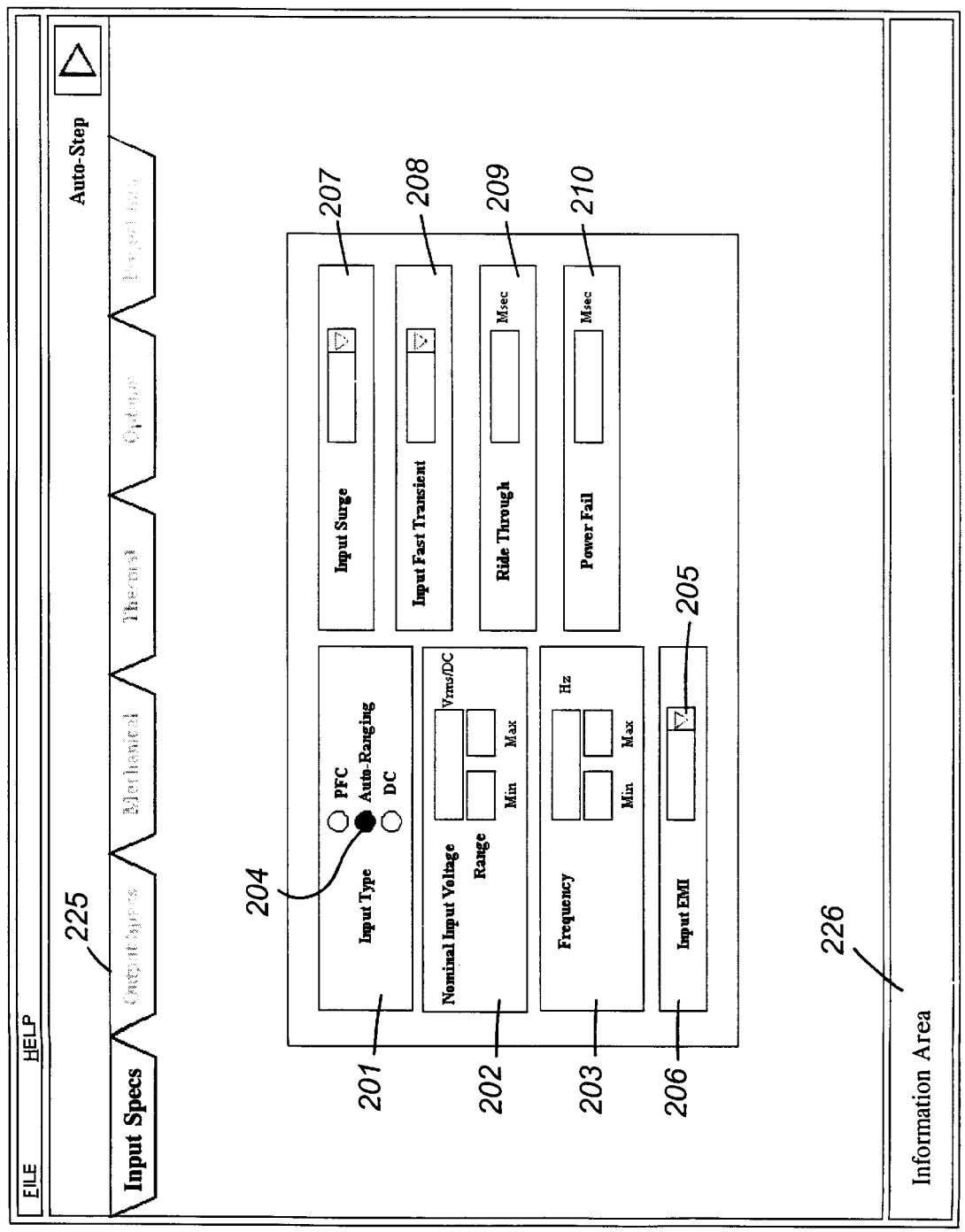

As shown by block 282 in FIG. 8, the power supply design process begins with the user defining the input specifications. The system input specifications 130 (FIG. 5) are collected from the user with a data entry screen as shown in FIG. 7B. The user specifies the input voltage range 202, the frequency of the AC input voltage 203 if applicable, and the EMI filter requirements 206 (e.g. FCC class A). The user may additionally provide the surge 207 and fast transient 208 input requirements and the ride-through 209 and power-fail timing 210 specifications. A power-factor correcting ("PFC") front-end, an auto-ranging rectifier-capacitor input front-end, or a DC input front-end may be selected using field 201. In FIG. 7B, the auto-ranging front-end option is shown selected as indicated by the darkened selection circle 204 in field 201. The system 100 may automatically provide pre-defined default specifications for the user to accept as is or with changes. For example, the system may provide a default input voltage range where only a nominal voltage is entered. A list of available options in entry fields may also be provided such as indicated by the list pull-down arrow 205 in the Input EMI field 206.

The ride-through time (field 209) may be defined as the minimum uninterrupted length of time after the input voltage is removed that the power supply outputs will continue to operate from energy stored in the front-end storage capacitors. The Power Fail entry (field 210) specifies the minimum amount of time after a power fail signal is provided that the power supply outputs will continue to operate within specifications. This information is used by the system 100 to select appropriate capacitors for the HUB 92 (FIGS. 2A, 2B).

Output Specification

Figure 7C:
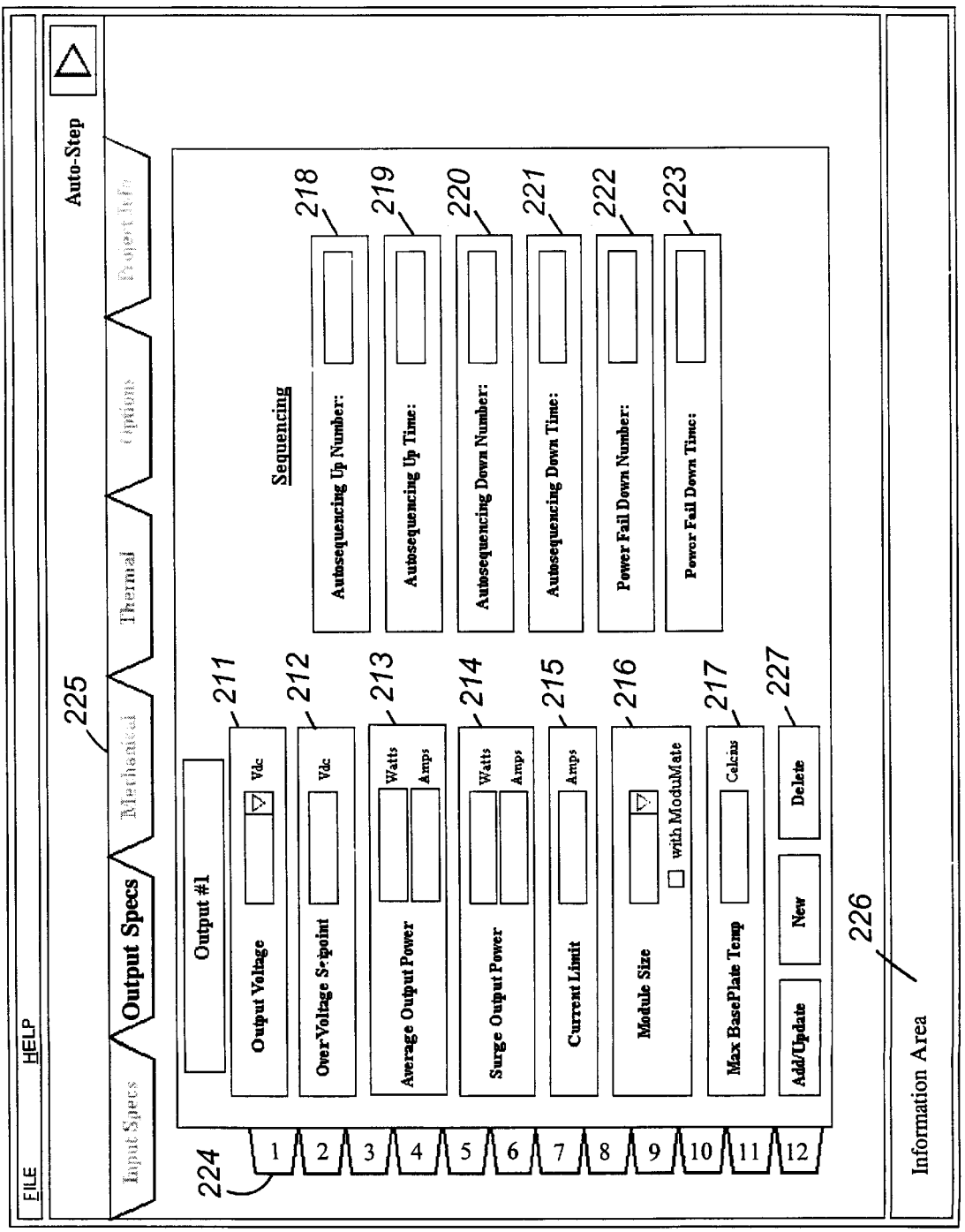

Referring to FIG. 8, the output specifications are collected by the system as shown by block 283 after the input specifications have been defined. The module output specifications 140 (FIG. 5) are collected using an output specifications screen such as shown in FIG. 7C. For each output, the user specifies the DC output voltage 211, the power levels for the output, both average 213 and surge 214, and the over-voltage 212 and current-limit 215 set points as shown in FIG. 7C.

The average power rating (field 213) may be used to define the average power level that the converter must be capable of delivering for periods of time which are long compared to the thermal time constant of the power system. Conversely, the surge power rating (field 214) may be used to define the peak power level that the converter must be capable of delivering for durations of time which are short relative to the thermal time constant of the power system. For example, the average power required by a disk drive system load may be 100 Watts, whereas 250 Watts may be required by the disk drive system during the short periods of time that the drive motors are being started up. The average and surge values of output current may be specified as shown in fields 213 and 214 of FIG. 7C as an alternative to specifying the power values.

The power system 40 being designed may be required to supply several outputs. Therefore, the user may add another output specification, update or delete a previously entered output specification, or request another blank output specification form using the three action buttons 227. As shown, each output is assigned a numbered tab 224 which the user may select with the cursor to review the specifications for the respective output.

The user may also specify the timing and sequencing for each output during power-up, power-down, and power-fail conditions as shown in FIG. 7C. The timing and sequencing information is used to program the MCU. The number fields 218, 220, 222 specify the queue position of the output and the time fields 219, 221, 223 specify the delay.

The system automatically enforces rules which may limit the design options available to the user to aid in ensuring the feasibility of the design. As discussed further below, the rules may be based on many factors, including limitations imposed by the selected manufacturing materials, processes, and equipment. One example of such a rule relates to the maximum number of control lines available in the wiring system selected to build the power supply 40. The number of control lines available in the wiring system may limit the number of stages in the power-up, power-down, and brown-out control sequences. For example, the snake cable system 480 described above has five separate control lines supporting up to five steps in the sequence as compared to three steps for the snake circuit board 801, and eight or more steps in the hybrid snake system. A full printed circuit board or a serial communication option may allow for even more (or an unlimited number of) steps in the sequence.

Field 216 allows the user to choose whether an output connector, such as ModuMate™ connector 90 in FIG. 2A, will be provided to connect to the module output pins. The user may also optionally specify the module size using field 216. The system 100 will then determine how many modules of the specified size are needed to meet the output specification. The maximum baseplate temperature 217 may also be specified. The user leaves the output specification screen after all of the outputs have been specified.

Converter Module Design

Referring to block 284 in FIG. 8, the converter modules are designed after the input and output specifications have been collected. The system 100 may connect to the remote computer 190, for example by modem, to generate the designs for the DC-DC converter modules necessary to meet the user-defined input and output specifications. The input and output specifications stored in the design configuration database 180 shown in FIG. 5 are sent to the DC-DC converter design generation process 192 (FIG. 5) which designs the complement of converters required to build the power system 40, as defined by the user and returns the specifications for the converter modules. For example, specifications returned by the design generation process 192 may include the DC-DC converter package size, conversion efficiency, and module part numbers. The system 100 may connect to the remote computer 190 after all of the outputs are specified in step 283 to obtain all of the converter module designs and specifications in a single step. Alternatively, an iterative procedure may be used in which the remote computer is contacted and the specifications obtained for the DC-DC converter(s) for each output after each output is specified in step 283.

Unless the user has chosen to specify DC-DC converter package sizes, the remote converter designer 192 seeks to minimize the volume occupied by the converter modules and thus selects a complement of package sizes required to implement the power system 40 in the least amount of volume. For example, if the user requires that 12 Volts be delivered at 175 Watts, the selection software and rules database will specify an 800 Series package 20, since this is the smallest package which can provide this amount of power. Where the power required for one output voltage exceeds that which can be delivered from a single module, the remote converter designer 192 will specify the requisite number of module packages which will satisfy the output requirements when operated in a power sharing array. For example, the remote DC-DC converter design generator 192 will specify an array of two 900 Series packages, each capable of delivering up to 600 Watts, to satisfy a 48 Volt 850 Watt output requirement. On the other hand, if only 700 watts is required from the 48 Volt output, then the DC-DC converter design generator 192 would specify an array of three 800 Series packages which can deliver the power (250 Watts per module) in less volume than two, larger, 900 Series packages.

After each output's package size, power and efficiency ratings are determined by the remote converter designer 192, this data is returned to the system 100 and stored in the design configuration database 180. A system 192 for automatically generating DC-DC converter designs which are optimized with respect to selected criteria such as efficiency or cost is described in commonly assigned U.S. patent application Ser. No. 08/631,890, Montminy, et al, entitled "Configuring Power Converters" and incorporated here by reference.

As an alternative to the remote computer 190 generating custom converter designs for each system, a standard component database 126 as shown in FIG. 5 may be provided with specifications of pre-configured DC-DC converter models. The system 100 may then determine whether any "standard" DC-DC converter models are available to satisfy each particular output requirement. The term "standard" is used to refer to converter modules which have been previously designed, for example, to satisfy commonly required output voltages and power levels. For example, a 48 Volt 600 Watt or a 5 Volt 400 watt converter may be available as "pre-configured" models in 900 Series packages 30. If pre-configured units are available, the model numbers and the required quantity of units would then be stored in the design configuration database 180. The system 100 may be set up to use only custom converter designs, only standard designs, or a mix using custom designs only when pre-configured designs are not suitable.

Front-End/HUB Selection

Referring to block 285 of FIG. 8, the front-end circuitry is selected after the complement of DC-DC converter modules required to meet the output requirements are specified. The system 100 uses the module specifications generated by the output converter design generator 192, including the output power and efficiency, and the front-end and EMI specifications from the input specifications system 130 stored in the design configuration database to select the balance of the power components needed to implement the power system 40, i.e., the front-end and the HUB 92. The components suitable for the design are chosen from a selection of pre-configured options stored in the standard components database 126.

In selecting the front-end assembly, the system 100 calculates the maximum power which the front-end assembly must deliver using the specifications of the complement of DC-DC converter modules. The system selects the physically smallest front-end circuit assemblies of the type defined by the user in the input specification section.

Referring to FIG. 5, the system 100 may select from a range of available front-end options stored in the standard components database 126. The database 126 might include for example, four different power-factor-corrected front-end assemblies, as shown in FIGS. 20A through 20D, capable of delivering maximum power levels of 400 (FIGS. 20A and 20B) and 800 (FIGS. 20C and 20D) Watts. The database may also include four different auto-ranging front-end assemblies, as shown in FIGS. 22A through 22D, capable of delivering maximum power levels of 500 (FIGS. 22A and 22B) and 1000 (FIGS. 22C and 22D) Watts.

Figure 22A:
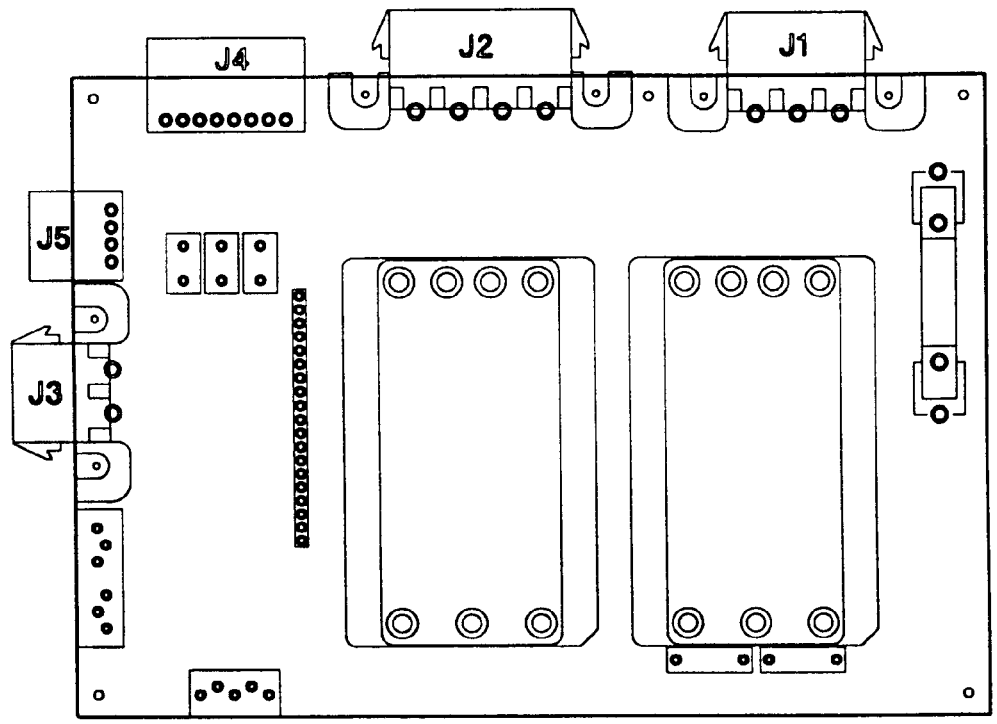
FIGS. 22A through 22D show auto-ranging front-end assemblies.
Figure 22C:
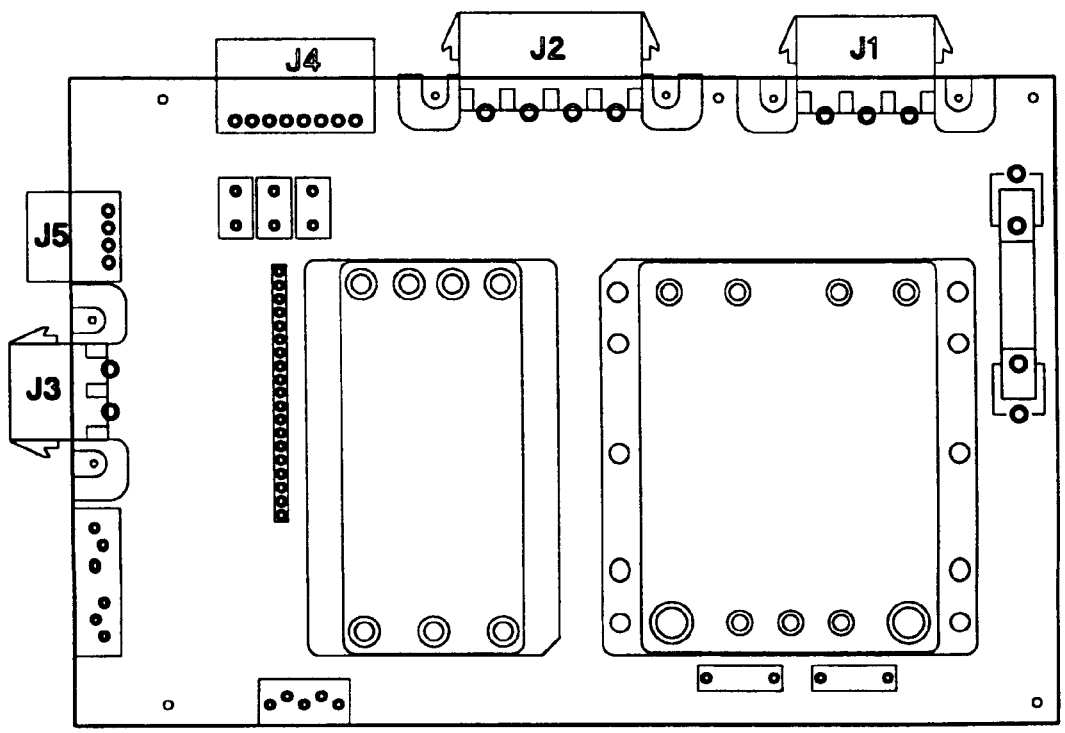
Figure 22B:
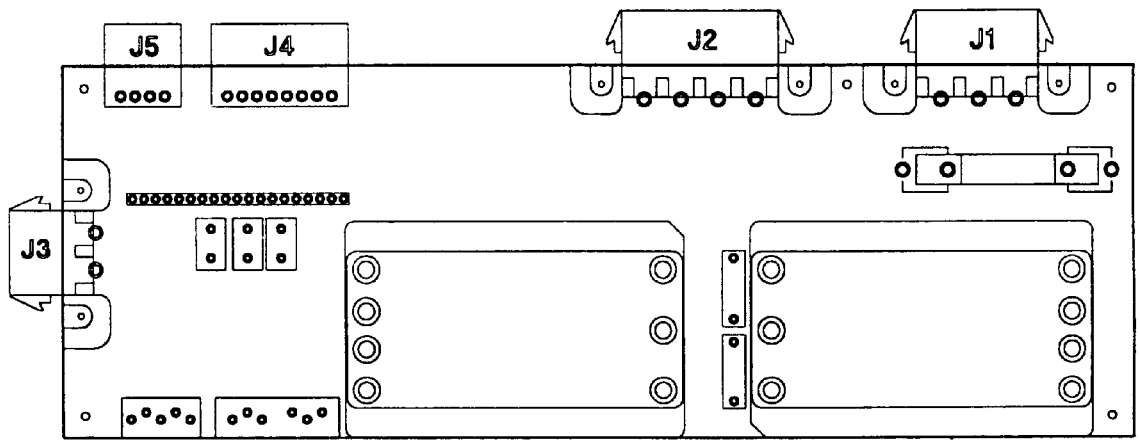
Figure 22D:
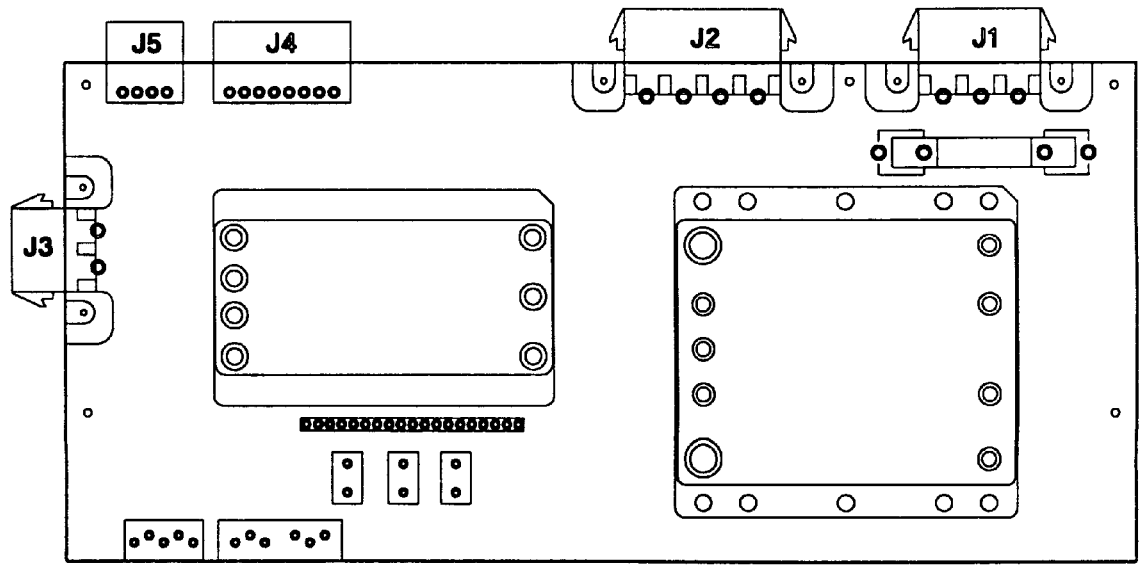

In general there are at least two mechanical configurations for each front-end circuit assembly available. The user can choose between different mechanical designs of the same front-end circuit to suit his packaging requirements. For example, FIGS. 22A and 22B show two different mechanical layouts for the same 500 Watt auto-ranging front-end circuitry. All front-end options suitable for the design are stored in the design configuration database 180 and are available to the user for selection.

The system 100 also chooses the physically smallest HUB 92 (FIG. 2A) which is compatible with the specified front-end type and which can meet the requirement specified by the user. The selection of HUB specifications are stored in the standard components database 126 which might include, for example, four different capacitor assemblies for use with power-factor-corrected front-ends, as shown in FIGS. 21E through 21H, and four different capacitor assemblies for use with auto-ranging front-ends, as shown in FIGS. 21A through 21D.

Alternatively, a custom front-end design service may be provided by the remote computer system 190 in the same manner as with the custom output converter design generator 192 discussed above.

Mechanical

Referring to block 286 in FIG. 8, the user may proceed to the mechanical specification screen after the complement of power components i.e., the converter modules and the front-end, have been designed or selected and the mechanical characteristics of the power components are stored in the design configuration database 180. The mechanical layout system 160 (FIG. 5) is used to design the physical layout, including the location and orientation of the various power components within the power system 40.

Figure 7D:
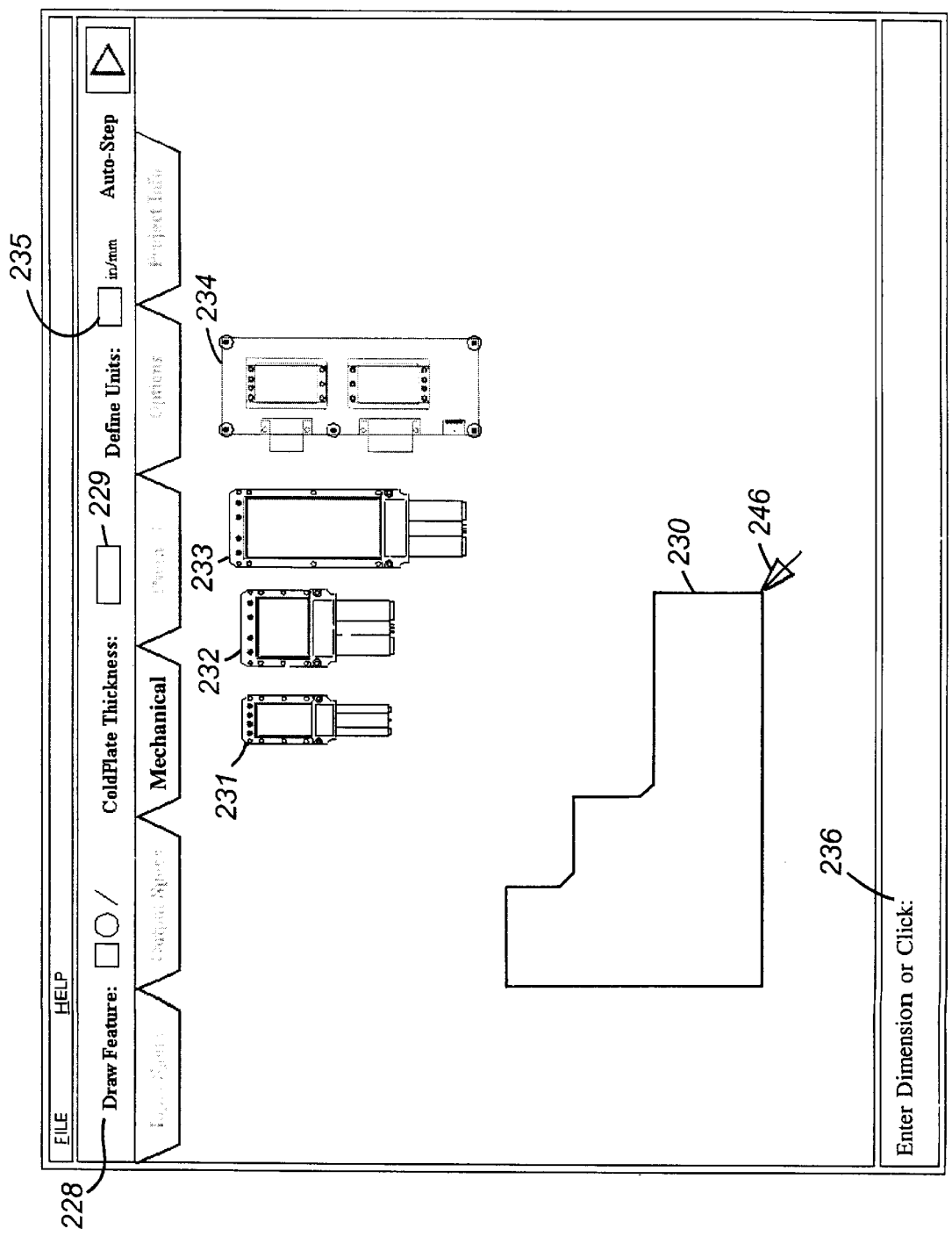

Referring to FIG. 7D, the user is presented with an outline of each of the power components generated by the system 100 using the remote computer 190, including the DC-DC converter modules and the front-end. In FIG. 7D, icons 231, 232, 233, and 234, comprising the outlines of the DC-DC converter modules 10*b*, 20*b*, 30*b*, and the selected front-end assembly respectively, are arranged at the top of the screen. An icon for each of the power components in the complement of components is provided. Since the HUB 92 is mounted separately from the power supply assembly 40, it is not represented on the mechanical layout screen.

Since more than one mechanical configuration for the front-end assembly may be available, the system 100 may allow the user to switch back and forth between the various front-end options available for the design to facilitate optimization of the mechanical design. For example, the system may allow the user to scroll through the available front-end options by clicking on the front-end icon 234. Alternatively, icons for each of the front-end options may be displayed simultaneously with the un-selected options shown as shaded outlines. The user may then switch between the options by selecting the desired configuration.

Figure 7E:
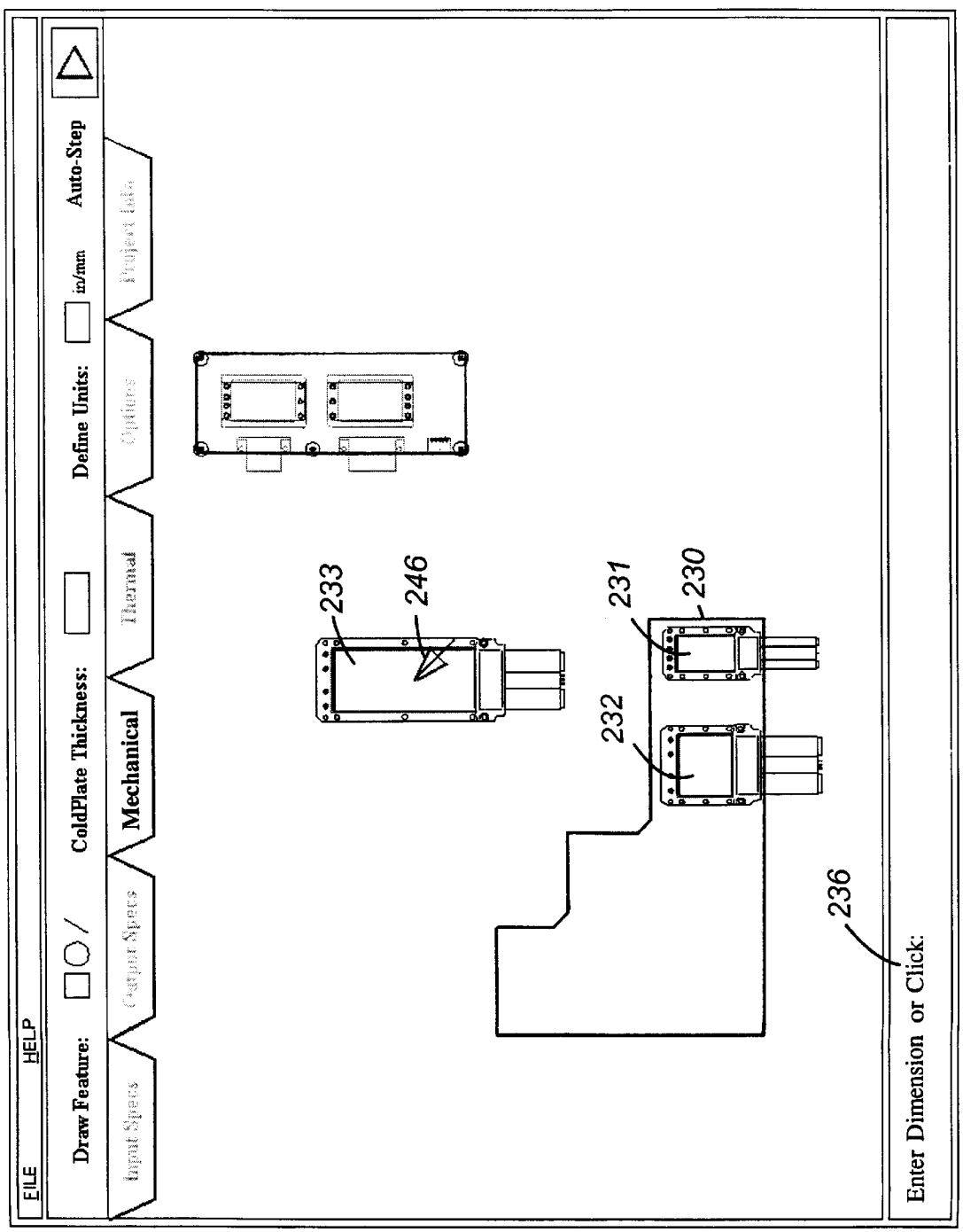

The user may draw an outline of the desired mounting plate 80 using drawing tools 228 and then position the power components on the mounting surface as desired by dragging the icons to the corresponding locations. Referring to FIG. 7D, a layout area 230 corresponding to the desired mounting plate 80 is shown drawn. The layout area 230 is a virtual surface upon which the icons 231, 232, 233, 234 representing the converter modules 10*b*, 20*b*, and 30*b* and the selected front-end assembly may be arranged. Referring to FIG. 7E, a partially arranged mechanical layout is shown. Converter modules 10*b* and 20*b* (icons 231 and 232) have been positioned on the layout area 230 and module 30*b* (233) is in the process of being dragged to the layout area 230. By using the mouse 116 to move the icons, the user may place the components at any location in the layout area of the screen, thereby defining the component positions in the completed power system 40. The user may also specify various types of holes and threading in the mounting plate 80 to facilitate mounting of the power supply inside the user's equipment using additional drawing tools (not shown).

The user may specify maximum dimensions for one or more of the outside dimensions of the power supply 40. The user may directly adjust the dimensions of the peripheral edges of the mounting surface (provided that the edges remain outside of the region in which the converters are placed) by dragging the lines with the mouse. Alternatively, the user can adjust the dimensions directly by selecting an edge of the area 230 with the mouse and entering dimensional data directly in field 236 via the keyboard 114. Dimension units are selected using field 235. In field 229, the user may select the mounting plate thickness, e.g., 0.187", 0.25", 0.32", or 0.5" depending on his mechanical and thermal requirements.

Figure 7F:
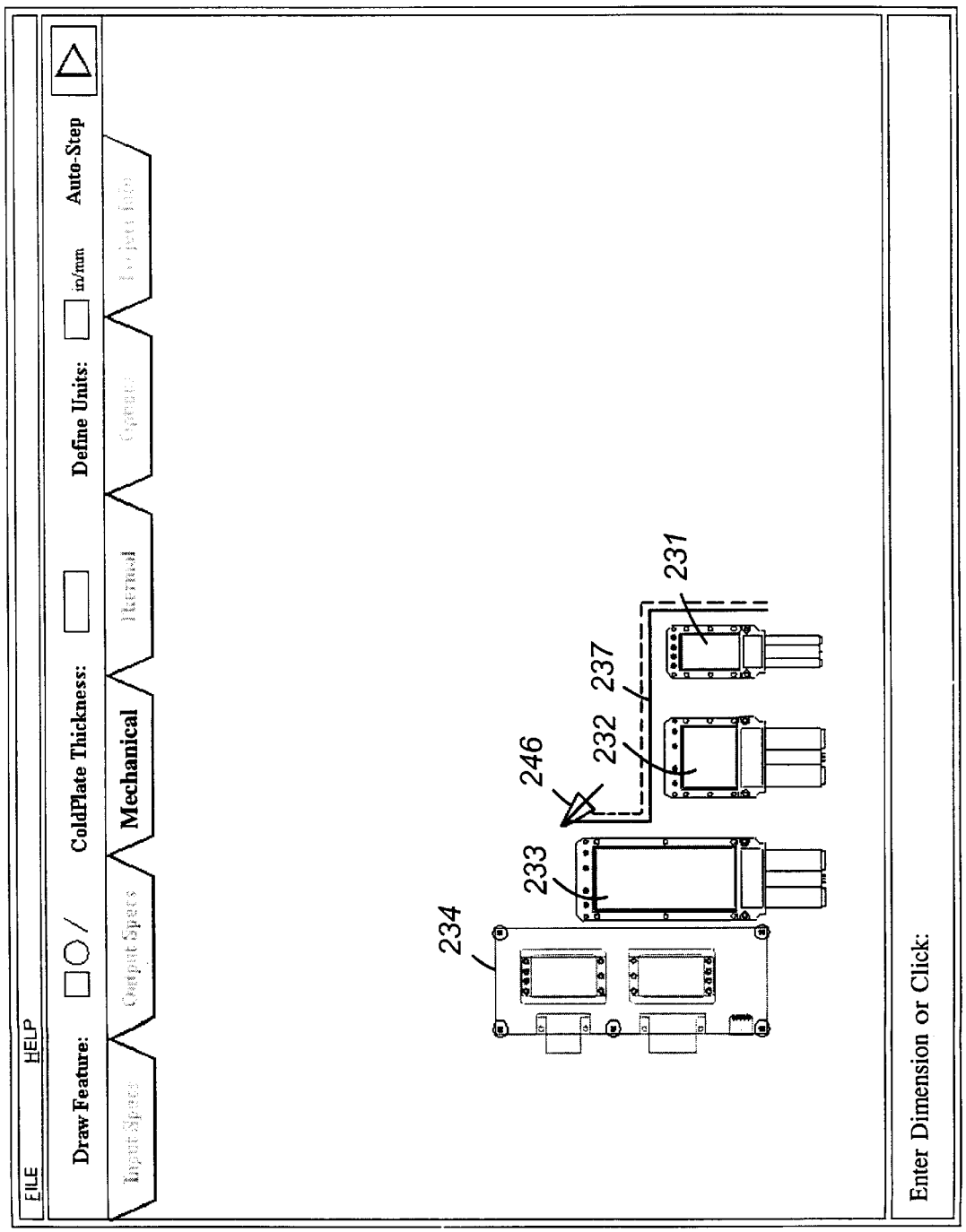

Alternatively, the user may simply position the power components in the desired positions on the screen and draw the outline 237 of the mounting surface by moving the cursor 246 as shown by the dotted line in FIG. 7F. Alternatively, the user may elect to have the system 100 draw the outline of the mounting surface automatically. The user may choose to have the system draw either a rectangular mounting surface or an irregularly shaped (such as 230 in FIG. 7D) mounting surface to conform to the perimeter of the arranged power components.

The mechanical layout system 160 may alternatively be operated in a "rubber band" periphery mode in which the designer is presented with a display of all of the modules pre-arranged on a mounting surface. A very simple pre-arrangement strategy may be used. For example, DC-DC converters may be lined up side-by-side with their outputs facing one peripheral edge of the mounting surface and front-end components may be lined up side-by-side with their inputs facing a parallel peripheral edge of the surface. The initial mounting surface may default to dimensions just large enough to accommodate the complement of converters and front-end components, subject to positional design rules (e.g., as described below) and cooling requirements. The user may then reposition the modules, power sharing arrays, or front-end components. As the components are moved about, the peripheral edge of the mounting plate will automatically expand or contract like a "rubber band" to align with converter outputs and front-end inputs. Real-time thermal calculations may be performed to ensure that the X, Y and Z dimensions are never smaller than those required to cool the system. The other features described above for the mechanical layout system may also be provided in the rubber band periphery mode.

The mechanical layout system 160 automatically enforces a set of rules stored in the rules database 124 which limit the mechanical layout being created by the user. The rules may be based upon factors which include, but are not limited to, manufacturing process, material, equipment limitations, safety specifications and agency approval specifications, environmental considerations such as temperature and airflow imposed by the thermal analysis and design system 150, and user specified size and shape constraints stored in the design configuration database 180.

Using the rules, the mechanical layout system 160 restricts the placement and orientation of the components and also the size and shape of the power system. In other words, as the user positions and repositions the power component icons and sets the size of the mounting surface, the mechanical layout system will enforce the rules either allowing or not allowing the action attempted by the user. Preferably, a prohibited action is accompanied by a message alerting the user to the problem with, and the rule which prohibits, the attempted action. Several examples of rules which may be imposed by the mechanical layout system are discussed below.

Maximum Size Rule

The maximum allowable size of the mounting plate 80 may be limited by the downstream processes (described below) used in their manufacture. For example, the choice of machining equipment might limit the maximum mounting plate dimensions to 12 inches by 18 inches. Such a manufacturing system limitation may be enforced by the mechanical layout system. The layout area 230 initially may be set to a default size which corresponds to the maximum mounting plate dimensions. The user can then adjust it to the desired size. Alternatively, the size may be set by the user with the system preventing expansion of the size to beyond manufacturable dimensions. For power system designs requiring more than the area provide by the maximum mounting plate size, multiple stacked assemblies may be designed for assembly into a single power system 40. An example of a multiple mounting plate power system is shown schematically in FIG. 19. The system may also enforce rules based upon the user defined specifications such as maximum mounting plate size limitations.

Another manufacturing system imposed limitation that may arise in systems capable of machining mounting plate stock into a mounting plate with integral heat sink fins (described further below) is the maximum height of the heat sink fins. In such a system, the mechanical layout system 160 may also enforce a maximum heatsink-fin height limitation such as, for example, 1 inch.

The mechanical layout system 160 will attempt to work within the user specified constraints to arrive at a design solution which provides sufficient surface area to mount all of the required assemblies and provide for adequate system cooling. If the dimensional constraints are inconsistent with either requirement, the user will be notified to make adjustments. In an alternate system embodiment, the system may offer to find an alternate solutions for the user. If the user redefines the maximum temperature for the system baseplate, the remote converter designer 192 may be re-called to redesign the DC-DC converter modules.

Module Grouping Rule

If two or more modules are used together to form a power sharing array for one output, the mechanical layout system may require that they be placed logically adjacent to each other. In other words, no module which is not part of an array may be located in between two modules which form a part of the array. This limitation is a manufacturing limitation imposed for the convenience of the preferred snake cable system discussed above in connection with FIGS. 9–18. Forcing modules in a power sharing array to be adjacent to each other allows a single, the sixth, control signal conductor 436 of snake cable 400 (or fourth conductor 809 of snake circuit board 801) to be used for connecting all of the modules within each of the arrays. The conductor may be cut at the power sharing array boundaries thereby isolating the conductor from the other modules or arrays.

An alternative method for enforcing the array adjacency requirement in the mechanical layout system and making the layout task simpler is to create a single icon for the entire array. The array icon represents the outlines of all of the modules in the array but is positioned by the user as a single graphical object.

Input/Output Positioning Rule

The mechanical layout system 160 may require that all DC-DC converter outputs face a peripheral edge 81a, 81b, 81c of the mounting surface so that output connectors 90 (FIG. 2A) are externally accessible. This ensures that there is always a minimum of two solutions for configuring the snake cable or snake circuit board to connect to all of the modules. Minimum spacings are also enforced between converter output pins and other live parts such as the input connector 60 pins and the output connections (e.g. 25, 26, 27 FIG. 2A) of the active front-end assemblies. Output pins of one converter module may not be placed directly adjacent to the input pins of another converter module.

Module Clearance Rules

Module clearance rules enforced during the mechanical layout phase of the design, ensure that adequate space is left between modules to route the snake cable or snake circuit board from the front-end to each of the modules. The module clearance rules are designed to allow for the mechanical mounting of the output connectors 90 also. In some designs the thermal parameters may impose more stringent module clearance rules which will be enforced by the system.

Module Orientation Rule

Generally, the modules may be aligned with either the X or Y dimension. In other words each module only may be rotated in 90 degree increments. This orientation rule also applies to converter modules forming a part of power sharing arrays so that an array is capable of "turning a corner" of the mounting plate.

PCB Limitations Rules

The PCB traces must be spaced a minimum distance apart from each other to satisfy certain safety or regulatory agency rules such as Underwriter's Laboratories and the Canadian Standards Association.

Manufacturability & Testability Rules

Other rules may also be incorporated and enforced by the system to ensure the manufacturability and testability of the power system using the equipment available. For example, the internal radii of corners in the mounting plate 80 may default to 0.125 inches for the convenience of the tooling used to fabricate the mounting plates.

Thermal Specifications

Figure 7G:
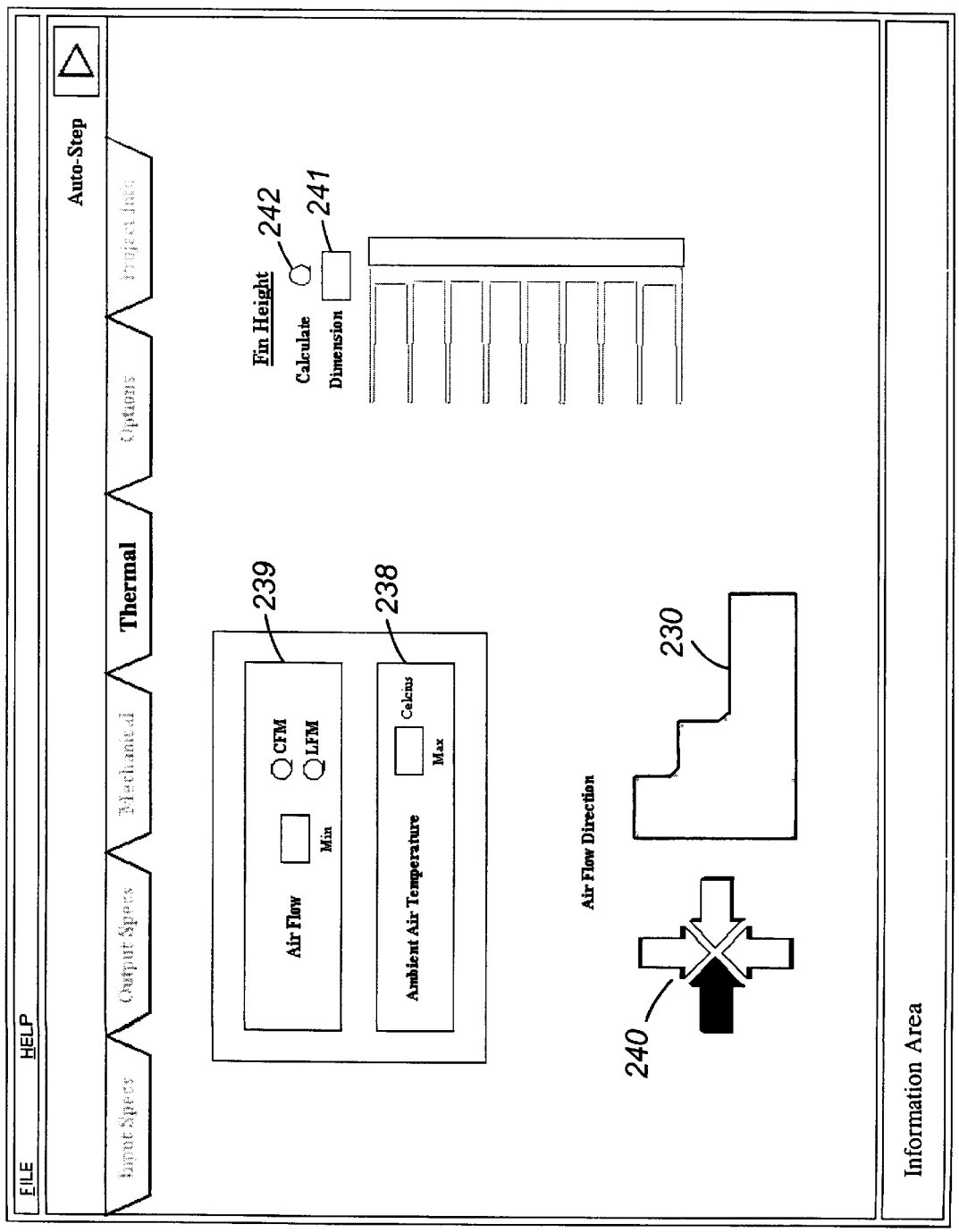

Referring to block 287 in FIG. 8, the thermal design 150 is performed after the mechanical layout 160 is completed. The thermal environment data entry screen shown in FIG. 7G may be used to specify the thermal environment in which the power system 40 will be operated. The user is prompted to enter values for the maximum ambient air temperature 238, the minimum available rate of air flow 239, and the airflow direction 240. The system presents the user with reduced size layout area 230 to indicate the air flow direction. The maximum heatsink fin height 241 may be specified by the user or a calculated fin height 242 may be provided by the system as shown in FIG. 7G. Additionally, the user may be requested to provide a maximum operating temperature for the mounting plate. Optionally, the system may request an altitude specification for use in the thermal design.

The design system 100 uses converter efficiency values and user-specified converter output power ratings which are stored in the design configuration database 180 to calculate the power dissipation in the converter modules, the front-end assembly, and the overall system 40. The system 100 uses this information to evaluate system thermal operating requirements and to select and/or design the appropriate heat sinks as discussed in detail below.

The system first evaluates the power dissipation in each module and the total power dissipation on each mounting plate. The average heatsink airflow and maximum delta temperature for each module are also determined by the system. Using these values an appropriate heatsink may be selected using a look-up table of heatsink parameters for various fin heights, and heatsink configurations. The heatsink-to-ambient thermal conductance for several heatsink configurations and airflow conditions may be determined empirically and provided in a look-up table. An average conductance value for the entire heatsink may be provided. Element values for each element in a finite element model of each heatsink (discussed more fully below) may be provided in addition to or as an alternative to the average conductance value.

Figure 23:
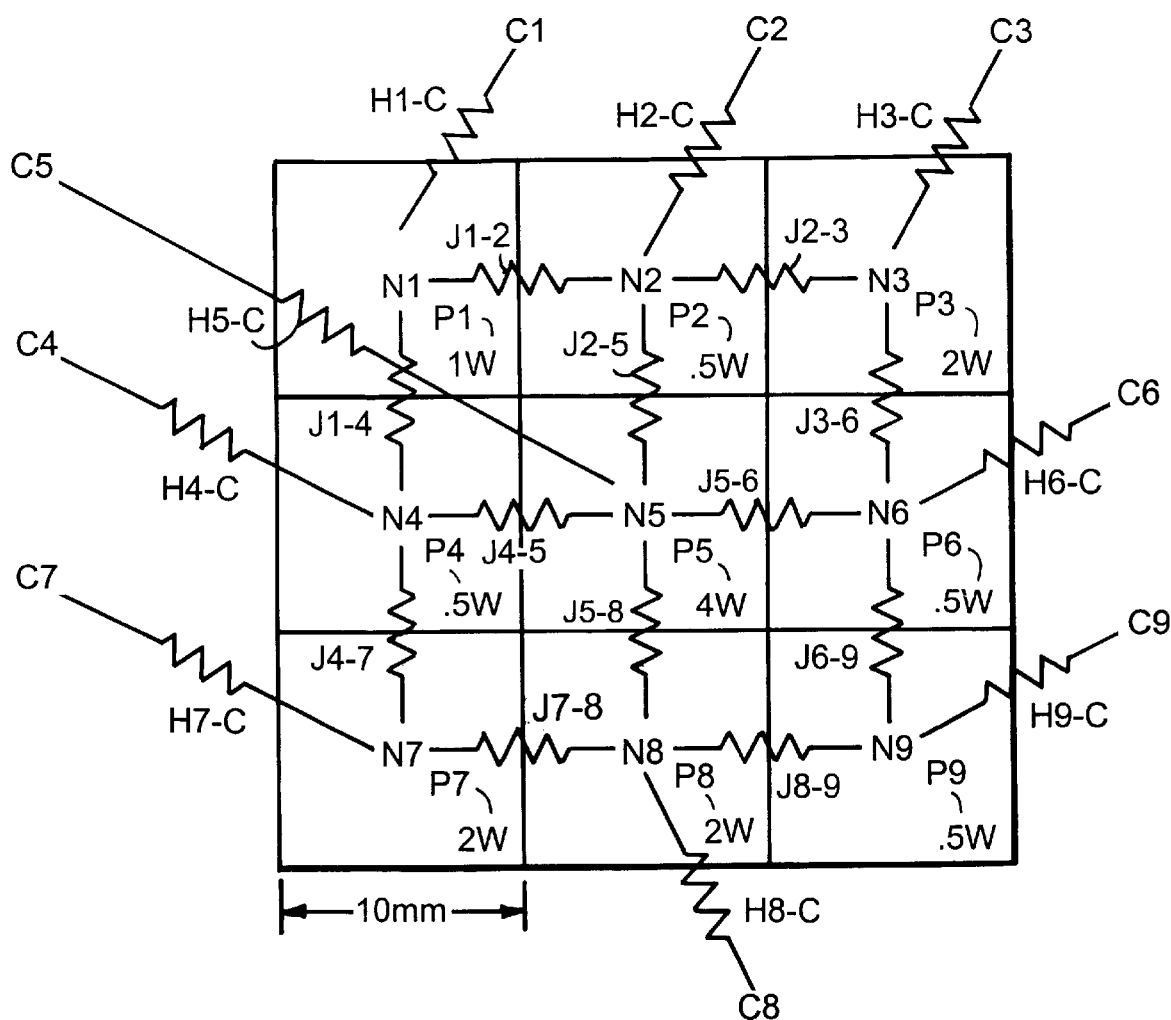
FIG. 23 shows a sample finite element analysis of a heatsink.

Because of the wide variety of possible mounting plate sizes and shapes, and airflow direction, and component placement on the mounting plate, a finite element model of the thermal design is created and analyzed. The heatsink is divided into a number of equal sized elements. For example, 0.2×0.2 inch or 10 mm square elements may be used. Each element would have a central node. Each node is assumed to be isothermal having a uniform temperature. Referring to FIG. 23, a simple nine node example, nodes N1 through N9, of the finite element thermal analysis is illustrated. Each node is shown thermally connected to its adjacent nodes by thermal conductances J. For example, node N1 is connected to nodes N2 and N4 by conductances $J_{1-2}$ and $J_{1-4}$, respectively. A standard element size may be used for evaluating each design. Using a constant element size, the conductance between each element may be the same constant. For example, the thermal conductance may be 1.25 Watts/degree C for a 6 millimeter thick mounting plate and using 10 millimeter square elements. Optionally, a different conductance value, JF, may be specified for the conductance between elements connected by fins since the fins increase the thermal conductance. Thermal losses along the edges may be ignored as shown in the example of node N1 in FIG. 23. Alternatively, a thermal conductance value for the conduction between a node and an edge may be specified. For example, J/2, may be used to account for edge losses.

The convection conductances, H are also specified for the heatsink. For example the convection conductance from the heatsink to the ambient at node N1 is $H_{1-C}$. The convection conductances may be defined as a function of convective film coefficient which may vary along the length of the heatsink as ambient air temperature and airflow vary. For example, air flow from the top of the page toward the bottom in FIG. 23 may yield conductance values of 70, 80, and 90 Watts/degree C-square meter for nodes N1–N3, N4–N6, N7–N9, respectively or 0.007, 0.008, and 0.009 Watts/degree C. for 10 millimeter square elements, respectively. Values for the convection conductance may be stored in a look-up table for various heatsink configurations and fin heights.

The power dissipation for each module may be mapped and transferred onto the respectively aligned nodes. For this purpose, a finite element power dissipation model of each module may be provided based upon the component locations within the module. Alternatively, an isothermal power dissipation model in which the power dissipation of the module is evenly distributed to each of the nodes aligned with the module. In either case, the heat generated by each module is mapped onto the respectively aligned nodes using the module locations defined during the mechanical layout design. In FIG. 23, power dissipation values P1 through P9 are shown mapped onto nodes N1 through N9.

A series of simultaneous heatflow equations, one equation for each node, is written. For example, the heatflow equation (EQN 1) for node N1 may be written (using a sign convention where heat flowing into the node is positive) as:

$$J_{1-2}(T_2-T_1)+J_{1-4}(T_4-T_1)+H_{1-C}(T_1-T_C)+1 \text{ watt}=0 \qquad \text{EQN 1}$$

where $T_1$, $T_2$, $T_4$, and $T_C$ are the temperatures of nodes 1, 2, 4 and the ambient air, and 1 watt is the power dissipated into node 1.

The series of simultaneous equations are then solved producing a thermal map of the node temperatures. A comparison of each node temperature with the specified maximum mounting plate temperature may be performed by the system. If any node temperature exceeds the maximum mounting plate temperature, then the heatsink design may be updated and a satisfactory heatsink design reached in an iterative manner. A visual map of the temperatures, for example a color thermal topography of the mounting plate, may be displayed for review by the user.

It will be appreciated that any number of heatsink design methodologies may be implemented. For example, the system may use the total power dissipation, ambient air temperature, and maximum mounting plate temperature to estimate the heatsink requirements and select a heatsink for the beginning of an iterative thermal design. The selection may then be analyzed using the finite element model and changed if necessary.

A finite element model may be set up for a maximum sized mounting plate. For example, a 12×18 inch mounting plate using 0.2 inch square elements would yield a 5400 node generalized model. The actual mounting plate may then be mapped onto the generalized model setting the conductances, power input, and temperatures for all unmapped nodes to zero. In this way, a single model with one generalized set of simultaneous equations may be used to evaluate every possible heatsink design.

As described above, the user may enter maximum values for any of the X, Y, or Z dimensions respectively corresponding to the width, length, and height of the power supply 40. The height dimension may limit the height of the heatsink fins available for the power system 40 and thus limit the heatsink options available for the design. Three heatsink options may be provided to satisfy the thermal requirements: 1) a mounting plate with the integral full surface heatsink as shown in FIGS. 3A, 3B, 2) the mounting plate with individual heat sinks as shown in FIG. 4, or 3) a bare mounting plate as shown in FIG. 2A. Height limitations may also affect the component density (module spacing) on the mounting plate. For example, as the height limit is reduced, the surface area requirements to provide adequate cooling may increase. Whenever the user specifies an X, Y, or Z dimension, the system may default to a value which is the greater of the value specified by the user or the minimum value calculated by the system as necessary to provide adequate cooling.

Optionally, an on-screen display may be provided to show the X, Y and Z dimensions, and total system volume, V, of the power system 40 in real time. A real time side view of the heat sink showing fin density and relative fin height may optionally be provided. Alternatively, the real time computations may be suspended to facilitate faster system response. In such a system the user may request recalculation of the volume or fin height at any time.

Options

Figure 7H:

Referring to block 288 in FIG. 8, the user proceeds to the options specification 170 (FIG. 5) after the thermal design is completed. A sample options specification screen is shown in FIG. 7H. The user may designate the safety agency certification requirements 243, the processing requirements (commercial, industrial, or military) 244, and cabling requirements 245 for the power system 40. The system 100 stores this information in the design configuration database.

Project Information

Referring to block 289 in FIG. 8, the user proceeds to the project information screen which collects information about the design including, for example, the designer's name and company information, after the design has been completed. After the project information is collected the system 100 again connects to the remote computer 190 transmitting the design information from the design configuration database 180 to the pricing and delivery systems 193 and 194. The pricing and delivery systems then evaluate the design and return price and delivery quotes to the user and a part number which will enable the user to order the complete power system.

Referring to block 290 in FIG. 8, the user may order the power system 40 using the part number provided by the remote computer 190. The user may place the order using an order placement system which may be provided as part of the project information screen. An ordering menu option may be provided on system 100 to collect the ordering information, including quantity at the quoted price and delivery time and payment details. The system 100 may then transmit the ordering information to the remote facility 190 for final confirmation of the price and delivery terms. Alternatively, the user may call an order placement telephone number to speak with a sales person who may manually take the required information and confirm the price and delivery details. An automated telephone ordering system may also be provided.

Referring to FIGS. 5 and 6, the order entry and manufacturing system 300 will be described. Once a purchase order is actually received, the delivery and price are confirmed again since the circumstances may have changed between the initial quote by remote computer 190 in the project information step and the actual order placement. A pricing system 193 receives the raw DC-DC converter specifications and automatically generates a cost for the converter modules in the manner described in commonly assigned, copending application, Ser. No. 08/635,026, entitled Configuring Power Converters, filed on Apr. 19, 1996, and incorporated here by reference. At the system level, the pricing system 193 uses the aggregate of the DC/DC converter costs previously generated in combination with details contained within the raw system specifications to determine the total system pricing. For example, these details may include cable lengths and quantities, mounting plate geometry, and front-end unit types used and cost algorithms for each such assembly.

The delivery system 194 also receives the raw system specifications and generates module level delivery dates which are then used in the generation of a system level delivery date. The delivery system 194 communicates with a computer integrated manufacturing ("CIM") system. In particular, a production scheduler 340 in the CIM provides supply and demand information enabling the delivery system 194 to provide a delivery date based upon the next available production time slot.

Upon receipt of an order from ordering system 330, the production scheduler 340 activates the system manufacturing interface ("SMI") 375. The SMI 375 receives the raw system specifications and generates all of the detailed manufacturing specifications for all of the components necessary to build the system and also generates assembly and test specifications and procedures for the system level assembly. For example, the SMI 375 generates part numbers for all of the parts including those manufactured by manufacturing lines 350 and 360 as well as those that may need to be ordered from outside vendors. All details for each part such as the description and quantity are also provided on the bill of materials ("BOM"). The BOM, including all of the part details, for each system is stored in a database (not shown). The SMI 375 also generates specifications for the (1) internal wiring of the power system potentially including snake cable, snake circuit board, hybrid snake, or standard PCB specifications, (2) output cables, (3) HUB 92 cable, (4) programmable device specifications for the MCU in the PPU, (5) all labels for the system and components in the system, (6) product test specifications, (7) automated machining specifications from the mechanical layout information to fabricate the metal mounting plate and heatsinks if necessary, (8) module specifications for the converter and front-end modules to be manufactured on the module line 350, and (9) assembly instruction display files for workers performing manual assembly tasks.

The SMI 375 generates the requisite specifications for fabrication of the snake wiring i.e., the snake cable, snake circuit board, or hybrid, assembly. The module placement clearance and orientation rules ensure that a viable snake solution may be found. For example, the clearance and placement rules enforced during the mechanical layout session guarantee that there will be enough space to snake the snake wiring system between the components. They also ensure that there will be enough space for the requisite number of conductors on the snake circuit board. Since the module orientation rules ensure that the DC-DC converter module outputs directly face the peripheral edges of the mounting plate, all module inputs will face the interior of the PPU mounting plate. Thus, all module inputs may be connected by routing the snake wiring system in a clockwise or counter-clockwise direction from the front-end location at any point on the mounting plate. This ensures that there are at least two snake wiring solutions for each design. Additional solutions may be found by locating the front-end at a mid point along the snake with converter modules connected on clock-wise extending and on counter-clockwise extending ends. Since all of the modules in a power-sharing array must be adjacently located, there will always be a solution in which the sixth conductor of the snake cable is available to connect all of the converters in the power-sharing array.

Figure 35A:
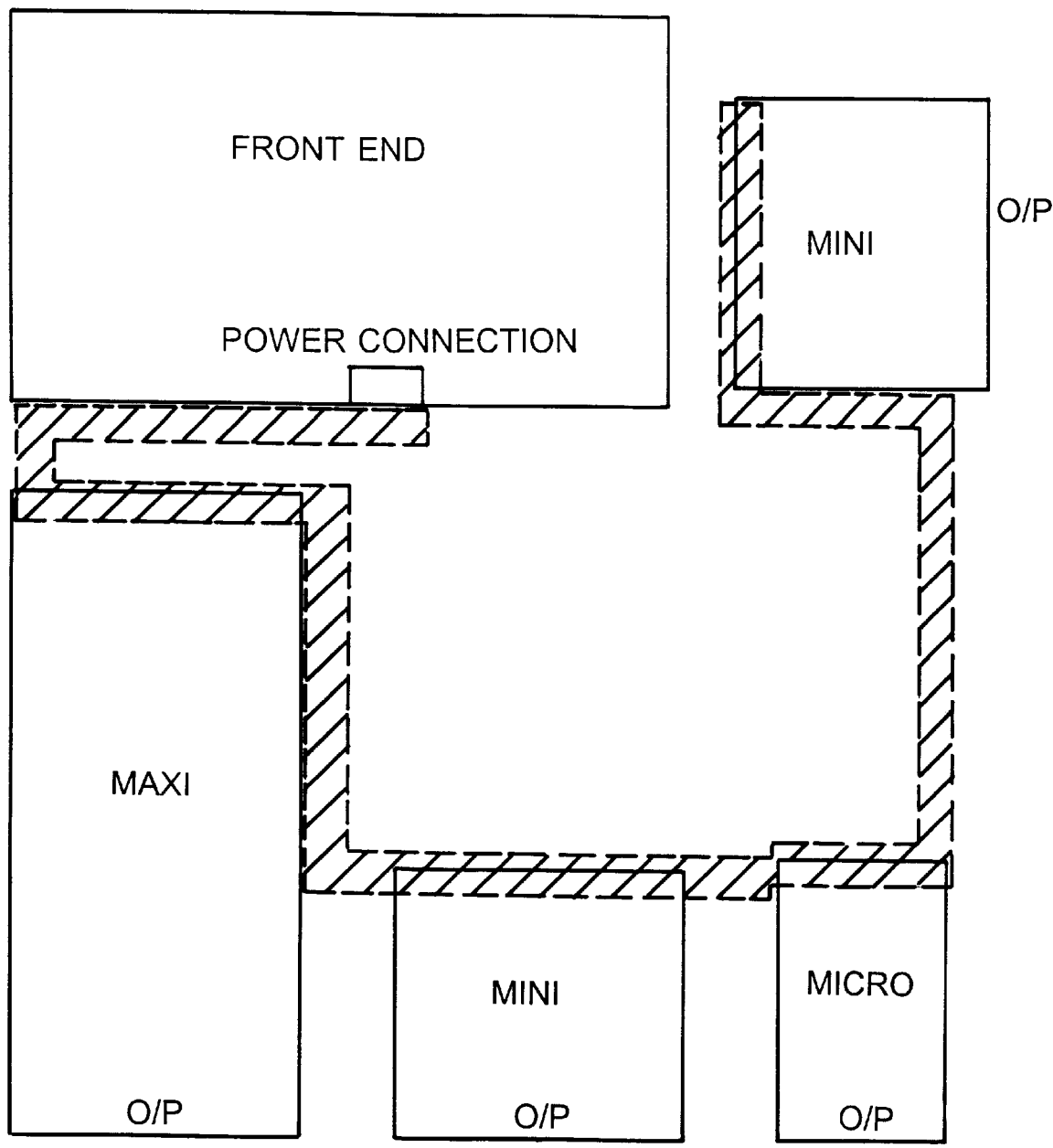
FIGS. 35A and 35B are top views of minimum width and maximum width snake circuit board solutions for a power system layout.
Figure 35B:
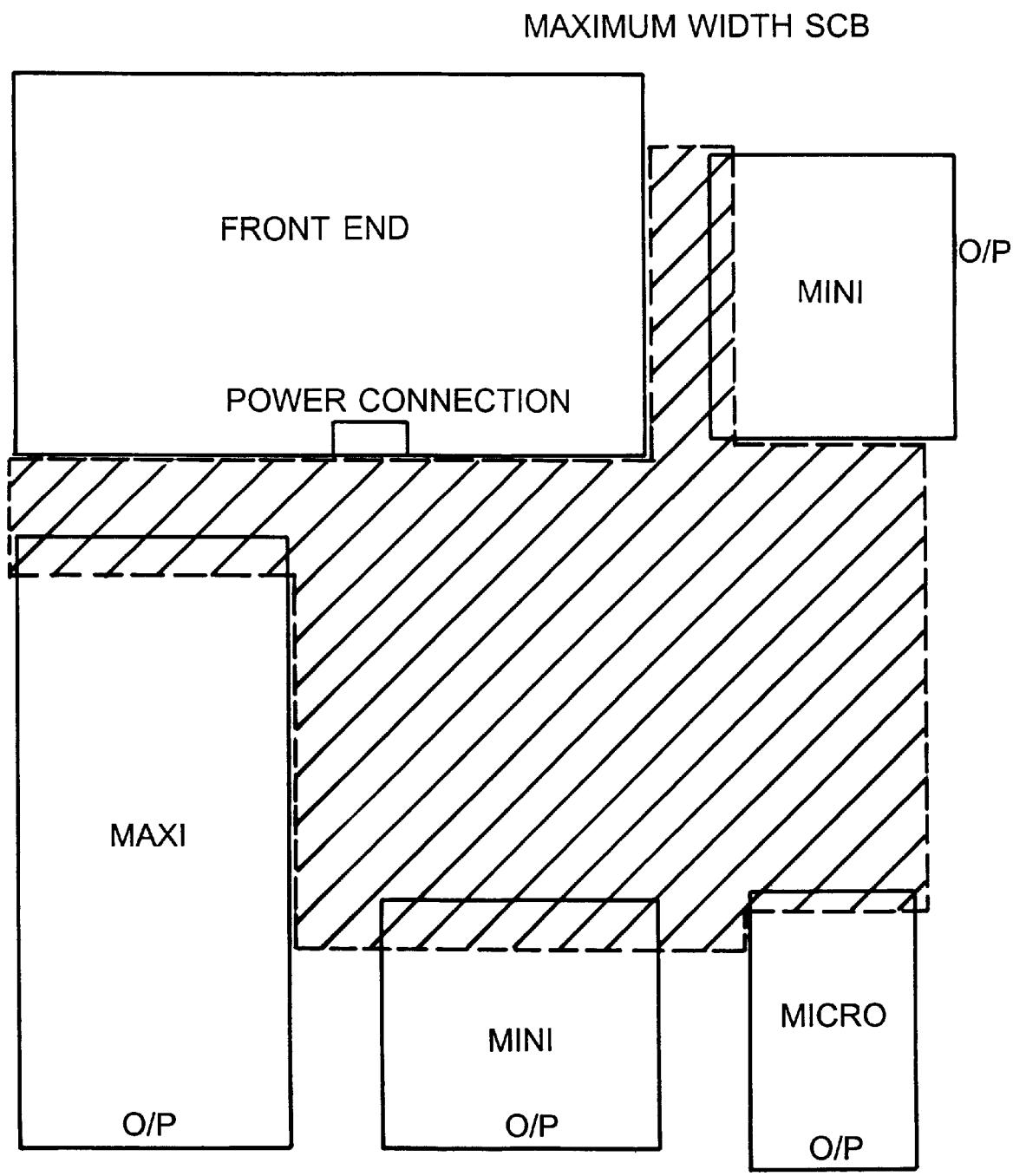

An additional snake circuit board solution (called the maximum width snake circuit board) may be used to reduce power losses by expanding the snake circuit board to fill all of the available space. Of course, the snake circuit board may not extend beyond the boundaries of the mounting plate or cover any keepout areas, such as the PPU mounting holes defined by the user. A minimum width snake circuit board solution is shown in FIG. 35A for contrast with the maximum width snake circuit board solution for the same layout shown in FIG. 35B. The outline of the maximum width snake circuit board is generated by forming a closed loop in either a clock-wise or counter-clockwise direction starting from the connection points on the front-end through each of the power converters in sequence and returning back to the starting point on the front-end. The top layer signal interconnections are developed in the same manner as for the minimum width snake circuit board and may be identical to those of the minimum width solution.

The SMI chooses the optimal design solution for the snake based upon the mechanical layout of the power components. This is particularly important for low voltage DC input (e.g., 5–24 VDC) designs because of the higher input currents. First each feasible snake routing possibility is determined. Then the power loss is calculated for each routing using the length of the snake between each module and the front-end and the input current for the respective module. The route with the lowest power loss is chosen as the optimal design solution for the snake. The design details (including the route, overall length, bends, taps, and intermediate dimensions) for the optimal snake are provided to the scheduler 340 for manufacture of the snake cable, snake circuit board, or snake hybrid and assembly of the snake onto the PPU.

The SMI 375 provides the specifications to the production scheduler 340 which orchestrates the production and ordering of all of the components necessary to build the system. It checks the stock status of all parts, schedules the manufacture of converters or other fabricated modules, and orders externally purchased or manufactured parts, if required. The production scheduler 340 plans the component manufacturing for the modules on the module line 350 and the other, system level, components on the system line 360.

The scheduler 340 may be electronically linked to automated machining centers 361 (FIG. 6) on the system line 360 which may fabricate the metal substrate and heatsinks. The production scheduler 340 transfers the automated machining information to the appropriate automated machining center which will fabricate the metal mounting plate. If necessary, the completed plate may be sent to an outside vendor for chemical treatment or alternatively, to an automatic treatment station on the system line 360.

The scheduler may also be connected to manual or automatic cable fabrication equipment which may fabricate the requisite cable assemblies. The scheduler 340 transfers the cable specifications to the fabrication equipment which then manufactures the cables according to the production schedule established by the scheduler 340.

Alternatively, the SMI 375 may also transfer electrical interconnect information, including module and pin locations as well as other relevant board restrictions and layout information to a printed circuit board ("PCB") computer aided design ("CAD") system. The PCB CAD system may generate PCB fabrication information which will in turn be downloaded to a routing center for fabricating the PCBs.

The production scheduler 340 will not release a part or module to be built on the line until all of the required parts are available. When all parts for a system have been manufactured by, or delivered to, the module line 350 and system line 360 and are ready for assembly, a kit of the parts is delivered to the (automated or manual) system assembly area 370 for final assembly.

Figure 24:
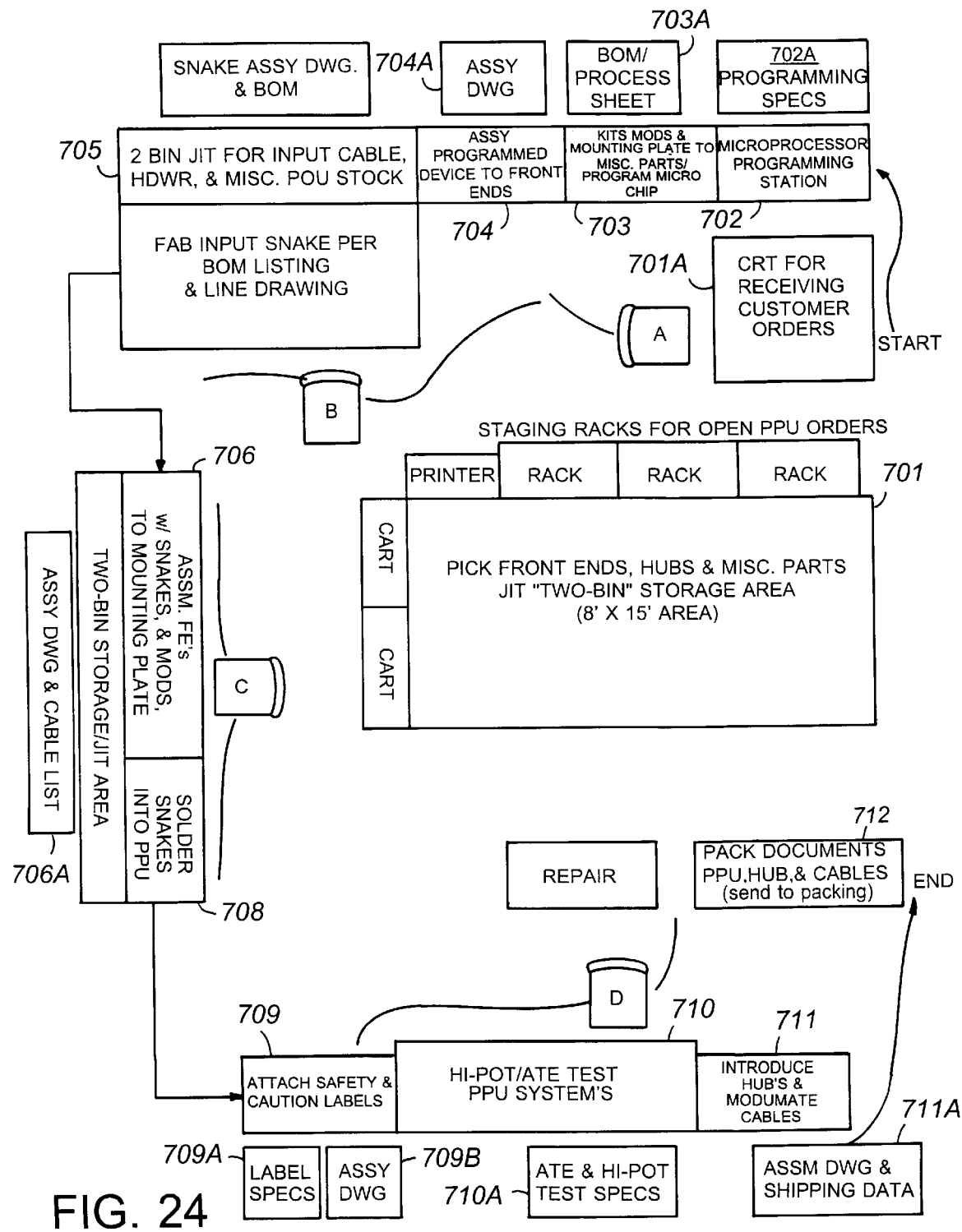
FIG. 24 shows a sample computer-integrated-manufacturing area for assembling the power supplies.

In the case of manual assembly, the CIM system may display pictorial assembly instructions for each power supply as it passes through an assembly station on video display monitors in assembly area 370 (as shown in FIG. 24 and discussed in greater detail below). The video display files are generated by the SMI 375. The assembly instructions could be presented in a 3-D format or combined with 3-D views of the power supply. In the case of automated assembly, the machine readable assembly instructions are delivered to the assembly area 370 instead of the video display instructions.

The completed system is then tested according to the test protocol created by the SMI 375, and if specified by the customer, burn-in and special environmental screening is also performed. The completed system is shipped to the customer after it passes all of the tests.

An example of a computer integrated manufacturing "CIM" system assembly area is shown in FIG. 24. A computer screen 701A displays customer order information provided by the CIM system at a part kitting station 701 enabling the operator to collect the necessary components to build the system. The SMI provides this information for each order to CRT 701A. At microprocessor programming station 702, the programmable devices for the front-end board are programmed using programming specifications 702A provided by the SMI. The modules, mounting plate, and heatsinks are assembled together at station 703. Bill-of-material and assembly drawing information 703A generated by the SMI are displayed on a CRT near station 703 by the CIM system for reference by the operator. The programmed device is assembled to the front end at station 704 with reference to the assembly drawing displayed at CRT 704A.

The internal wiring is fabricated at station 705 as explained above in connection with the snake wiring system and FIG. 15 using specifications provided by the SMI. At stations 706 and 708 the PCBs and cables are assembled onto the modules and mounting plate assembly using the assembly drawing and cable run list information displayed at CRT 706A.

Label specifications 709A are provided to a label station 709 where the appropriate labels are affixed to the PPU with reference to the assembly drawing displayed at CRT 709B.

Labels may be printed or laser-generated on the fly or selected from preprinted stock using the label specifications 709A generated by the SMI. Afterward, the PPU is tested at the high potential ("Hi-Pot") and automatic test equipment ("ATE") test station 710. Test specifications for the PPU may be provided to the test equipment and the operator protocol may be displayed on a CRT 710A by the SMI as shown in FIG. 24. After testing the HUBs and connecting cable assemblies are introduced at station 711. Assembly drawings and shipping information are displayed on CRT 711a. Product documentation and the assembled PPU are then packaged and sent to shipping 712 for delivery to the customer.

The above system allows for reductions in the lead time from design to manufacture of custom power supplies. Using the above-described power supply design system in conjunction with the automated manufacturing of DC-DC converters and other power system sub-assemblies allows power supply manufacturers to ship custom power supplies within a day or two after the specification is complete. A user, such as a power supply design engineer located at a customer's plant, may design a complete custom power supply and have the manufactured unit shipped by the manufacturer within days of determining the specifications for the power supply. The above system therefore allows for drastic reduction of the typical several-month-long cycle from specification to design through manufacture that is currently typical in the industry.

In an alternative embodiment, the module design process may be skipped at block 284 (FIG. 8) and a local algorithm may be used to estimate the specifications and packages for the required complement of DC-DC converter modules. This complement of modules would then be used to allow the mechanical, thermal, and options design to be completed. The detailed designs for each of the converter modules would not be generated by the remote module designer 192 (FIG. 5) until the completed system design is sent by the user to the remote computer at step 289 in FIG. 8. Criteria for determining package size based upon deliverable power requirements may be stored (e.g., as tables or algorithms) in the Component Selection Criteria Database 122. After the converter package outlines are estimated the mechanical layout can be performed by the user. This saves time and allows remote users, without modems, to create first-pass designs.

The local system 110 determines the sizes and quantities of DC-DC converter modules required to deliver each specified output voltage based upon specified output power requirements. In general, the amount of power which can be delivered from a particular size DC-DC converter package (e.g., 10, 20, 30, FIG. 1) is a function of output voltage, converter DC input voltage range and maximum baseplate operating temperature. The DC input voltage range for the DC-DC converter modules in the power system 40 may be determined from the input and output specifications. The AC input voltage range and the type of front-end selected will each affect the range of DC voltage input to the DC-DC converter modules. The maximum baseplate temperature specified by the user will be used for the calculation.

Alternatively, the amount of power which can be delivered from each module package size at a particular output voltage can be closely approximated using a look-up table in the selection criteria database 122. The power level for each package size is calculated. For example, at a maximum baseplate temperature of 100 degrees C. and a DC input voltage operating range of 275 to 425 VDC (which conforms to the output voltage range of a power factor correcting front-end module), the maxi module package 30 in FIG. 1 can typically deliver a maximum of 100 Amperes of current (limited by current carrying capacity of output pins 36) at output voltages up to 3.3 Volts; 400 Watts at 5 Volts output; 500 Watts at 15 Volt output; and 600 Watts for output voltages above 24 Volts. Maximum deliverable power at voltages between 3.3 and 24 Volts can be inferred by linear interpolation (or on the basis of additional table entries or algorithms). Similar current limitation and power limitation rules apply to the mini 20 and micro 10 module packages and output pin styles shown in FIG. 1.

Other embodiments are within the scope of the following claims.

What is claimed is:

1. A method of interconnecting components comprising:

providing a flat multilayer laminate having a plurality of conductive layers separated by insulation;

cutting a section of said laminate to have a predetermined shape;

removing by machining portions of an exposed one of said conductive layers to form a plurality of conductive traces;

machining a hole in said laminate to form a connection to a preselected one of said conductive layers and to isolate an unselected one of said conductive layers, said hole having a first width in said preselected one of said layers and a second larger width in said unselected one of said conductive layers; and inserting a conductive eyelet into said hole to make contact with said preselected one of said conductive layers, the eyelet having a body diameter smaller than the second larger width thereby avoiding electrical contact with the unselected one of said layers.

2. The method of claim 1 further comprising inserting an insulative sleeve in said hole to insulate said eyelet from said unselected one of said conductive layers.

3. The method of claim 2 further comprising clinching one end of said eyelet after said eyelet is positioned in said hole.

4. The method of claim 1 further comprising forming at least two jumper landings and soldering a jumper to form a connection between said landings.

5. The method of claim 1 further comprising forming at least two jumper landings and pad printing a conductive layer to form a connection between said jumper landings.

6. The method of claim 5 further comprising pad printing an insulative layer over said laminate in an area between said jumper landings before pad printing said conductive layer.

7. The method of claim 1 further comprising forming a discontinuity in a preselected one of said conductive traces.

8. The method of claim 1 wherein said laminate further comprises a top conductive layer for forming signal lines and at least two interior conductive layers for distributing power.

* * * * *

UNITED STATES PATENT AND TRADEMARK OFFICE
CERTIFICATE OF CORRECTION

PATENT NO. : 6,230,403 B1  
DATED : May 15, 2001  
INVENTOR(S) : Charles S. Skoolicas et al.

It is certified that error appears in the above-identified patent and that said Letters Patent is hereby corrected as shown below:

Column 3,
Line 58, change "a" to -- an --.

Column 4,
Line 4, change "frontend" to -- front-end --.

Column 8,
Line 20, change "a" to -- an --.

Column 10,
Line 32, after "34B" insert -- are --.
Line 37, in the heading, change "DESCRIPTIONS" to -- DESCRIPTION --.

Column 28,
Line 6, change "solutions" to -- solution --.

Column 36,
Line 33, after "said" and before "layers" insert -- conductive --.

Signed and Sealed this

Fifteenth Day of April, 2003

JAMES E. ROGAN
*Director of the United States Patent and Trademark Office*